US010521037B2

(12) United States Patent
Orita et al.

(10) Patent No.: US 10,521,037 B2
(45) Date of Patent: Dec. 31, 2019

(54) DISPLAY PANEL WITH TOUCH SENSOR

(71) Applicant: Mitsubishi Electric Corporation, Chiyoda-ku (JP)

(72) Inventors: Tae Orita, Tokyo (JP); Takeshi Ono, Tokyo (JP); Masafumi Agari, Tokyo (JP); Seiichiro Mori, Tokyo (JP); Tatsuya Nakamura, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 4 days.

(21) Appl. No.: 16/074,800

(22) PCT Filed: Jan. 20, 2017

(86) PCT No.: PCT/JP2017/001850
§ 371 (c)(1),
(2) Date: Aug. 2, 2018

(87) PCT Pub. No.: WO2017/138325
PCT Pub. Date: Aug. 17, 2017

(65) Prior Publication Data
US 2019/0042039 A1 Feb. 7, 2019

(30) Foreign Application Priority Data

Feb. 12, 2016 (JP) .................................. 2016-024392
May 2, 2016 (JP) .................................. 2016-092372

(51) Int. Cl.
*G06F 3/041* (2006.01)
*G02F 1/1333* (2006.01)
(Continued)

(52) U.S. Cl.
CPC .......... *G06F 3/0412* (2013.01); *G02F 1/1343* (2013.01); *G02F 1/13338* (2013.01); *G02F 1/133512* (2013.01); *H01L 27/1214* (2013.01)

(58) Field of Classification Search
CPC ........ G06F 3/0412; G06F 3/041; G06F 3/044; G06F 3/0418; G06F 2203/04112;
(Continued)

(56) References Cited

U.S. PATENT DOCUMENTS 5,844,506 A    12/1998  Binstead
8,937,690 B2*  1/2015  Nam ................. G02F 1/136286
                                              349/12
(Continued)

FOREIGN PATENT DOCUMENTS

JP    9-511086 A    11/1997
JP  2008-185785 A    8/2008
(Continued)

OTHER PUBLICATIONS

International Search Report dated Feb. 21, 2017 in PCT/JP2017/001850 filed Jan. 20, 2017.

*Primary Examiner* — Adam R. Giesy
(74) *Attorney, Agent, or Firm* — Oblon, McClelland, Maier & Neustadt, L.L.P.

(57) ABSTRACT

A light-shielding portion is provided on an inner surface of a first substrate and has an opening pattern. A color material portion is provided on the inner surface of the first substrate. A second substrate faces the inner surface of the first substrate. Inner sensor electrodes are provided between the inner surface of the first substrate and the second substrate, and are included in the light-shielding portion in a plan view. Outer sensor electrodes are made of metal and are provided on an observation surface of the first substrate. The projection of the outer sensor electrode onto the inner surface of the first substrate through the optical path corresponding to the viewing angle is included in the light-shielding portion in a plan view. Each of the outer sensor electrodes includes a region extending along one direction parallel to a lateral direction of the display panel with a touch sensor.

12 Claims, 76 Drawing Sheets

(51) Int. Cl.
*G02F 1/1335* (2006.01)
*G02F 1/1343* (2006.01)
*H01L 27/12* (2006.01)

(58) Field of Classification Search
CPC ........... G02F 1/13338; G02F 1/133512; G02F 1/1343; H01L 27/1214
See application file for complete search history.

(56) References Cited

U.S. PATENT DOCUMENTS

| | | |
|---|---|---|
| 9,904,090 B2 * | 2/2018 | Yu .................. G02F 1/13338 |
| 2008/0180407 A1 | 7/2008 | Utsunomiya et al. |
| 2010/0194697 A1 | 8/2010 | Hotelling et al. |
| 2013/0242485 A1 | 9/2013 | Ohtani et al. |
| 2015/0049047 A1 * | 2/2015 | Liao .................. G06F 3/044 |
| | | 345/174 |
| 2017/0045988 A1 * | 2/2017 | Sugita .................. G06F 3/044 |
| 2017/0075461 A1 | 3/2017 | Orita et al. |

FOREIGN PATENT DOCUMENTS

| | | |
|---|---|---|
| JP | 2010-61502 A | 3/2010 |
| JP | 2010-231773 A | 10/2010 |
| JP | 2012-103761 A | 5/2012 |
| JP | 2013-97704 A | 5/2013 |
| JP | 2014-71734 A | 4/2014 |
| JP | 2014-238619 A | 12/2014 |
| JP | 2015-75991 A | 4/2015 |
| WO | WO 95-27334 A1 | 10/1995 |
| WO | WO 2015/133041 A1 | 9/2015 |

* cited by examiner

FIG. 19

| R | G | B | R | G | B |
|---|---|---|---|---|---|
| R | G | B | R | G | B |
| R | G | B | R | G | B |
| R | G | B | R | G | B |
| R | G | B | R | G | B |

FIG. 20

| G | B | R | G | B | R |
|---|---|---|---|---|---|
| B | R | G | B | R | G |
| R | G | B | R | G | B |
| G | B | R | G | B | R |
| B | R | G | B | R | G |

FIG. 23

| R | G | B | W | R | G | B |
|---|---|---|---|---|---|---|
| R | G | B | W | R | G | B |
| R | G | B | W | R | G | B |
| R | G | B | W | R | G | B |
| R | G | B | W | R | G | B |

FIG. 24

| R | B | R | B | R | B | R |
|---|---|---|---|---|---|---|
| W | G | W | G | W | G | W |
| R | B | R | B | R | B | R |
| W | G | W | G | W | G | W |
| R | B | R | B | R | B | R |

FIG. 64

| R | G | B | R | G | B |
|---|---|---|---|---|---|
| R | G | B | R | G | B |
| R | G | B | R | G | B |
| R | G | B | R | G | B |
| R | G | B | R | G | B |

FIG. 65

| G | B | R | G | B | R |
|---|---|---|---|---|---|
| B | R | G | B | R | G |
| R | G | B | R | G | B |
| G | B | R | G | B | R |
| B | R | G | B | R | G |

FIG. 68

| R | G | B | W | R | G | B |
|---|---|---|---|---|---|---|
| R | G | B | W | R | G | B |
| R | G | B | W | R | G | B |
| R | G | B | W | R | G | B |
| R | G | B | W | R | G | B |

FIG. 69

| R | B | R | B | R | B | R |
|---|---|---|---|---|---|---|
| W | G | W | G | W | G | W |
| R | B | R | B | R | B | R |
| W | G | W | G | W | G | W |
| R | B | R | B | R | B | R |

F I G. 7 6
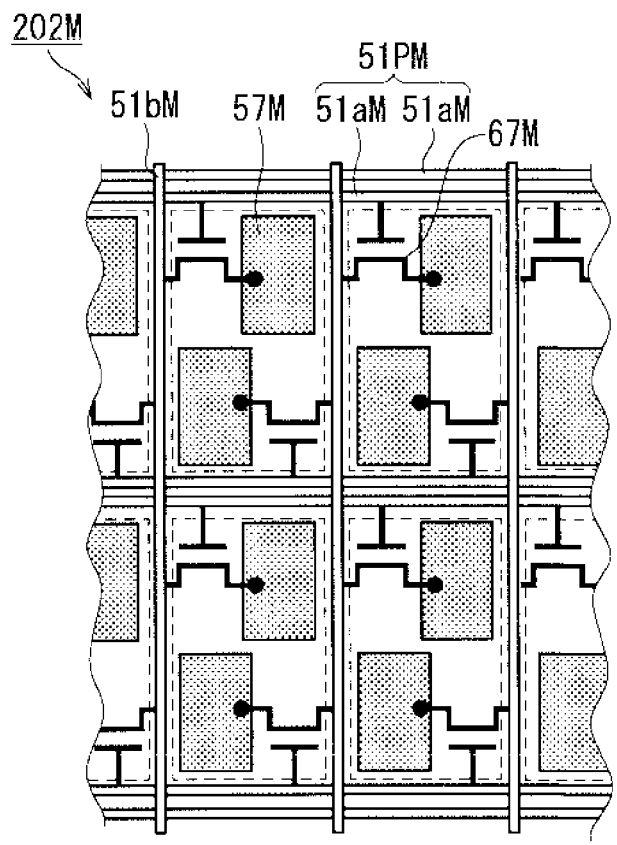
F I G. 7 7
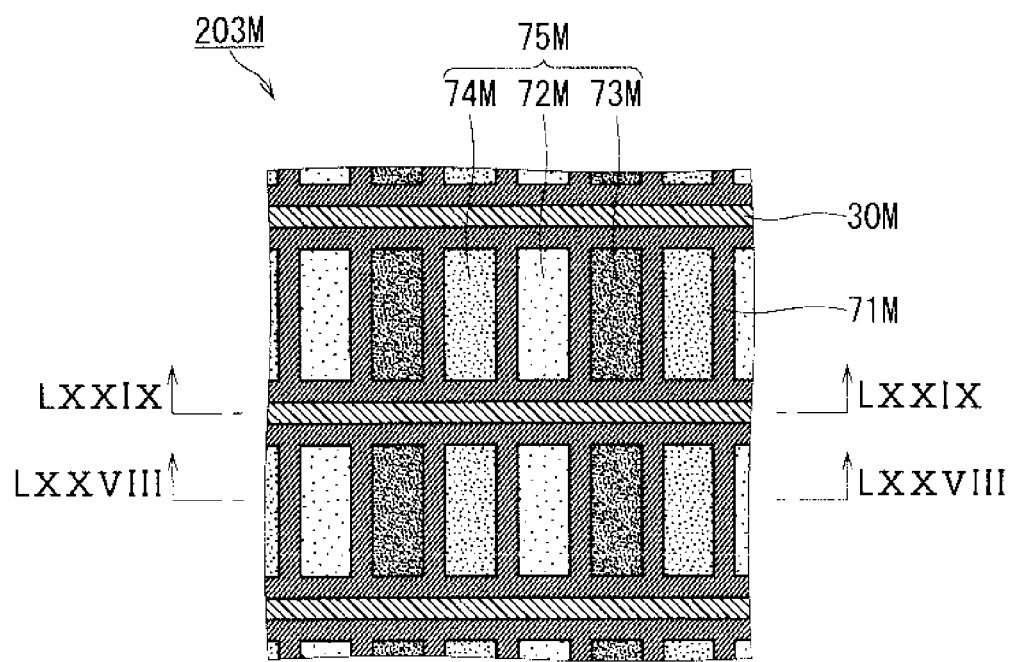

DISPLAY PANEL WITH TOUCH SENSOR

TECHNICAL FIELD

The present invention relates to a display panel with a touch sensor.

BACKGROUND ART

A display panel capable of detecting a position on the screen indicated by a pointer such as a user's finger or a pen (hereinafter sometimes referred to as "touch position") is widely known. In order to detect the touch position, the display device is provided with a touch panel with a touch sensor. There is a projected capacitive touch sensor as a type of the touch sensor. In the projected capacitive method, even if the surface on the user side of the touch screen, in other words, the surface on the side where the display device is observed (hereinafter sometimes referred to as "observation surface" is covered with a protective plate such as a glass plate of about several mm in thickness, the touch position can be detected. Therefore, excellent robustness can be obtained. In addition, since there is no moving part, a long life can be obtained.

The projected capacitive touch sensor includes row-direction-detecting wiring lines for detecting a coordinate of the touch position in the row direction, and column-direction-detecting wiring lines for detecting a coordinate of the touch position in the column direction (see, for example, Patent Document 1). In the following description, the row-direction-detecting wiring lines and the column-direction-detecting wiring lines may be together referred to as "detecting wiring lines". Patent Document 1 discloses a touch pad system corresponding to a touch panel. The touch pad system disclosed in Patent Document 1 includes a first series of conductor elements formed on a thin dielectric film, and a second series of conductor elements formed on the first series of conductor elements with an insulating film interposed therebetween as the detecting wiring lines for detecting the electrostatic capacitance (hereinafter sometimes simply referred to as "capacitance"). In a plan view, the first series of conductor elements and the second series of conductor elements intersect each other, but there is no electrical contact at these intersections. The touch position is specified by the detection of capacitance (hereinafter sometimes referred to as "touch capacitance") formed between a pointer such as a finger and conductor elements being a touch sensor with a detection circuit. In addition, relative values of the detection capacitance of two or more conductor elements allow the touch position between the conductor elements to be interpolated.

In the following description, a member in which column-direction-detecting wiring lines and row-direction-detecting wiring lines are arranged on a transparent dielectric substrate is referred to as a "touch screen", and a device in which a detection circuit is connected to the touch screen is referred to as a "touch panel". In addition, in the touch screen, a region in which a touch position can be detected is referred to as "operation area" or "detectable area".

In the operation area of the touch screen, it is necessary to densely arrange the detecting wiring lines in the operation area in order to detect all the touch positions of the pointer. Since the dense detecting wiring lines are easy for the user to visually recognize, the dense detecting wiring lines are not preferable from the viewpoint of the image quality of the display panel. If the detecting wiring lines are made of a transparent conductive film such as indium tin oxide (ITO), the possibility that the detecting wiring lines are visually recognized by the user is reduced. However, since the transparent conductive film has relatively high electrical resistance (hereinafter sometimes simply referred to as "resistance"), the transparent conductive film is disadvantageous for increasing the size of the touch screen. In addition, corrosion relatively easily occurs between the transparent conductive film and other metal wiring lines, and as a result, the wiring lines may be broken. Therefore, when a touch screen is attached to a liquid crystal display (LCD) to be used, there is a problem with the stability of the wiring line to humidity and water drops.

In order to avoid the above problem, it is conceivable to use a low resistance metal material such as silver or aluminum as the material of the detecting wiring line. Using a wiring line made of a metal material (hereinafter sometimes referred to as "metal wiring line") as the detecting wiring line allows the resistance of the detecting wiring line to be lowered. Since the metal wiring line is opaque, the metal wiring line is easily visually recognized by the user as described above. As a method of reducing the case of visibility by the user, there is a method of thinning metal wiring lines (for example, mesh wiring). Patent Document 2 discloses a projected capacitive touch screen with metal line wiring lines.

Densely arranging the thinned metal mesh wiring lines on the operation area of the touch screen causes a problem that the parasitic capacitance between the column-direction-detecting wiring lines and the row-direction-detecting wiring lines (hereinafter sometimes referred to as "line capacitance") greatly increases. As a result, for example, an adverse effect such as an increase in wiring delay or an increase in noise is caused.

The wiring delay can be alleviated to a certain extent by the resistance of the wiring lines being reduced. A technique for reducing the resistance of the wiring lines in order to alleviate the wiring delay is disclosed in, fir example, Patent Document 3. In the touch screen disclosed in Patent Document 3, each of the row-direction-detecting wiring lines and the column-direction-detecting wiring lines is set to form a zigzag pattern in which linear-shaped and thin line-shaped metal wiring lines are connected. Thus, both reduction in resistance and reduction in line capacitance are compatible with each other. In addition, in the touch screen disclosed in Patent Document 3, a plurality of row-direction-detecting wiring lines extending roughly in the row direction are electrically connected to form a row-direction bundled wiring line, and a plurality of column-direction-detecting wiring lines extending roughly in the column direction are electrically connected to form a column-direction bundled wiring line. This makes it possible to uniformly detect the touch capacitance including the capacitance between the pointer such as a finger and the row-direction-detecting wiring lines and the capacitance between the pointer and the column-direction-detecting wiring lines.

The touch panels disclosed in the above Patent Documents 1 to 3 can be manufactured separately from the display panel that performs the display function. In this case, since a transparent substrate other than the substrate for the display panel is required, the thickness and weight of the display device increase. This is unpreferable specifically in mobile devices and the like. For this reason, Patent Documents 4 and 5 disclose methods of integrating the touch screen function in the inside or on the surface of the display panel. The method of integrating a touch screen inside a display panel as in Patent Document 4 is referred to as an in-cell method, and the method of integrating a touch screen on the surface of a display panel as in Patent Document 5 is referred to as an on-cell method. In the in-cell method, the signal due to capacitive coupling between the finger and the detecting wiring lines is poorly generated, and the accuracy of the touch detection may be deteriorated. In the on-cell method, such accuracy deterioration can be suppressed.

According to Patent Document 6, metal fine wiring line is applied to the on-cell method. The mesh-shaped detecting wiring lines are formed on one side or both sides of the color filter substrate so as to coincide with the formation position of the light-shielding portion formed in a pattern shape. Thus, improvement in accuracy of touch detection and thinning and weight-reducing thereof are made compatible. When detecting wiring lines are provided only on a surface being one side of the color filter substrate, the surface on which the light-shielding portion is provided, the distance between the detecting wiring lines and the finger becomes larger, and the distance between the detecting wiring lines and the pixel electrodes becomes smaller. Therefore, the detecting wiring lines are susceptible to the influence of the electric field for driving the liquid crystal. Thus, the accuracy of the touch detection deteriorates similarly to the in-cell method. According to Patent Document 7, a first detection electrode is formed on a first surface of a color filter substrate, and a second detection electrode is formed on a second surface opposite to the first surface.

PRIOR ART DOCUMENTS

Patent Documents

Patent Document 1: Japanese Translation of PCT International Application Publication No. 9-511086 (1997)
Patent Document 2: Japanese Patent Application Laid-Open No. 2012-103761
Patent Document 3: Japanese Patent Application Laid-Open No. 2010-61502
Patent Document 4: Japanese Patent Application Laid-Open No. 2010-231773
Patent Document 5: Japanese Patent Application Laid-Open No. 2008-185785
Patent Document 6: Japanese Patent Application Laid-Open No. 2014-071734
Patent Document 7: Japanese Patent Application Laid-Open No. 2013-097704

SUMMARY

Problem to be Solved by the Invention

In the above Patent Document 7, a Y-detection electrode (outer sensor electrode) is arranged on the observation surface of the substrate, and an X-detection electrode (inner sensor electrode) and a black matrix (light-shielding portion) are arranged on the inner surface opposite to the observation surface. Part of the light going to the observer is blocked not only by the light-shielding portion but also by the inner sensor electrode and the outer sensor electrode. That is, the light is blocked by a light-shielding pattern synthesized from the pattern of the light-shielding portion, the pattern of the inner sensor electrode, and the pattern of the outer sensor electrode. Since the light-shielding portion and the outer sensor electrode are not arranged on the same plane, the light-shielding pattern synthesized from these patterns may largely change depending on the viewing angle of the observer. Therefore, depending on the viewing angle, the light-shielding pattern can especially easily cause moiré.

In addition, in the above-described Patent Document 7, the influence of the detection electrode (outer sensor electrode) on the viewing angle of the display panel is not considered. As will be described in detail below, image unevenness depending on the viewing angle can be more serious depending on the direction in which the outer sensor electrode extends. In particular, it is desirable that the adverse effect on the viewing angle in the left-right direction is suppressed as much as possible in terms of display quality.

The present invention has been made to solve the above problems, and an object of the present invention is to provide a display panel with a touch sensor capable of suppressing the occurrence of moiré depending on the viewing angle. In addition, another object is to provide a display panel with a touch sensor capable of suppressing image unevenness depending on the viewing angle in the left-right direction.

Means to Solve the Problem

The display panel with a touch sensor of the present invention includes a first substrate, a light-shielding portion, a color material portion, a second substrate, a display function layer, a plurality of inner sensor electrodes, and a plurality of outer sensor electrodes. The first substrate has translucency, and includes an observation surface facing an observer and an inner surface opposite to the observation surface. The light-shielding portion is provided on the inner surface of the first substrate and has an opening pattern. The color material portion is provided on the inner surface of the first substrate and includes a plurality of color material layers arrayed corresponding to the opening pattern. The second substrate faces the inner surface of the first substrate. The display function layer is held between the first substrate and the second substrate. The inner sensor electrode is provided between the inner surface of the first substrate and the second substrate, and is included in the light-shielding portion in a plan view. The outer sensor electrode is made of metal and is provided on the observation surface of the first substrate. A projection of the outer sensor electrode onto the inner surface of the first substrate through an optical path corresponding to a viewing angle is included in the light-shielding portion in a plan view. Each of the outer sensor electrodes includes a region extending along one direction parallel to a lateral direction of the display panel with a touch sensor.

Effects of the Invention

In the display panel with a touch sensor according to one aspect of the present invention, the projection of the outer sensor electrode onto the inner surface of the first substrate through the optical path corresponding to the viewing angle is included in the light-shielding portion in a plan view. Thus, the light-shielding pattern synthesized from the patterns of the light-shielding portion and the outer sensor electrode does not change depending on the viewing angle of the observer. Therefore, it is avoided that the light-shielding pattern easily causes moiré depending on the viewing angle. From the above, the occurrence of moiré depending on the viewing angle can be suppressed.

According to the display panel with a touch sensor according to another aspect of the present invention, the touch sensor includes an inner sensor electrode and an outer sensor electrode. Since the inner sensor electrode is not arranged on the observation surface of the first substrate, the inner sensor electrode can be arranged in a position relatively close to the color material portion. Therefore, image unevenness depending on the viewing angle due to the existence of the inner sensor electrode is small. Furthermore, the outer sensor electrode includes a region extending parallel to the lateral direction of the display panel. The location shaded with this region as viewed from the observer in the color material portion does not substantially depend on the viewing angle in the left-right direction. From the above, image unevenness depending on the viewing angle in the left-right direction can be suppressed.

The objects, features, aspects, and advantages of the present invention will become more apparent from the following detailed description and the accompanying drawings.

BRIEF DESCRIPTION OF DRAWINGS

FIG. 19 is a plan view for illustrating the relationship between image unevenness and arrangement of pixel portions in the display panel in FIG. 16.

FIG. 20 is a plan view for illustrating the relationship between image unevenness and arrangement of pixel portions in the display panel in FIG. 16.

FIG. 23 is a plan view for illustrating the relationship between image unevenness and arrangement of pixel portions in the display panel in FIG. 16.

FIG. 24 is a plan view for illustrating the relationship between image unevenness and arrangement of pixel portions in the display panel in FIG. 16.

FIG. 64 is a plan view for illustrating the relationship between image unevenness and arrangement of pixel portions in the display panel in FIG. 61.

FIG. 65 is a plan view for illustrating the relationship between image unevenness and arrangement of pixel portions in the display panel in FIG. 61.

FIG. 68 is a plan view for illustrating the relationship between image unevenness and arrangement of pixel portions in the display panel in FIG. 61.

FIG. 69 is a plan view for illustrating the relationship between image unevenness and arrangement of pixel portions in the display panel in FIG. 61.

FIG. 76 is a plan view showing an example of a switching-circuit structure in a TFT-array substrate included in a display panel in a fourteenth embodiment of the present invention.

FIG. 77 is a plan view schematically showing the configuration of a color filter substrate included in a display panel in a fifteenth embodiment of the present invention.

DESCRIPTION OF EMBODIMENTS

Figure 1:
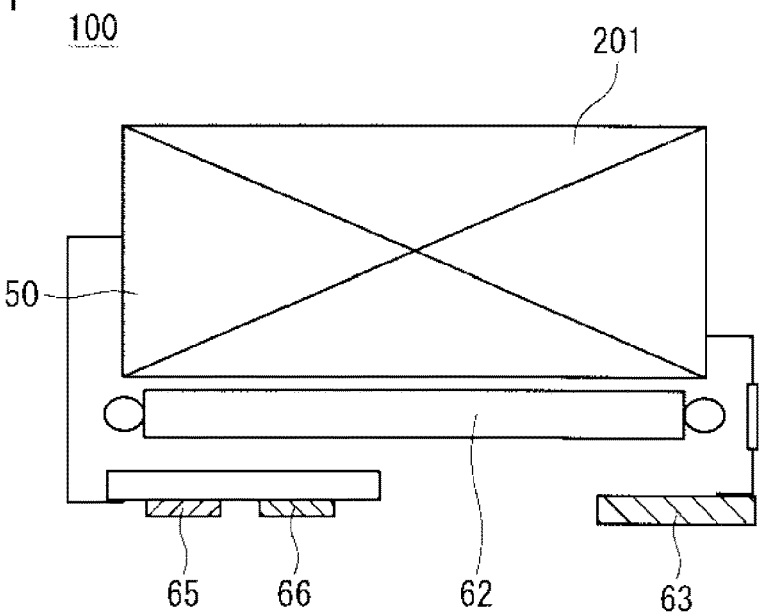
FIG. 1 is a cross-sectional view schematically showing the configuration of a display device including a display panel in a first embodiment of the present invention.

Hereinafter, embodiments of the present invention will be described with reference to the drawings. It should be noted that in the following drawings, the same or corresponding parts will be denoted by the same reference numerals, and description thereof will not be repeated.

First Embodiment (Configuration)

FIG. 1 is a cross-sectional view schematically showing the configuration of a display device 100 including a display panel 201 in the present embodiment. The display device 100 includes a display panel 201, a backlight 62, a liquid-crystal drive circuit board 63, a touch detection IC (Integrated Circuit) 65, and a microcontroller 66. The display panel 201 is a display panel provided with a touch sensor, that is, a display panel with a touch sensor. In other words, a touch screen is integrated on the display panel 201. In the present embodiment and other embodiments to be described below, a case where the display panel 201 is a liquid crystal panel will be described in detail in particular. The touch detection IC 65 constitutes an external circuit for detecting a change in electrostatic capacitance due to a touch.

Figure 2:
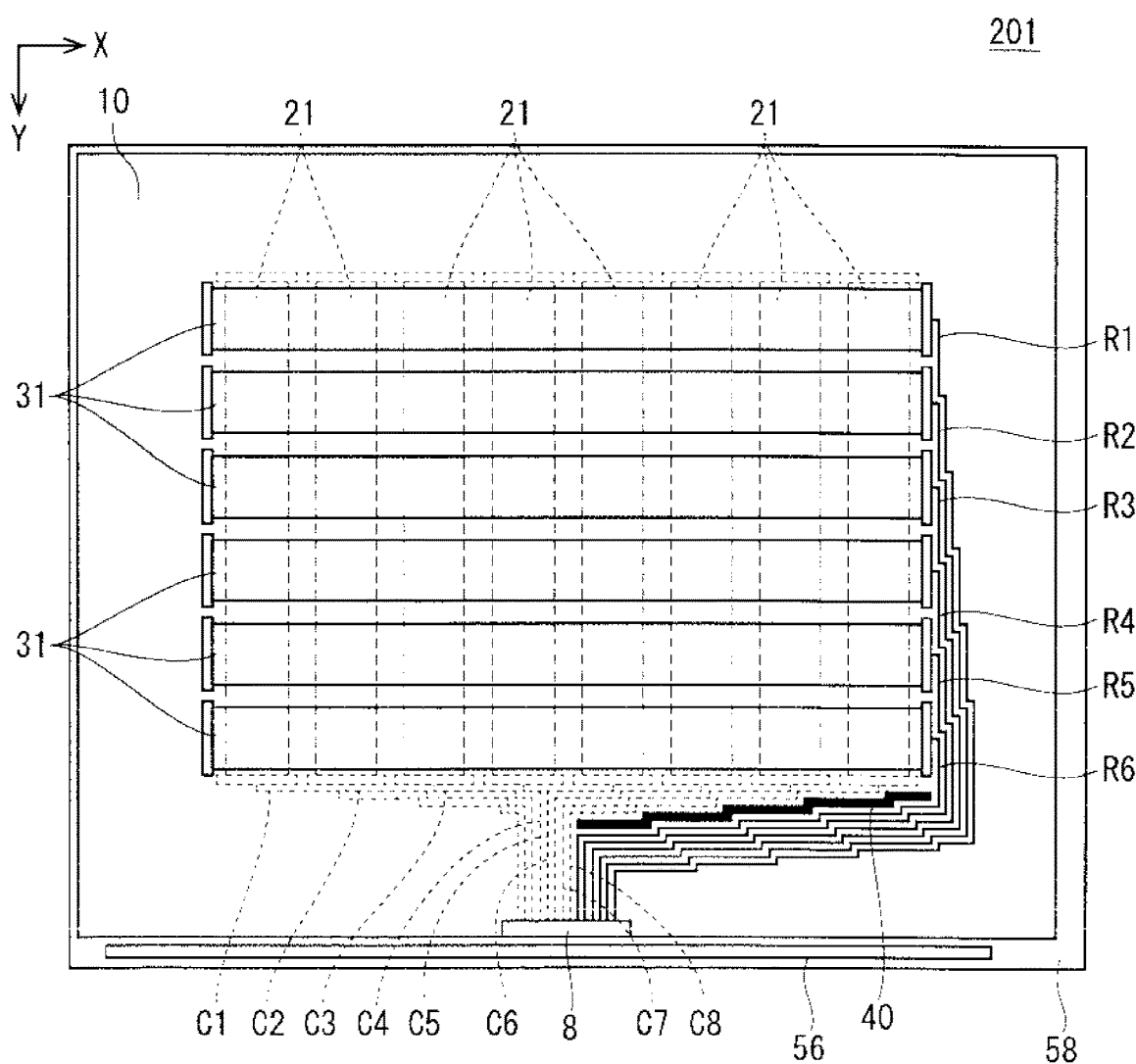
FIG. 2 is a plan view schematically showing the configuration of the display panel in FIG. 1.

FIG. 2 is a plan view schematically showing the configuration of the display panel 201. The display panel 201 includes a first substrate 10 and a second substrate 58 facing each other. The first substrate 10 has translucency and is typically a transparent glass substrate. The second substrate 58 has translucency when the backlight 62 (FIG. 1) is used, and is typically a transparent glass substrate.

The first substrate 10 has a rectangular shape. The rectangular shape has a long side along one direction. In the present embodiment, this one direction is an X direction (row direction) of the display panel 201 parallel to the left-right direction of an observer. In addition, the short side of the rectangular shape is along a Y direction (column direction) parallel to the vertical direction of the observer. The X and Y directions intersect each other, and are typically orthogonal. The second substrate 58 may have a shape that is roughly similar to the shape of the first substrate 10.

The display panel 201 is provided with a projected capacitive type touch sensor. Specifically, the display panel 201 is provided with a touch-screen terminal portion 8, a plurality of column-direction wiring portions 21, a plurality of row-direction wiring portions 31, lead wiring lines C1 to C8, and lead wiring lines R1 to R6. Each of the row-direction wiring portions 31 extends along the X direction. The row-direction wiring portions 31 are arranged at intervals in the Y direction. Each of the column-direction wiring portions 21 extends along the Y direction. The column-direction wiring portions 21 are arranged at intervals in the X direction. The row-direction wiring portions 31 and the column-direction wiring portions 21 are separated with the first substrate 10.

The touch-screen terminal portion 8 is provided at an end portion of the first substrate 10. The respective row-direction wiring portions 31 are connected to the touch-screen terminal portion 8 through the lead wiring lines R1 to R6. The respective column-direction wiring portions 21 are connected to the touch-screen terminal portion 8 through the lead wiring lines C1 to C8. The touch-screen terminal portion 8 is connected to the touch detection IC 65 (FIG. 1). The touch detection IC 65 detects the position on the touch screen indicated by the pointer based on the electrostatic capacitance formed between each of the row-direction wiring portions 31 and the column-direction wiring portions 21 and the pointer.

For example, the lead wiring lines R1 to R6 are arranged along the outer periphery of the detectable area in the order from the lead wiring lines closest to the touch-screen terminal portion 8, and are arranged along other lead wiring lines after reaching the arrangement position of the other lead wiring lines. Thus, the lead wiring lines R1 to R6 are crammed onto the outer peripheral side of the detectable area to be arranged. In addition, similarly, the lead wiring lines C1 to C8 are also crammed onto the outer peripheral side of the detectable area to be arranged in the order from the lead wiring lines closest to the touch-screen terminal portion 8, and are arranged along other lead wiring lines after reaching the arrangement position of the other lead wiring lines. Thus, cramming the lead wiring lines R1 to R6 and the lead wiring lines C1 to C8 as closely as possible onto the outer peripheral side of the detectable area to arrange allows the outer peripheral portion of the display panel 201 to be reduced. In addition, a shield electrode 40 may be arranged between the lead wiring lines R1 to R6 in the row direction and the lead wiring lines C1 to C6 in the column direction. Thus, the influence of electromagnetic noise generated from the display portion or noise between the lead wiring lines can be reduced. The shield electrode 40 can be formed at the same time as the outer sensor electrode 30 or the inner sensor electrode 20 described below.

Figure 3:
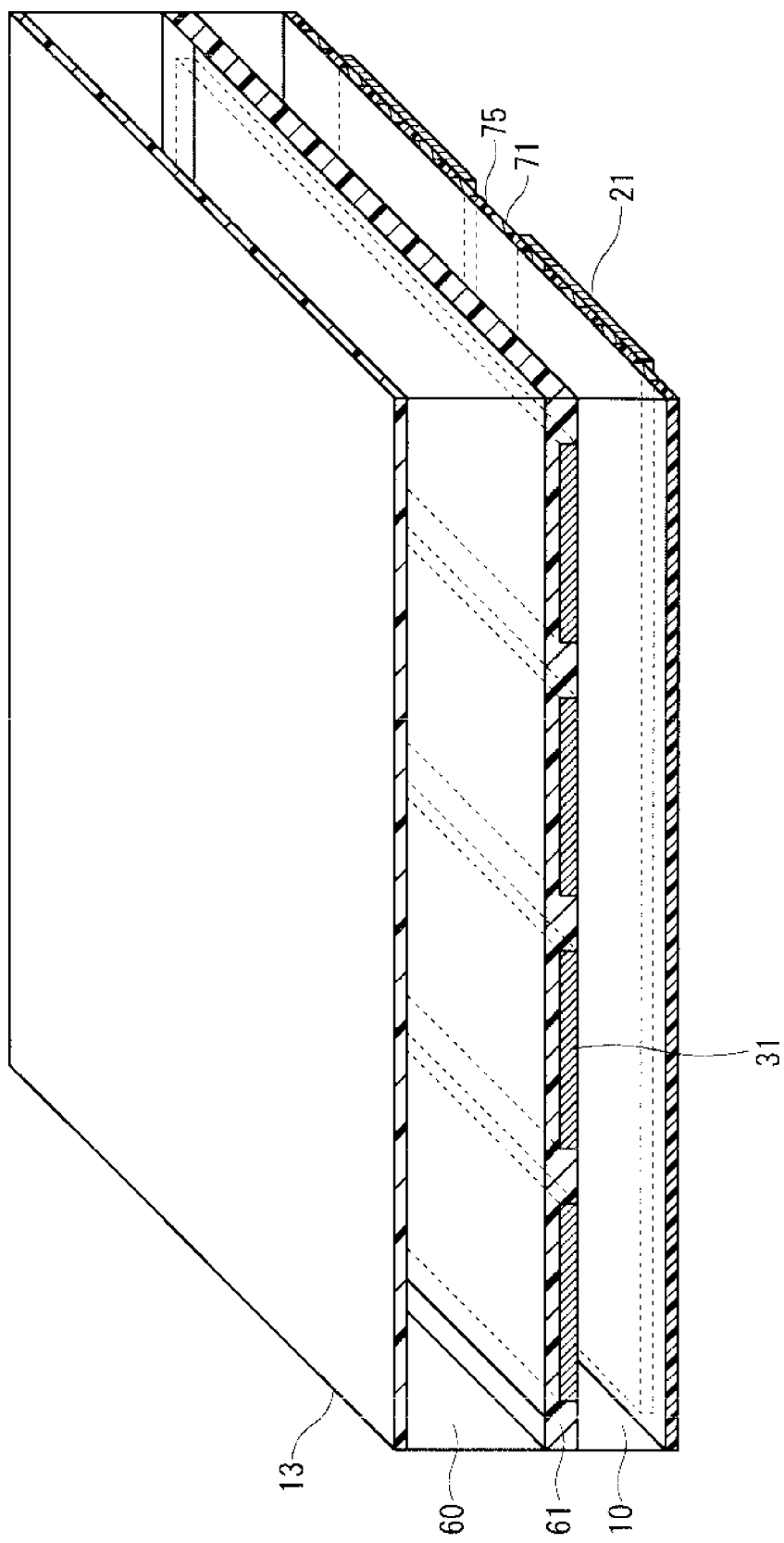
FIG. 3 is a partial perspective view schematically showing the configuration of a detectable area of a touch screen integrated on the display panel.

FIG. 3 is a partial perspective view schematically showing the configuration of a detectable area of a touch screen integrated on the display panel 201. This configuration corresponds to the color filter substrate included in the display panel 201, and includes a first substrate 10, a light-shielding portion 71 (black matrix), a color material portion 75, a plurality of column-direction wiring portions 21 (inner wiring portions), and a plurality of row-direction wiring portions 31 (outer wiring portions). In the present embodiment, this color filter substrate corresponds to a touch screen having an on-cell structure. The first substrate 10 has an observation surface (upper surface in the drawing) facing the observer and an inner surface (lower surface in the drawing) opposite to the observation surface. The second substrate 58 (FIG. 2) faces the inner surface of the first substrate 10.

The row-direction wiring portion 31 is provided on the observation surface of the first substrate 10. The column-direction wiring portion 21 is provided between the inner surface of the first substrate 10 and the second substrate 58 (FIG. 2), and is provided on the inner surface in the present embodiment. Therefore, the row-direction wiring portion 31 and the column-direction wiring portion 21 are obstructed with the first substrate 10. A plurality of row-direction wiring portions 31 extending in the row direction (lateral direction in the drawing) and a plurality of column-direction wiring portions 21 extending in the column direction constitute a matrix region in a plan view. In the matrix region, it is desirable from the viewpoint of display quality that each of the proportions of the row-direction wiring portion 31 and the column-direction wiring portion 21 is the same.

The light-shielding portion 71 is provided on the inner surface of the first substrate 10 and has an opening pattern.

The color material portion 75 is provided on the inner surface of the first substrate 10. The light-shielding portion 71 and the color material portion 75 constitute a color filter layer provided on the inner surface of the first substrate 10.

It should be noted that an adhesive layer 61, a protective transparent substrate 60, and an upper polarizing plate 13 are provided in this order on the observation surface provided with the row-direction wiring portion 31. In order to improve environmental resistance, the protective transparent substrate may be provided on the surface facing the observer of the upper polarizing plate 13 with the interposition of the adhesive layer.

Figure 4:
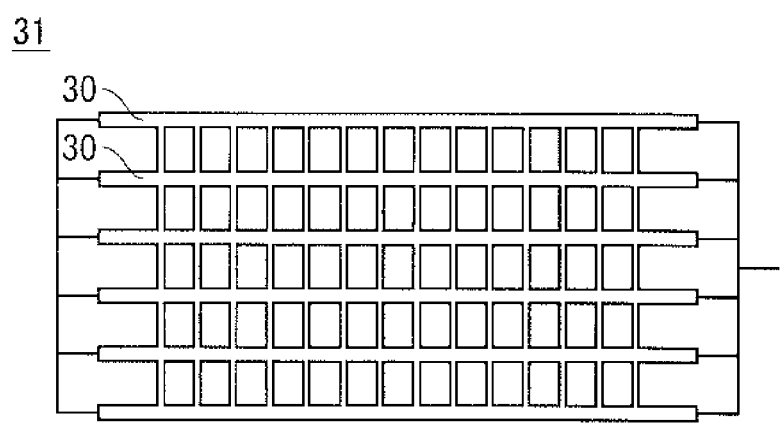
FIG. 4 is a plan view schematically showing the configuration of each of the mw-direction wiring portions in FIG. 2.

FIG. 4 is a plan view schematically showing the configuration of each of the row-direction wiring portions 31. Each of the row-direction wiring portions 31 includes at least one outer sensor electrode 30, and in the present embodiment, includes one lattice-shaped outer sensor electrode 30. In the present embodiment, the outer sensor electrode 30 includes a lattice pattern extending along the X direction and the Y direction (FIG. 2). In other words, in the present embodiment, the outer sensor electrode 30 includes a region extending along one direction parallel to the lateral direction of the display panel 201, that is, the X direction, and a region extending along a direction crossing the X direction (specifically, a Y direction orthogonal to the X direction).

The outer sensor electrode 30 is made of metal. Preferably, the outer sensor electrode 30 contains at least any one of atoms of silver, copper, aluminum, molybdenum, and titanium. Specifically, the outer sensor electrode 30 is a single layer film or a multilayer film of a metal material such as aluminum, or a multilayer film of a metal material and another material. For example, a laminated structure of a metal and its nitride may be used. It should be noted that the "metallic material" may be an alloy material including the above atoms.

Figure 5:
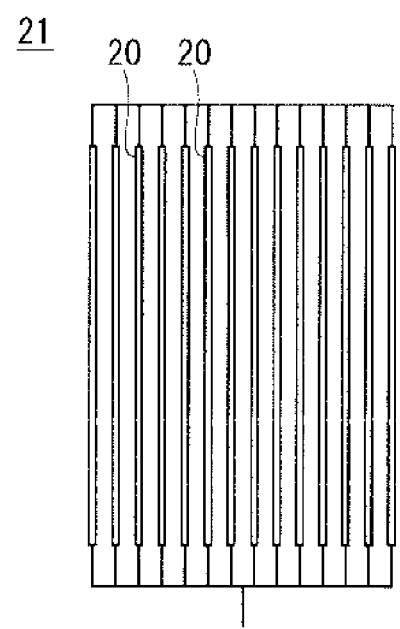
FIG. 5 is a plan view schematically showing the configuration of each of the column-direction wiring portions in FIG. 2.

FIG. 5 is a plan view schematically showing the configuration of each of the column-direction wiring portions 21. Each of the column-direction wiring portions 21 includes at least one inner sensor electrode 20, and for example, as shown in the drawing, a plurality of inner sensor electrodes 20 connected in parallel with each other. In the present example, each of the inner sensor electrodes 20 extends along the Y direction (FIG. 2). The inner sensor electrode 20 may be made of the same material as the outer sensor electrode 30.

Figure 6:
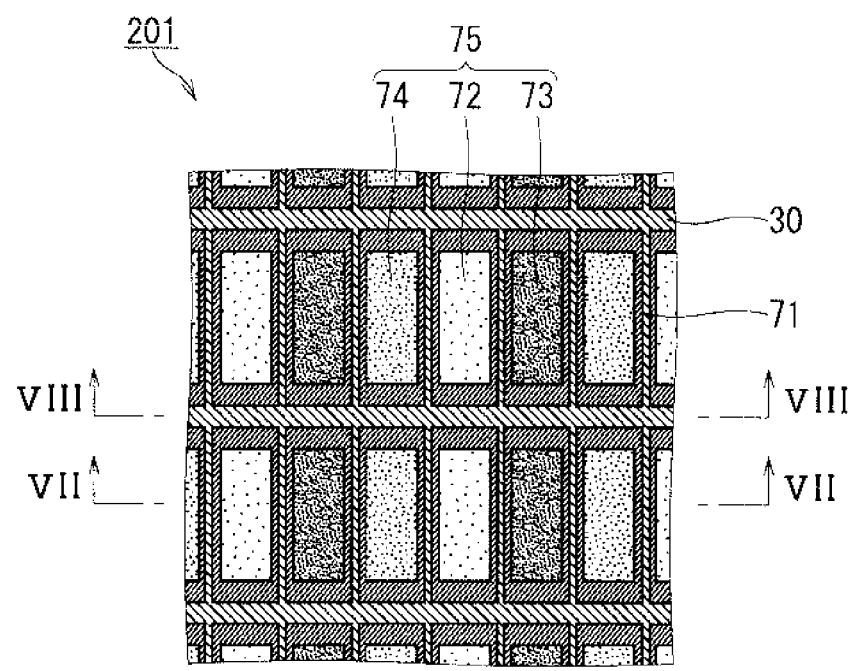
FIG. 6 is a partial plan view schematically showing the configuration of a color filter substrate included in the display panel in the first embodiment of the present invention.
Figure 7:
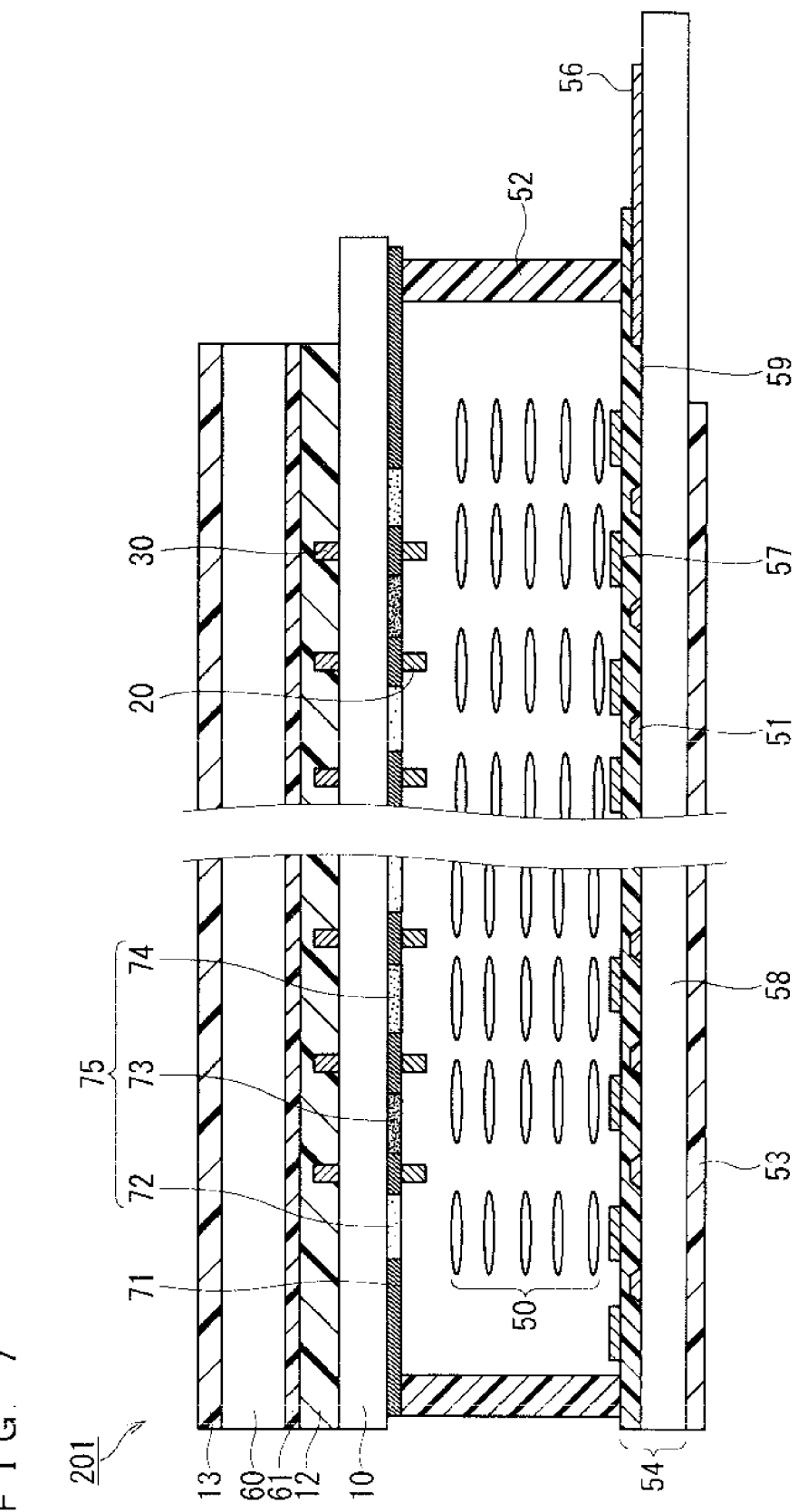
FIG. 7 is a schematic cross-sectional view taken along line VII-VII in FIG. 6.
Figure 8:
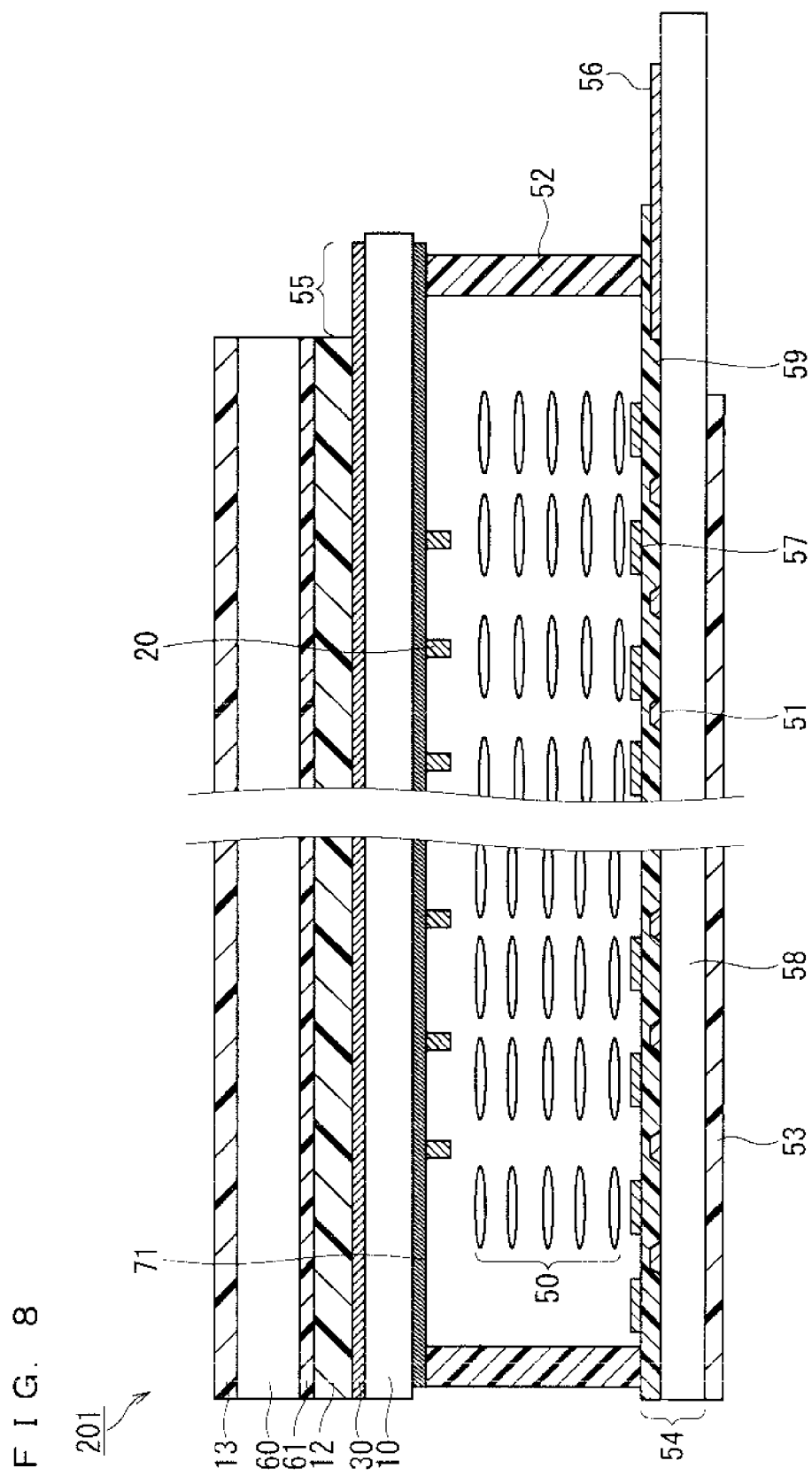
FIG. 8 is a schematic cross-sectional view taken along line VIII-VIII in FIG. 6.

FIG. 6 is a partial plan view schematically showing the configuration of a color filter substrate included in the display panel 201. In other words, FIG. 6 is a partial plan view of the main part in FIG. 3 as viewed from the observation surface (as viewed from the upper direction in FIG. 3). FIGS. 7 and 8 are respectively schematic cross-sectional views taken along lines VII-VII and VIII-VIII in FIG. 6.

The color material portion 75 includes a plurality of color material layers 72 to 74 arranged corresponding to the opening pattern of the light-shielding portion 71. The color material layers 72 to 74 have different colors from each other. For example, the color material layer 72 has red (R), the color material layer 73 has green (G), and the color material layer 74 has blue (B). The color material portion 75 includes, for example, a stripe array. In the stripe array, color material layers having the same color of the color material layers 72 to 74 are arrayed along the stripe direction (vertical direction in FIG. 6). That is, the stripe direction corresponds to the Y direction (FIG. 2). Therefore, the color material portion 75 includes color material layers 72 to 74 adjacent to each other and having a common color in the Y direction (vertical direction in the drawing).

Figure 9:
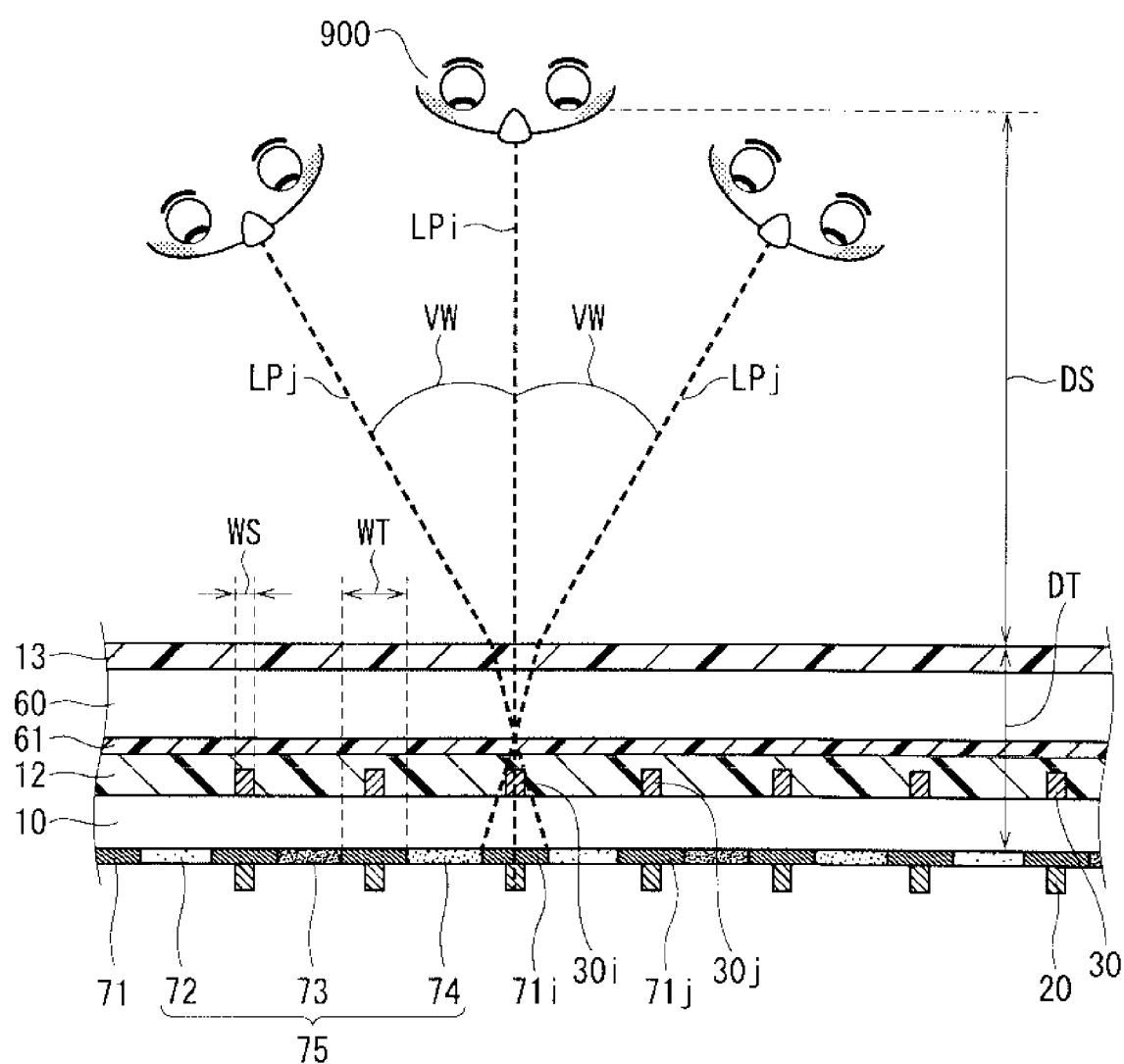
FIG. 9 is a diagram schematically illustrating an optical path perpendicular to the first substrate and an optical path at the viewing angle VW between the first substrate of the display panel in FIG. 7 and the observer.

The outer sensor electrode 30 is arranged on the observation surface of the first substrate 10 as described above. As shown in FIG. 6, the outer sensor electrode 30 is included in the light-shielding portion 71 in a plan view. More specifically, the projection of the outer sensor electrode 30 onto the inner surface through the optical path corresponding to the viewing angle is included in the light-shielding portion 71 in a plan view. The viewing angle is set to a predetermined angle or less according to the specification of the display panel 201. For example, the viewing angle can be defined as the angle at which the observer views the panel as shown in FIG. 9 to be described in detail below. The size of the viewing angle is determined by the specification required of the display panel. This arrangement of the outer sensor electrode 30 will be described in detail below.

FIG. 9 shows a state in which the display panel 201 (FIG. 7) is observed by the observer 900 at the viewing distance DS. The optical path LPi is an optical path perpendicular to the first substrate 10 between the first substrate 10 and the observer 900. In addition, the optical path LPj is an optical path at the viewing angle VW between the first substrate 10 and the observer 900. The viewing angle VW is an angle from the normal of the observation surface of the first substrate 10 and satisfies the specifications of the display panel 201. Therefore, the viewing angle VW can be said to be all angles not more than the maximum angle satisfying the specification. Specifically, the viewing angle VW is all angles within a range in which the color shade, the brightness, and the contrast ratio are substantially constant and gradation inversion (a phenomenon in which a bright portion and a dark portion are reversed in an intermediate gradation) does not occur when the screen of the display panel 201 is viewed from an oblique direction. In other words, the viewing angle VW is all angles within a range in which the color shade, brightness, and contrast ratio are substantially the same as when viewed from the front and the gradation inversion does not occur when the screen of the display panel 201 is viewed from an oblique direction. In other words, the viewing angle VW is an angle indicating a range in which the display content of the display panel 201 is correctly viewed. The measurement standard of the contrast ratio has no unified indicator and has differences between manufacturers, but in general, an angle at which a contrast ratio of 10:1 or more or 5:1 or more is maintained is often defined as a viewing angle. In the drawing, each of the outer sensor electrode 30i and the outer sensor electrode 30j refers to a part of the outer sensor electrode 30 for convenience of illustration. Each of the light-shielding portion 71i and the light-shielding portion 71j refers to a part of the light-shielding portion 71 for convenience of illustration.

The light-shielding portion 71i and the light-shielding portion 71j are respectively included in the outer sensor electrodes 30i and 30j in a plan view. Therefore, when the first substrate 10 is perpendicularly observed, the light travels along the optical path LPi, and the outer sensor electrode 30i is naturally included in the light-shielding portion 71i as viewed from the observer.

On the other hand, when the first substrate 10 is observed at the viewing angle VW, in order for the outer sensor electrode 30i to be included in the light-shielding portion 71i as viewed from the observer, the projection of the outer sensor electrode 30j onto the inner surface of the first substrate 10 (the lower surface in the drawing) along the optical path LPj needs to be included in the light-shielding portion 71i. Arranging the outer sensor electrode 30 so that this condition is satisfied within the range of a predetermined viewing angle prevents the outer sensor electrode 30 from affecting the substantial light-shielding pattern within the range of the predetermined viewing angle. In other words, within the range of the predetermined viewing angle, the light-shielding pattern synthesized from the patterns of the light-shielding portion 71 and the outer sensor electrode 30 does not change depending on the viewing angle of the observer 900. Therefore, it is avoided that the light-shielding pattern easily causes moiré depending on the viewing angle.

In order to arrange the outer sensor electrode 30 as described above, a width WS of the outer sensor electrode 30 is made smaller than a width WT of the light-shielding portion 71 in the left-right direction (horizontal direction in the drawing) of the observer. In addition, in a plan view, a margin of the light-shielding portion 71 is provided on both the right side and the left side of the outer sensor electrode 30. The size of the required margin is determined not only by the magnitude of the viewing angle VW, but also by the thickness and the refractive index of the member existing between the inner surface of the first substrate 10 (the lower surface in the drawing) and the observer 900. This is because the optical path LPj passing through different kinds of media obliquely to these interfaces is affected by the refraction phenomenon.

As described above, arranging the outer sensor electrode 30 can suppress the occurrence of moiré depending on the viewing angle.

It should be noted that according to the arrangement illustrated in FIG. 9, the occurrence of moiré is suppressed within the range of the viewing angle in the left-right direction of the observer 900. Typically, the image quality within the range of the viewing angle in the left-right direction is more important than the image quality within the viewing angle in the vertical direction. Therefore, typically, only the viewing angle in the left-right direction may be considered as the "viewing angle". However, when the image quality within the range of the viewing angle in the vertical direction is particularly important, only the viewing angle in the vertical direction may be considered as the "viewing angle". In addition, when the image quality within the range of the viewing angle in both the left-right direction and the vertical direction is required, each of these viewing angles may be considered as the "viewing angle".

With reference to FIGS. 6 to 8 again, the inner sensor electrode 20 is preferably arranged so as to at least partially overlap with the light-shielding portion 71 in a plan view. More preferably, the inner sensor electrode 20 is included in the light-shielding portion 71 in a plan view. In the present embodiment, the inner sensor electrode 20 is arranged on the inner surface of the first substrate 10 with the interposition of the light-shielding portion 71.

The outer sensor electrode 30 may be covered with the protective film 12 on the observation surface (upper surface in FIGS. 7 and 8) of the first substrate 10. An electrode further extending from the outer sensor electrode 30 and being exposed without being covered with the protective film 12 is the touch screen terminal 55 (FIG. 8). Each of the touch screen terminals 55 is connected to the touch-screen terminal portion 8 (FIG. 2). Part or all of the protective film 12 can be formed of a transparent inorganic insulating film, an organic inorganic insulating film, or an organic insulating film. As the transparent inorganic insulating film, a silicon-based inorganic insulating film such as a silicon oxide film, a silicon nitride film, a silicon oxynitride film, or a metal oxide film such as alumina can be used. As a material of the organic inorganic insulating film, a polymer material in which the main chain is made of silicon oxide, silicon nitride, or silicon oxynitride, and organic matter is bonded to the side chains or functional groups can be used. As the material of the organic insulating film, for example, an acrylic resin, a polyimide resin, an epoxy resin, a novolak resin, an olefin resin, or the like, whose main chain is made of carbon and which is obtained by curing by high-temperature firing, can be used.

The display panel 201 (FIG. 7) has a function of displaying an image with the display function unit constituted by a color filter substrate including the first substrate 10, a TFT-array substrate 54 including the second substrate 58, and a liquid crystal layer 50 as a display function layer held between them. The liquid crystal layer 50 is sealed between the first substrate 10 and the second substrate 58 with a sealant 52. An upper polarizing plate 13 and a lower polarizing plate 53 are respectively provided on one side and the other side of the liquid crystal layer 50.

On the second substrate 58, the TFT-array substrate 54 includes: a pixel electrode 57, a transistor element (not shown) for switching the voltage applied to the pixel electrode 57, a TFT-array wiring layer 51 for supplying a voltage for driving the liquid crystal layer 50 to this transistor element, an interlayer insulating film 59 covering the TFT-array wiring layer 51, and a TFT-array terminal 56 for connecting the TFT-array wiring layer 51 to an external circuit.

(Formation Timing of Outer Sensor Electrode in Manufacture)

in the manufacture of the display panel 201, the light-shielding portion 71, the color material portion 75, and the inner sensor electrode 20 are preferably formed on the inner surface of the first substrate 10 after the outer sensor electrode 30 is formed on the observation surface of the first substrate 10. Therefore, preferably, the material of the protective film 12 covering the outer sensor electrode 30 has sufficient resistance to chemical medical fluids or moisture used in the formation process of the color material portion 75 during manufacture or under the use environment after manufacture. It should be noted that an overcoat film covering the inner sensor electrode 20 may be provided as the protective film of the inner sensor electrode 20.

Since the color material portion 75 is easily decomposed and discolored by high temperature treatment, high temperature treatment cannot be performed on the first substrate 10 provided with the color material portion 75. Forming the outer sensor electrode 30 ahead of the color material portion 75 allows the outer sensor electrode 30 to be formed at a high temperature. Thus, the protective film 12 having high hardness can be formed. The hardness of the protective film 12 is preferably the same degree (specifically, hardness 7 or more) as that of dust floating in air and glass. Thus, friction with the stage during conveyance in the manufacturing process, or the occurrence of scratches caused by use after manufacture is suppressed. Such scratches cause disconnection or corrosion or are visually recognized as display defects due to changes in the state of transmission or reflection of light. Therefore, such scratches cause a decrease in yield. The material of the protective film 12 is, for example, an inorganic insulating film such as $SiO_2$ or SiN, or an organic insulating film.

It should be noted that assuming that the outer sensor electrode 30 is formed after the step of laminating the color filter substrate having the first substrate 10 and the TFT-array substrate 54 having the second substrate 58 and the step of injecting and sealing the liquid crystal between them, when a defect in the touch sensor is found by inspection, the loss cost increases because the display panel 201 is already close to completion. On the other hand, if the outer sensor electrode 30 is formed at an early stage as described above, the loss cost is reduced, which is also advantageous from the aspect of environmental conservation.

(Summary of Effects)

With reference to FIG. 9, as described above, the projection of the outer sensor electrode 30 onto the inner surface of the first substrate 10 (the lower surface in the drawing) through the optical path LPj corresponding to the viewing angle VW is included in the light-shielding portion 71 in a plan view. Thus, the light-shielding pattern synthesized from the patterns of the light-shielding portion 71 and the outer sensor electrode 30 does not change depending on the viewing angle of the observer 900. Therefore, it is avoided that the light-shielding pattern easily causes moiré depending on the viewing angle. From the above, the occurrence of moiré depending on the viewing angle can be suppressed.

It should be noted that the inner sensor electrode 20 is arranged on the inner surface of the first substrate 10 together with the light-shielding portion 71. Thus, the positional deviation in the direction along the viewing distance DS (FIG. 9) between the inner sensor electrode 20 and the light-shielding portion 71 is small. Therefore, unlike the outer sensor electrode 30, the inner sensor electrode 20 is unlikely to cause the occurrence of moiré depending on the viewing angle.

The outer sensor electrode 30 is made of metal. Thus, the wiring resistance can be reduced. Therefore, a narrower wiring width and a wider pitch between wiring lines can be applied. Thus, the light transmittance in the detectable area can be improved and the size of the touch screen can be increased. The same effect can be obtained when the inner sensor electrode 20 is made of metal. In addition, since the wiring resistance is small, touch detection can be performed in a short response time, that is, at high speed.

Preferably, the outer sensor electrode 30 contains at least any one of atoms of silver, copper, aluminum, molybdenum, and titanium. Thus, the wiring resistance of the outer sensor electrode 30 can be reduced. Therefore, the sensitivity of the touch sensor can be enhanced.

When the inner sensor electrode 20 (FIG. 7) is included in the light-shielding portion 71 in a plan view, the inner sensor electrode 20 is hardly visible from the observer. Therefore, image unevenness caused by the existence of the inner sensor electrode 20 can be further suppressed. As the inner sensor electrode 20 fits inside the light-shielding portion 71 in the left-right direction, the viewing angle area in which image unevenness does not occur in the left-right direction becomes wider.

The outer sensor electrode 30 (FIG. 6) is included in the light-shielding portion 71 in a plan view. Thus, the shade extending vertically from the outer sensor electrode 30 is less likely to overlap with the color material portion 75. Therefore, image unevenness in the vertical direction caused by the existence of the outer sensor electrode 30 can be further suppressed. As the outer sensor electrode 30 fits inside the light-shielding portion 71 in the vertical direction, the viewing angle area in which image unevenness does not occur in the vertical direction becomes wider.

The inner sensor electrode 20 and the outer sensor electrode 30 (FIG. 8) are separated by the first substrate 10. Thus, electrical insulation properties between the inner sensor electrode 20 and the outer sensor electrode 30 are sufficiently secured. Therefore, the withstand voltage of the touch sensor can be sufficiently secured. In addition, the first substrate 10 is also used as a substrate for constituting a color filter substrate. This makes it possible to reduce the size and weight of the display panel 201.

The outer sensor electrode 30 (FIG. 8) is provided on the observation surface of the first substrate 10. Accordingly, the outer sensor electrode 30 is disposed close to the touch position. Therefore, the detection sensitivity is enhanced.

The row-direction wiring portion 31 (FIG. 4) preferably includes an outer sensor electrode 30 having a lattice pattern. Thus, even if the outer sensor electrode 30 is locally disconnected, it is avoided that the sensor function is greatly impaired.

The environmental resistance of the display panel 201 is enhanced by the protective transparent substrate 60 (FIG. 7). Using metal for the material of the outer sensor electrode 30 enhances water resistance and chemical resistance as compared with using an oxide conductor. The environmental resistance is further enhanced with the protective film 12.

Modified Example of Column-Direction Wiring Portion

In FIG. 5, the case where each of the column-direction wiring portions 21 includes inner sensor electrodes 20 patterned in an approximately rectangular shape is described. The inner sensor electrode 20 exists in the entirety of the approximately rectangular shape.

Figure 10:
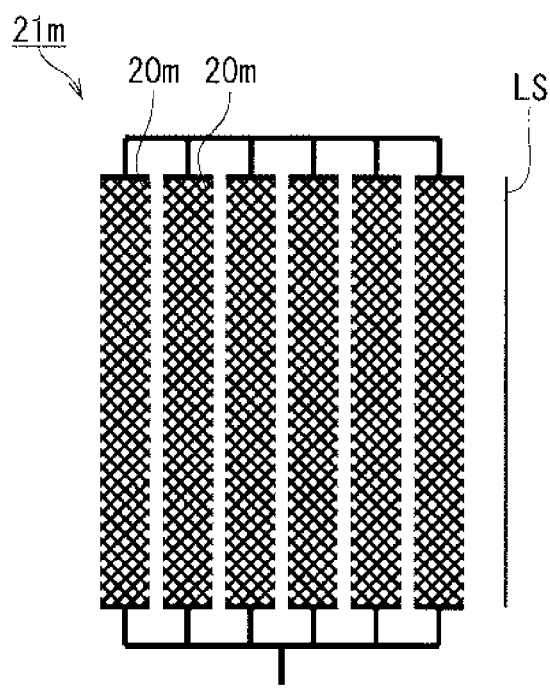
FIG. 10 is a plan view schematically showing a first modified example of FIG. 5.

In a first modified example (FIG. 10), each of the column-direction wiring portions 21*m* includes inner sensor electrodes 20*m* patterned in an approximately rectangular shape. Within this rectangle, the inner sensor electrode 20*m* exists in a mesh shape. Using a mesh-shaped configuration causes the inner sensor electrode 20*m* to be less likely to be visually recognized by the observer. Thus, even if the inner sensor electrode has a portion not included in the light-shielding portion 71 (FIG. 6) in a plan view, it is avoided that the inner sensor electrode has a significant influence on the image quality. Therefore, the inner sensor electrode 20*m* can be provided more widely. The widely provided inner sensor electrode 20*m* can effectively shield the noise from the TFT-array substrate 54 to the outer sensor electrode 30. This will be described in detail below.

When a mutual capacitance type touch sensor is provided with the outer sensor electrode 30 and the inner sensor electrode 20, the outer sensor electrode 30 functions as a detection electrode and the inner sensor electrode 20 functions as an excitation (drive) electrode. When the detection electrode and the excitation electrode are arranged on the same plane, the interelectrode capacitance required for detection is formed by the electric field in the lateral direction. Therefore, it is necessary to provide a certain distance between the electrodes. On the other hand, in the present embodiment, the detection electrode and the excitation electrode are arranged on different planes, and the interelectrode capacitance is formed by the electric field in the longitudinal direction. Therefore, the inner sensor electrode 20 as the excitation electrode can be arranged as densely as possible. Thus, the outer sensor electrode 30 as a detection electrode, which is more susceptible to noise than the excitation electrode, can be effectively shielded from the noise generated from the TFT-array substrate 54 with the densely arranged inner sensor electrode 20.

Figure 11:
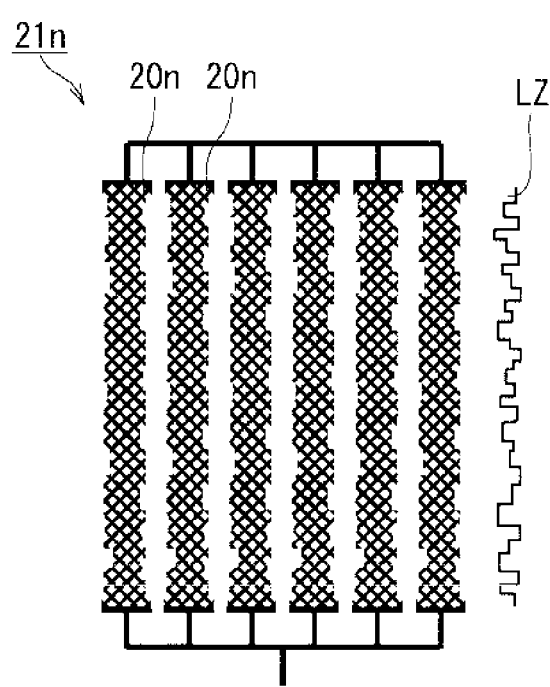
FIG. 11 is a plan view schematically showing a second modified example of FIG. 5.

In the first modified example, the outer edge of the mesh-shaped inner sensor electrode 20*m* extends linearly along the vertical direction (along the straight line LS in the drawing). Since such an outer edge reflects the light regularly, the outer edge is easily visually recognized from the observer. To avoid this, in the column-direction wiring portion 21n of the second modified example (FIG. 11), the outer edge of the mesh-shaped inner sensor electrode 20n nonlinearly extends in a zigzag in the vertical direction (along the line LZ in the drawing).

Second Embodiment (Configuration)

Figure 12:
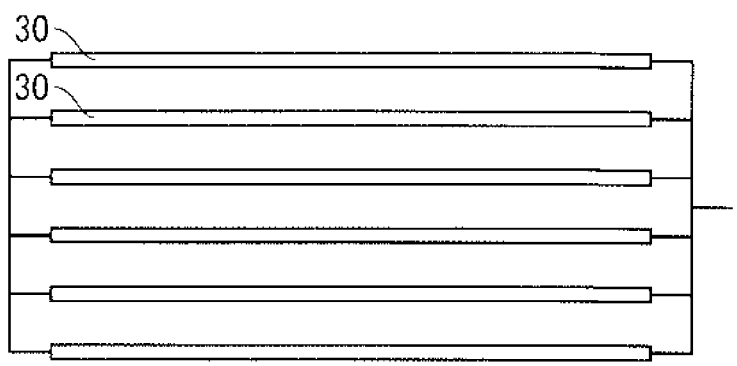
FIG. 12 is a plan view schematically showing the configuration of each of the row-direction wiring portions included in the display panel in a second embodiment of the present invention.

With reference to FIG. 12, in the present embodiment, a row-direction wiring portion 31L is used instead of the row-direction wiring portion 31 (FIG. 4: first embodiment). Each of the row-direction wiring portions 31L includes at least one outer sensor electrode 30, and typically includes a plurality of outer sensor electrodes 30 connected in parallel with each other. Each of the outer sensor electrodes 30 extends along the X direction (FIG. 2).

Figure 13:
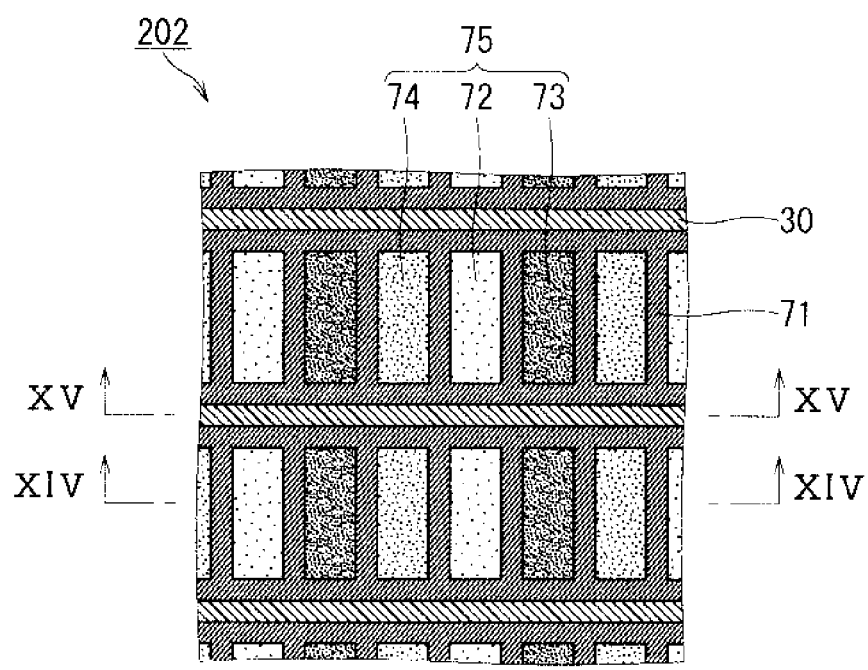
FIG. 13 is a partial plan view schematically showing the configuration of a color filter substrate included in the display panel in the second embodiment of the present invention.
Figure 14:
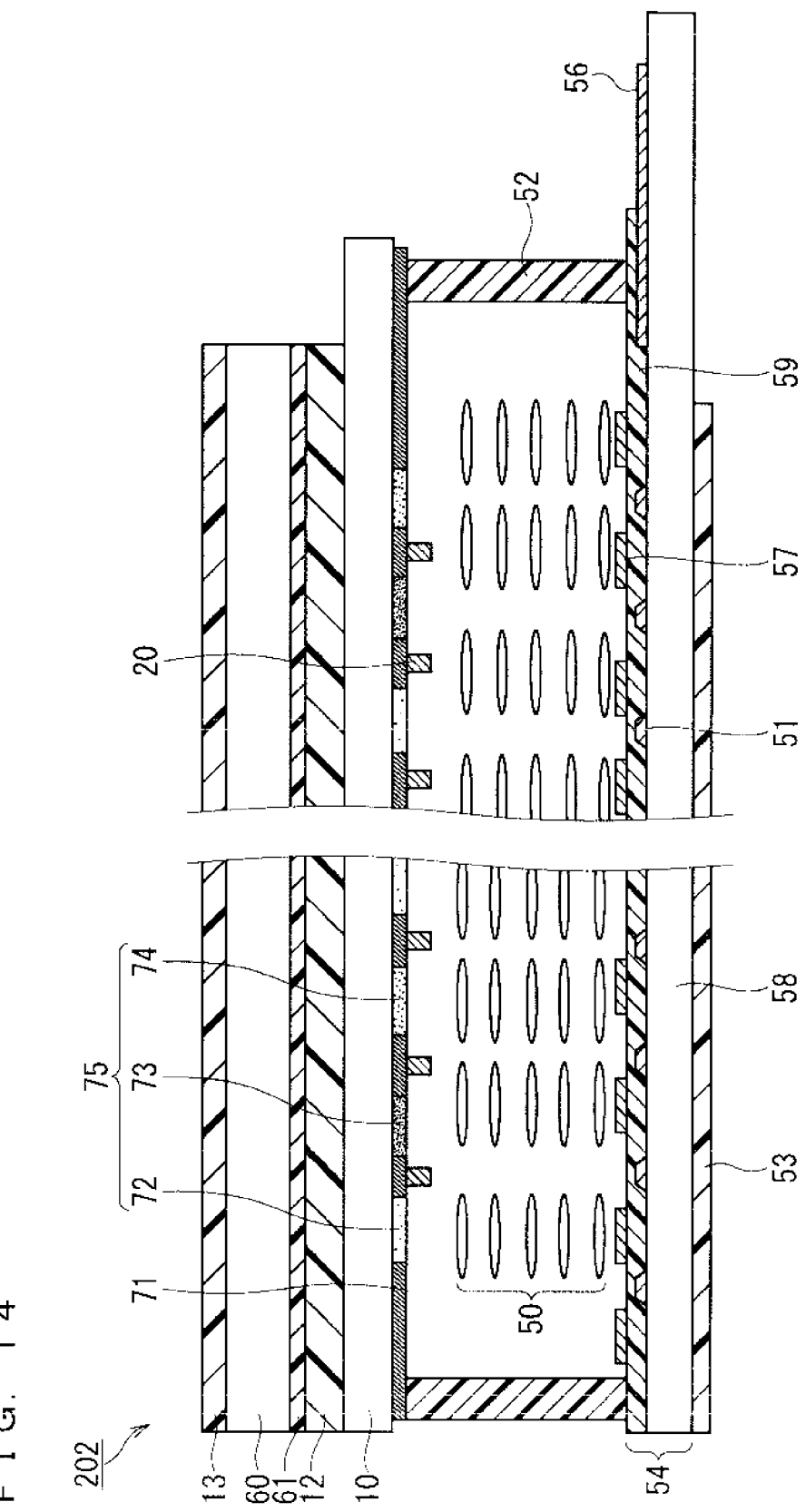
FIG. 14 is a schematic cross-sectional view taken along line XIV-XIV in FIG. 13.
Figure 15:
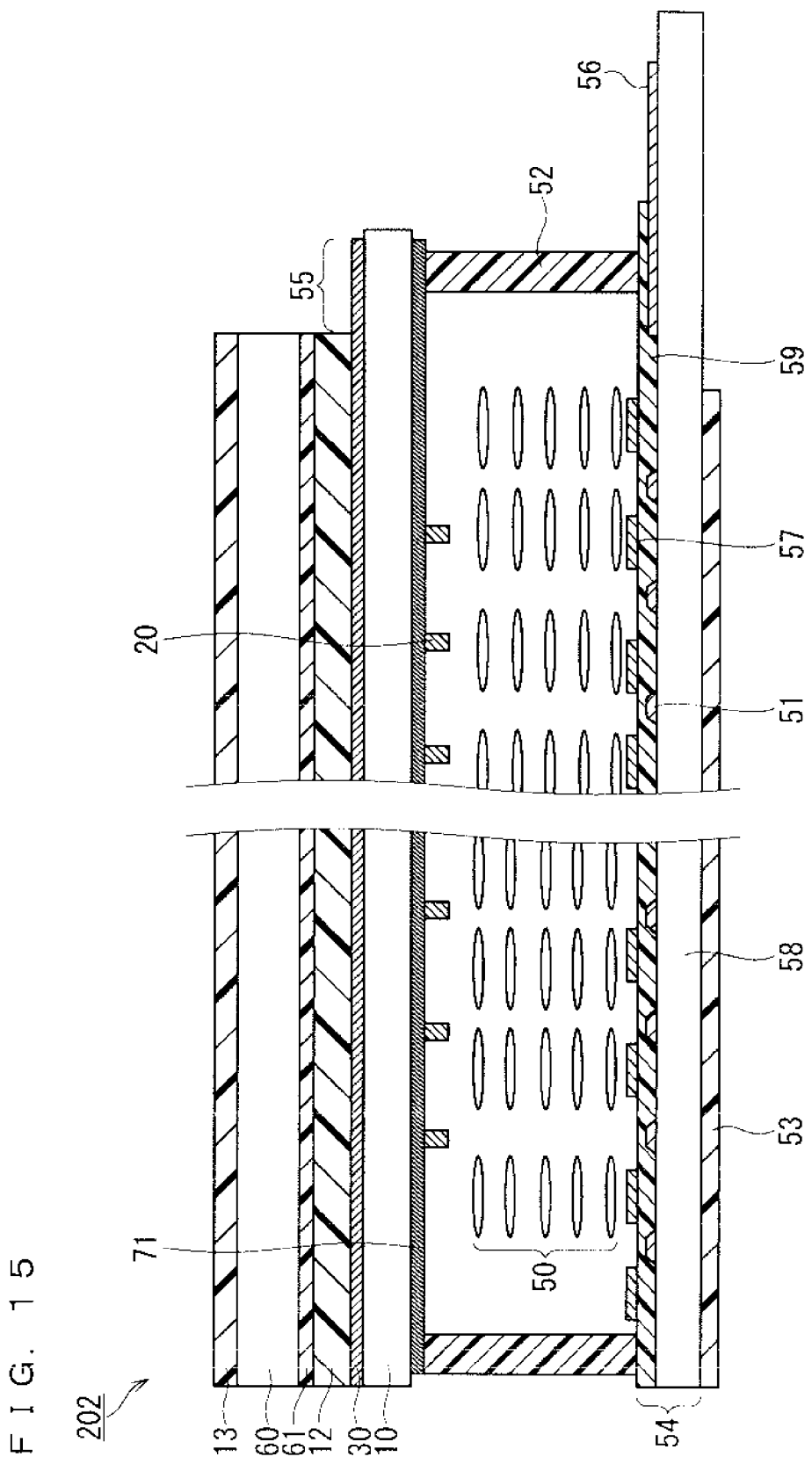
FIG. 15 is a schematic cross-sectional view taken along line XV-XV in FIG. 13.

FIG. 13 is a partial plan view schematically showing the configuration of a color filter substrate included in the display panel 202 of the present embodiment. In other words, FIG. 6 is a partial plan view of the main part in FIG. 3 as viewed from the observation surface (as viewed from the upper direction in FIG. 3). FIGS. 14 and 15 are respectively schematic cross-sectional views taken along lines XIV-XIV and XV-XV in FIG. 13. According to the configuration described above, each of the outer sensor electrodes 30 extends along one direction parallel to the lateral direction of the display panel 202, that is, along the X direction. In other words, each of the outer sensor electrodes 30 has only a region extending along the X direction. It should be noted that also in the present embodiment, as in the first embodiment, the projection of the outer sensor electrode 30 onto the inner surface of the first substrate 10 through the optical path corresponding to the viewing angle is included in the light-shielding portion 71 in a plan view.

Comparative Example

Figure 16:
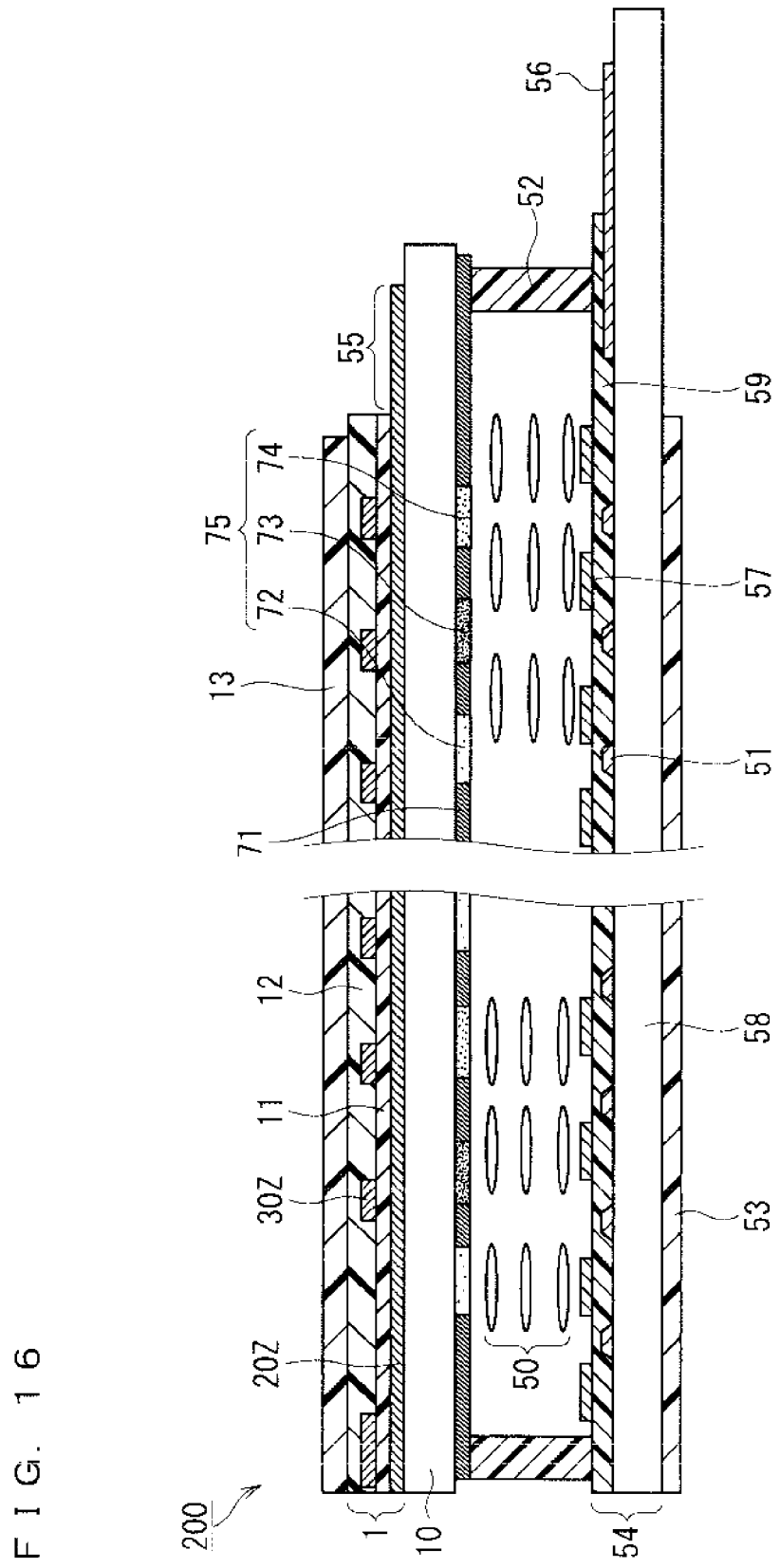
FIG. 16 is a cross-sectional view showing the configuration of a display panel of a comparative example.

With reference to FIG. 16, in the display panel 200 of the comparative example, an outer sensor electrode 20Z and an outer sensor electrode 30Z are provided instead of the inner sensor electrode 20 and the outer sensor electrode 30 (FIG. 15). The outer sensor electrode 20Z and the outer sensor electrode 30Z are arranged on the observation surface of the first substrate 10. The outer sensor electrode 20Z and the outer sensor electrode 30 are separated by an interlayer insulating film 11. With the above configuration, the touch screen unit 1 including the outer sensor electrode 20Z, the outer sensor electrode 30, and the interlayer insulating film 11 is configured on the observation surface of the first substrate 10.

Figure 17:
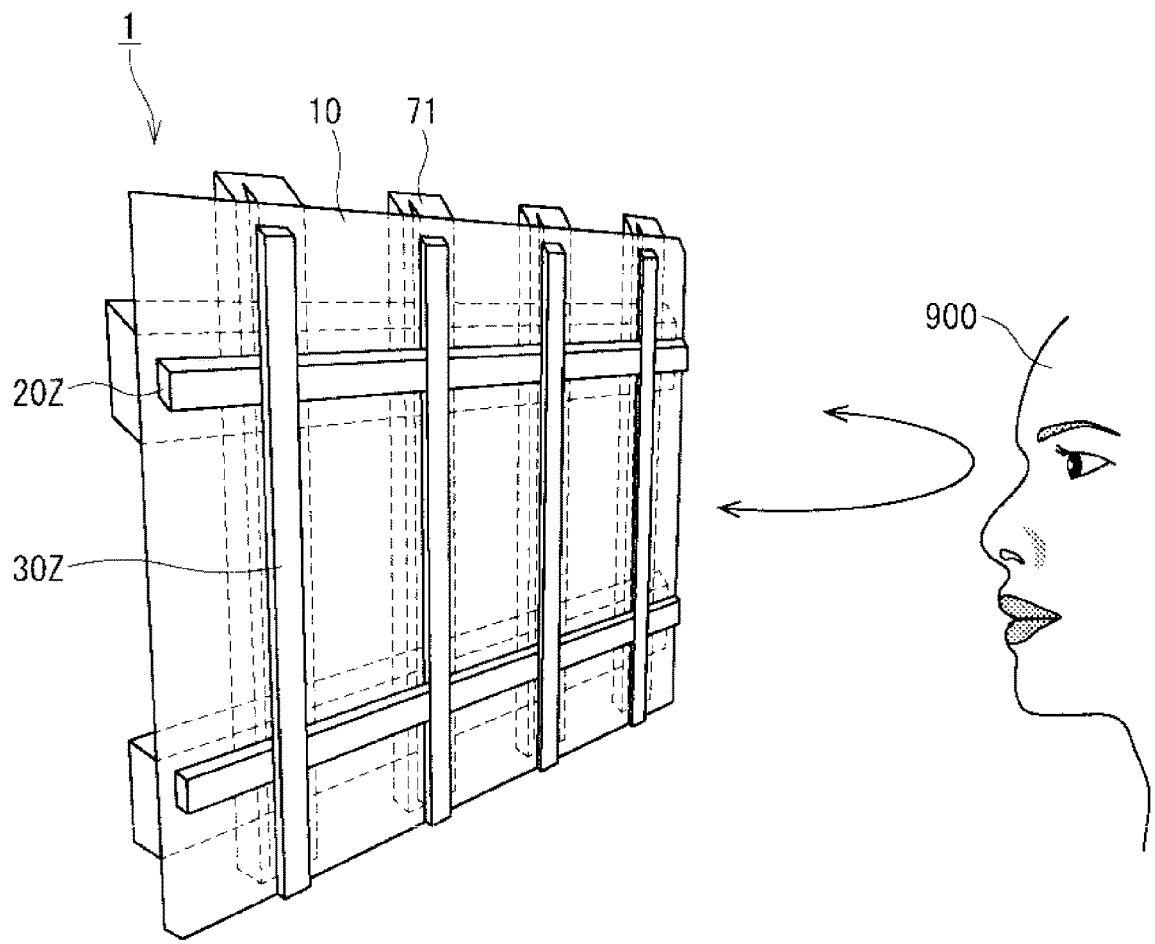
FIG. 17 is a perspective view showing a state of occurrence of image unevenness in the display panel in FIG. 16.

With reference to FIG. 17, the outer sensor electrode 20Z extends in the left-right direction of the observer. The outer sensor electrode 30Z extends in the vertical direction of the observer. When the touch screen unit 1 having such a configuration is provided, the observer 900 may visually recognize large image unevenness due to the difference between the left and right viewing angles (see arrows in the drawing). The reason for this will be described below.

Figure 18:
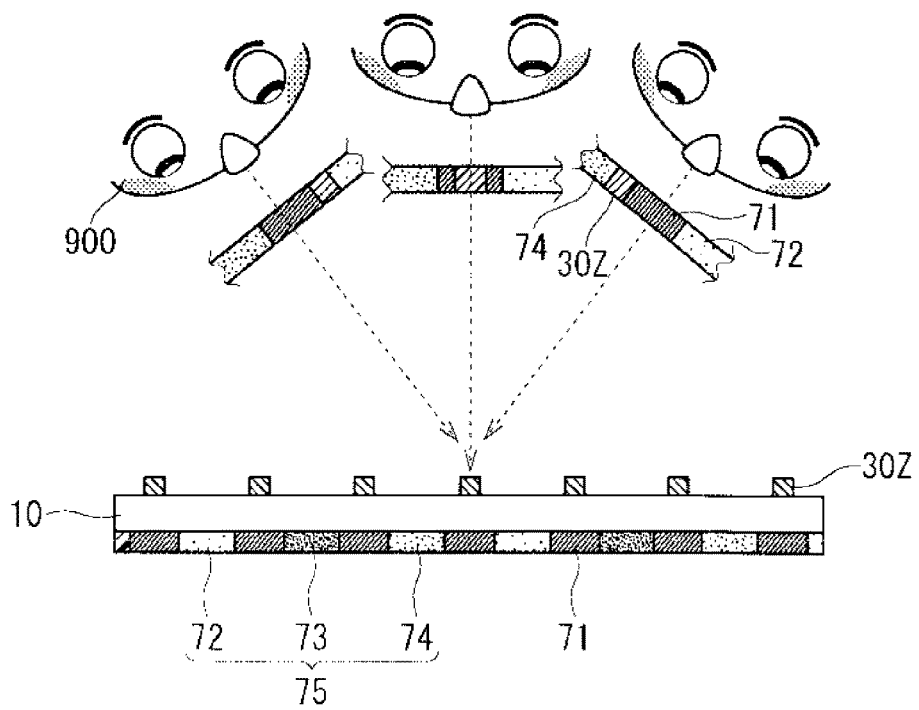
FIG. 18 is a diagram for illustrating the cause of occurrence of image unevenness in the display panel in FIG. 16.
Figure 21:
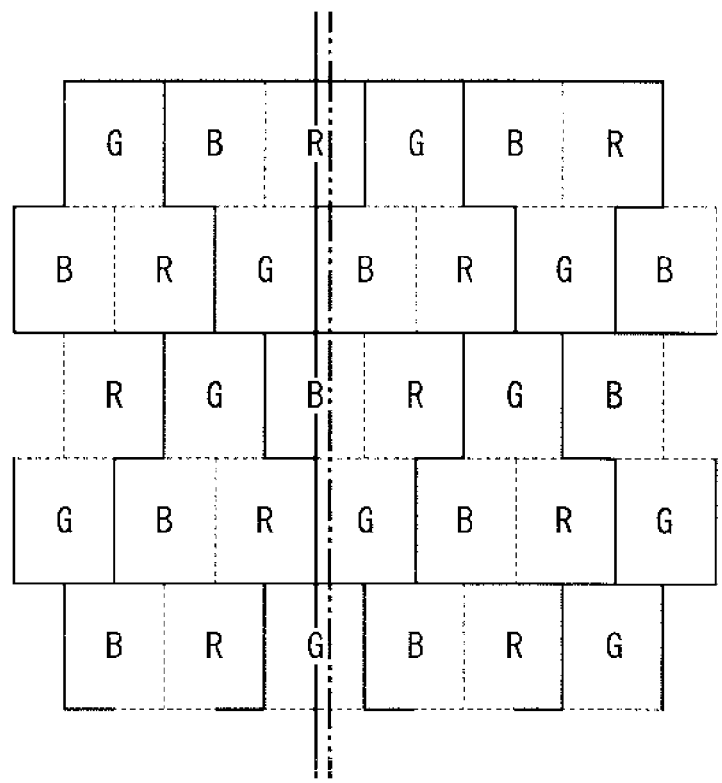
FIG. 21 is a plan view for illustrating the relationship between image unevenness and arrangement of pixel portions in the display panel in FIG. 16.
Figure 22:
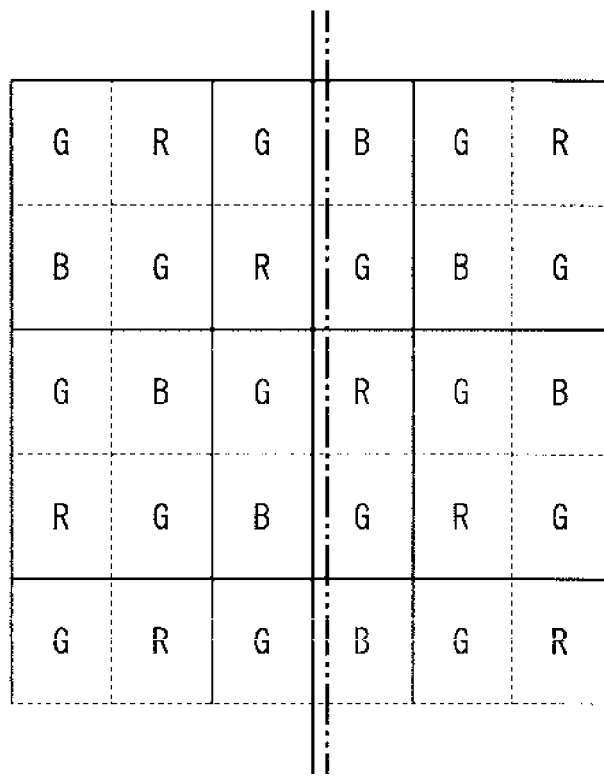
FIG. 22 is a plan view for illustrating the relationship between image unevenness and arrangement of pixel portions in the display panel in FIG. 16.
Figure 25:
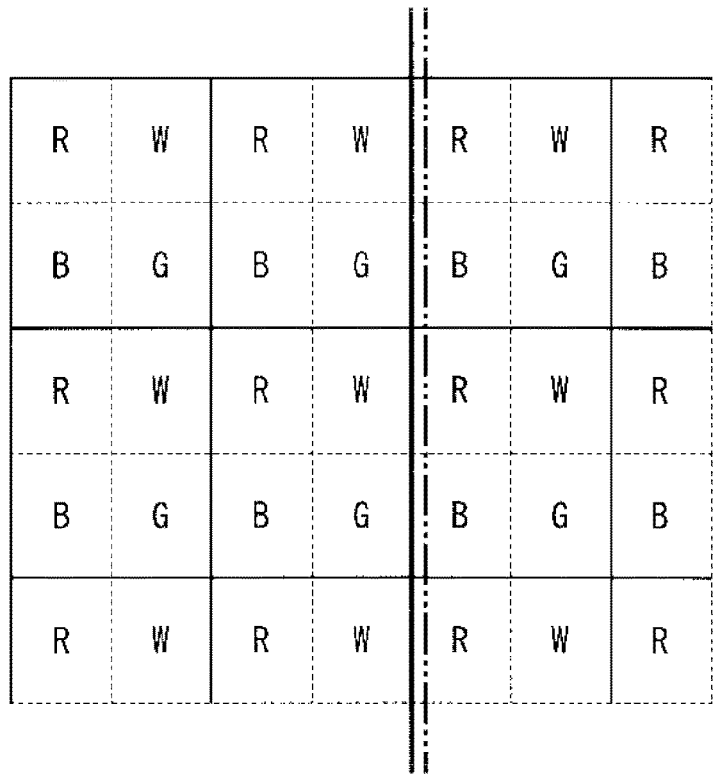
FIG. 25 is a plan view for illustrating the relationship between image unevenness and arrangement of pixel portions in the display panel in FIG. 16.
Figure 26:
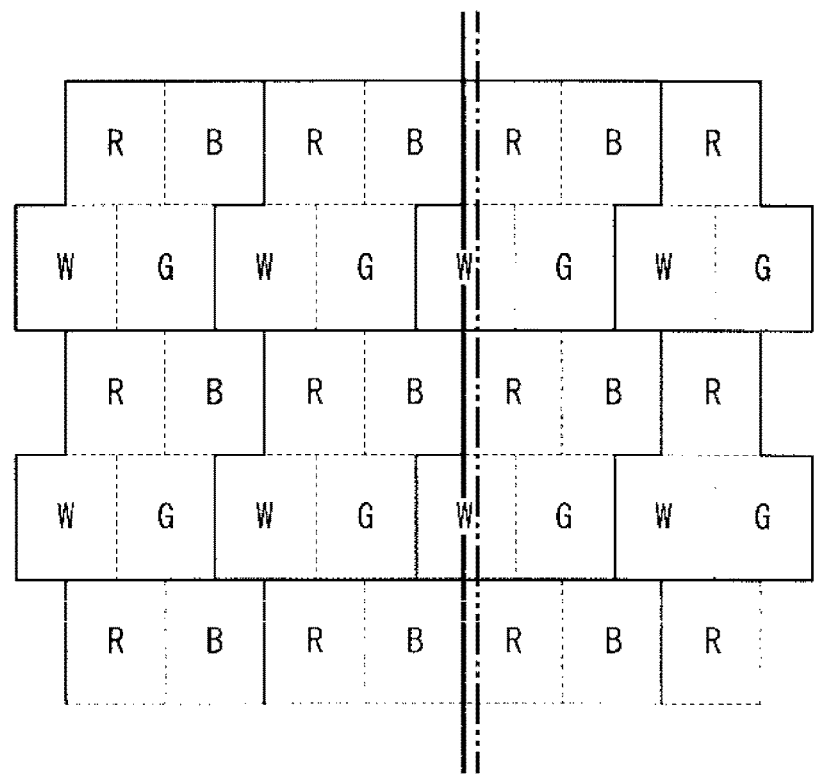
FIG. 26 is a plan view for illustrating the relationship between image unevenness and arrangement of pixel portions in the display panel in FIG. 16.
Figure 27:
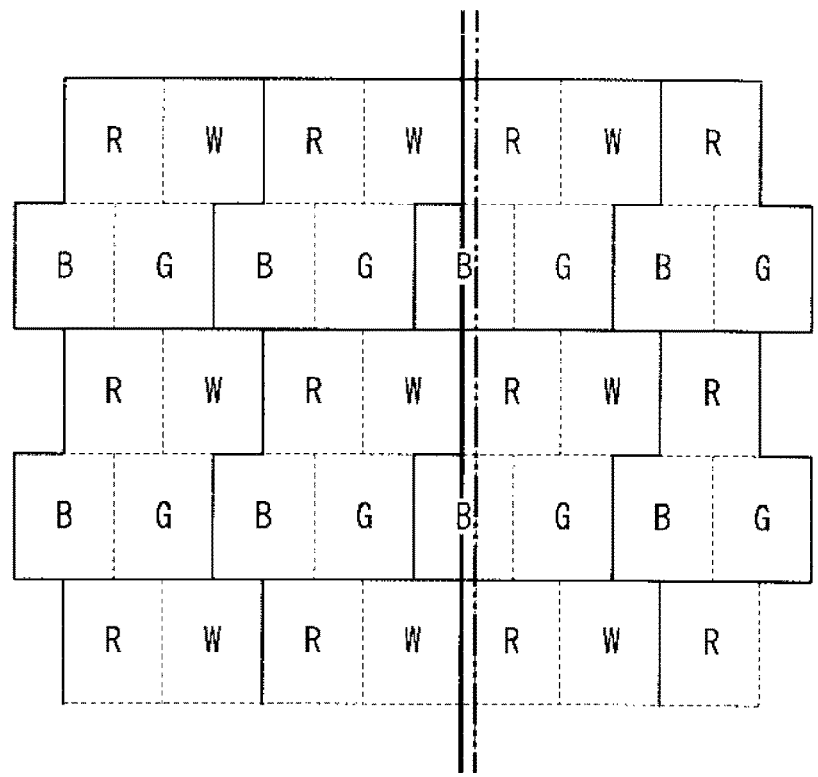
FIG. 27 is a plan view for illustrating the relationship between image unevenness and arrangement of pixel portions in the display panel in FIG. 16.

With reference to FIG. 18, which of the light-shielding portion 71, the color material layer 72, and the color material layer 74 the outer sensor electrode 30Z extending in the vertical direction shields as viewed from the observer 900 depends on the left and right viewing angles of the observer 900. When the color material layer 72 is partially shielded, the luminance of the color displayed by the color material layer 72 (for example, red (R)) decreases. Similarly, when the color material layer 74 is partially shielded, the luminance of the color displayed by the color material layer 74 (for example, blue (B)) decreases. In the unit pixel constituted by the color material layers 72 to 74 (FIG. 6), when the luminance of a specific color decreases, the original color is not expressed. This causes color unevenness. In addition, when the luminance of each color decreases to the same degree in one unit pixel, luminance unevenness occurs due to the difference in degree of luminance reduction between unit pixels. As described above, in the comparative example, image unevenness, specifically, color unevenness or luminance unevenness, is likely to occur remarkably. The relationship between this image unevenness and the arrangement of the color material portion 75 will be described in detail below.

Each of FIGS. 19 to 22 shows a ease where the color material portion includes an RGB array. More specifically, FIGS. 19 to 22 respectively show a stripe array, a mosaic array, a delta array, and a 2G square array. In the stripe array, color material layers having the same color are arranged along the vertical direction. In the mosaic array, all the colors of R, G, and H are repeatedly arranged along the vertical direction. In the delta array, R, G, and B form a triangular lattice. In the 2G square array, one R, two Gs, and one B form a tetragonal lattice. In each drawing, one area surrounded by a solid line corresponds to a unit pixel. In addition, the position of the shade to be given to the color material portion 75 in each of the case where one outer sensor electrode 30Z is viewed from the front and the case where the outer sensor electrode 30Z is viewed from the left is indicated with a solid line and a two-dot chain line.

In the stripe array (FIG. 19), the luminance of a specific color (R (red) in the drawing) changes depending on the viewing angle. For this reason, color unevenness depending on the viewing angle remarkably occurs. In the mosaic array, the delta array, and the 2G square array (FIGS. 20 to 22), the viewing angle exerts similar influence on the luminance of each of R, G, and B considering color mixing between mutually adjacent unit pixels in the vertical direction. Therefore, luminance unevenness is mainly visually recognized by the observer. It should be noted that from a microscopic viewpoint, that is, from the viewpoint of each unit pixel, it can be said that color unevenness depending on the viewing angle occurs.

Each of FIGS. 23 to 27 shows the same contents as the above when the color material portion includes the RGBW array. It should be noted that "W" corresponds to a color material layer having white color. More specifically, FIGS. 23 to 27 respectively show a stripe array, a first square array, a second square array, a first delta array, and a second delta array. In the illustrated square array, only two colors are repeatedly arranged in the vertical direction. In the stripe array, remarkable color unevenness occurs as in the case of the RGB array described above. In the square array and the delta array, in the array shown in the present example, since the influence of the viewing angle at a certain position exerts only on two specific colors, color unevenness occurs. Except in the case of stripe array, when the array is changed, color unevenness can be suppressed by color mixture between mutually adjacent unit pixels, but in that case, luminance unevenness is visually recognized.

As described above, even in any case of the RGB array and RGBW array, when the stripe array is used, remarkable color unevenness is visually recognized in the configuration of the comparative example (FIG. 18). On the other hand, according to the present embodiment, the outer sensor electrode 30 extends so as to be orthogonal to the extending direction of the stripe array, which can avoid the occurrence of color unevenness.

In addition, as described above, even in any case of the RGB array and the RGBW array, in the configuration of the comparative example (FIG. 18), when color unevenness is avoided, luminance unevenness occurs. On the other hand, according to the present embodiment, the outer sensor electrode 30 extends in the left-right direction of the observer, which can avoid luminance unevenness depending on the viewing angle in the left-right direction.

(Summary of Effects)

According to the present embodiment, in addition to the same effects as in the first embodiment, the following effects can be obtained.

According to the present embodiment, the touch sensor is constituted with the inner sensor electrode 20 and the outer sensor electrode 30 (FIG. 15). Since the inner sensor electrode 20 is not arranged on the observation surface (upper surface in FIG. 15) of the first substrate 10, the inner sensor electrode 20 can be arranged in a position relatively close to the color material portion 75. Therefore, image unevenness depending on the viewing angle due to the existence of the inner sensor electrode 20 is small. Furthermore, the outer sensor electrode 30 extends parallel to the left-right direction of the observer. Therefore, the location shaded with the outer sensor electrode as viewed from the observer in the color material portion 75 does not substantially depend on the viewing angle in the left-right direction. From the above, image unevenness depending on the viewing angle in the left-right direction can be suppressed.

The outer sensor electrode 30 extends along the long side direction (X direction in FIG. 2) of the first substrate 10. Therefore, the location shaded with the outer sensor electrode as viewed from the observer in the color material portion 75 does not substantially depend on the viewing angle in the long side direction. From the above, image unevenness depending on the viewing angle in the long side direction can be suppressed. Therefore, in a display device in which the long side direction is the left-right direction, image unevenness depending on the viewing angle in the left-right direction can be suppressed. It should be noted that in a large-sized display device in which the viewing angle problem is particularly likely to occur, typically, the long side direction is the left-right direction.

When the color material portion 75 has a stripe arrangement (FIG. 19), in other words, when the color material layers 72 to 74 are adjacent to each other and have a common color in a direction orthogonal to the left-right direction, if the sensor electrode arranged on the observation surface of the first substrate 10 is along the left-right direction, the sensor electrode causes large color unevenness depending on the viewing angle in the left-right direction. According to the present embodiment, such color unevenness can be suppressed.

Third Embodiment

Typical Example of Switching-Circuit Structure in TFT-Array Substrate

Prior to the description of the present embodiment, a typical example of a switching-circuit structure in a TFT-array substrate applicable to other embodiments including the above-described first and second embodiments will be described below.

Figure 28:
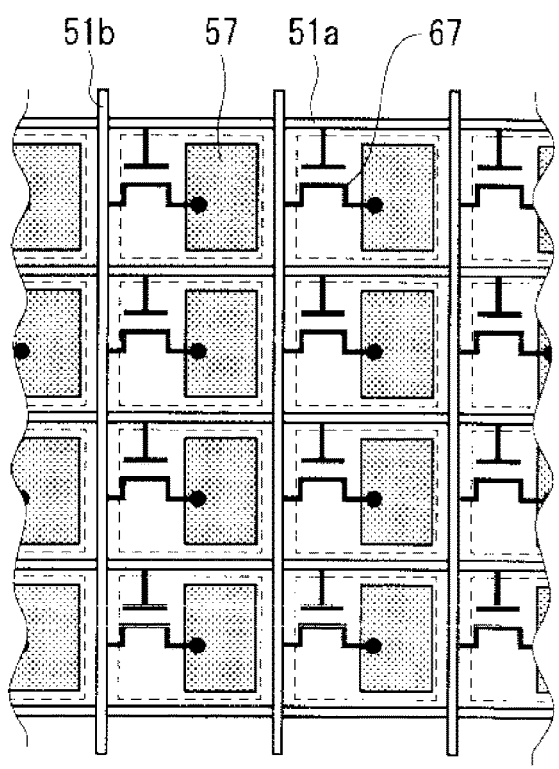
FIG. 28 is a plan view showing a typical example of a switching-circuit structure in a TFT-array substrate.

FIG. 28 is a plan view showing a typical switching-circuit structure (single-gate single-source structure) in the TFT-array substrate 54 (FIG. 7). The TFT-array substrate 54 is provided with a plurality of pixels each having a transistor element 67 (switching element) and a pixel electrode 57. On the second substrate 58, a plurality of gate wiring layers 51a extending in the row direction (left-right direction in the drawing) and a plurality of source wiring layers 51b extending in the column direction (vertical direction in the drawing) are provided. A pixel exists between the adjacent gate wiring layers 51a in the column direction. A pixel always exists between the adjacent source wiring layers 51b in the row direction. In other words, the gate wiring layers 51a arranged at equal intervals and the source wiring layers 51b arranged at equal intervals cross each other, thereby forming pixels arranged in a matrix. Each of the gate wiring layers 51a is connected to a pixel on one side (lower side in the drawing) of the gate wiring layer 51a. One source wiring layer 51b is connected to each pixel along one column.

Configuration of Present Embodiment

Figure 29:
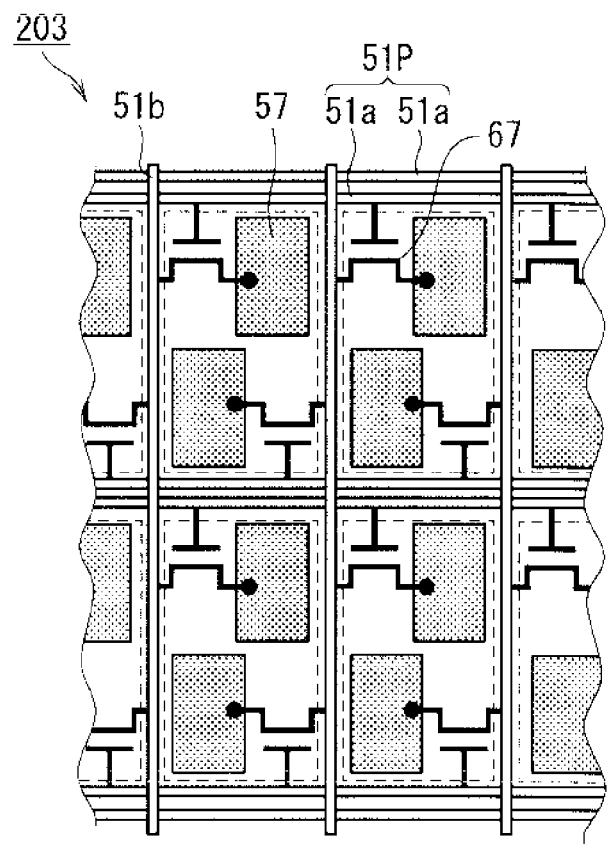
FIG. 29 is a plan view showing an example of a switching-circuit structure in a TFT-array substrate included in a display panel in a third embodiment of the present invention.

FIG. 29 is a plan view showing an example of the switching-circuit structure in the TFT-array substrate 54 (see FIG. 7) included in the display panel 203 in the present embodiment. The display panel 203 includes a plurality of gate wiring pairs 51P arranged on the second substrate 58, each of the gate wiring pairs 51P including two gate wiring layers 51a. Each of the gate wiring pairs 51P passes between adjacent pixels in the vertical direction (direction crossing the left-right direction). In other words, an area where two pixels exist between adjacent gate wiring layers 51a in the column direction and an area where no pixel exists between the adjacent gate wiring layers 51a in the column direction are arranged alternately in the column direction. Of the two gate wiring layers 51a included in a gate wiring pair 51P, the upper gate wiring layer 51a is connected to the upper pixel and the lower gate wiring layer 51a is connected to the lower pixel. One source wiring layer 51b is connected, every other pixel, to two pixels along the column sandwiching the source wiring layer 51b. This circuit structure is also referred to as "dual-gate half-source structure".

In the present embodiment, the light-shielding portion 71 has a portion with a wide width (dimension in the vertical direction) in a position corresponding to the gate wiring pair 51P in a plan view. The outer sensor electrode 30 is arranged in a position corresponding to this wide portion. Thus, increasing the width (dimension in the vertical direction) of the outer sensor electrode 30 while avoiding the occurrence of image unevenness allows the wiring resistance to be lowered. Therefore, the detection time of the touch sensor can be shortened, and the detection sensitivity can be enhanced.

In addition, the aperture ratio of the pixel can be increased with the dual-gate half-source structure. In addition, since the number of signal lines of the TFT-array substrate is reduced, the cost of the IC of the drive circuit can be reduced.

Since the configuration other than the above is substantially the same as the configuration of the first or second embodiment described above, the same or corresponding elements are denoted by the same reference numerals, and the description of the elements will not be repeated. It should be noted that when the present embodiment is combined with the configuration of the second embodiment, the outer sensor electrode 30 can be arranged only in the above-described wide portion. Therefore, the occurrence of image unevenness can be avoided more sufficiently.

Fourth Embodiment

Figure 30:
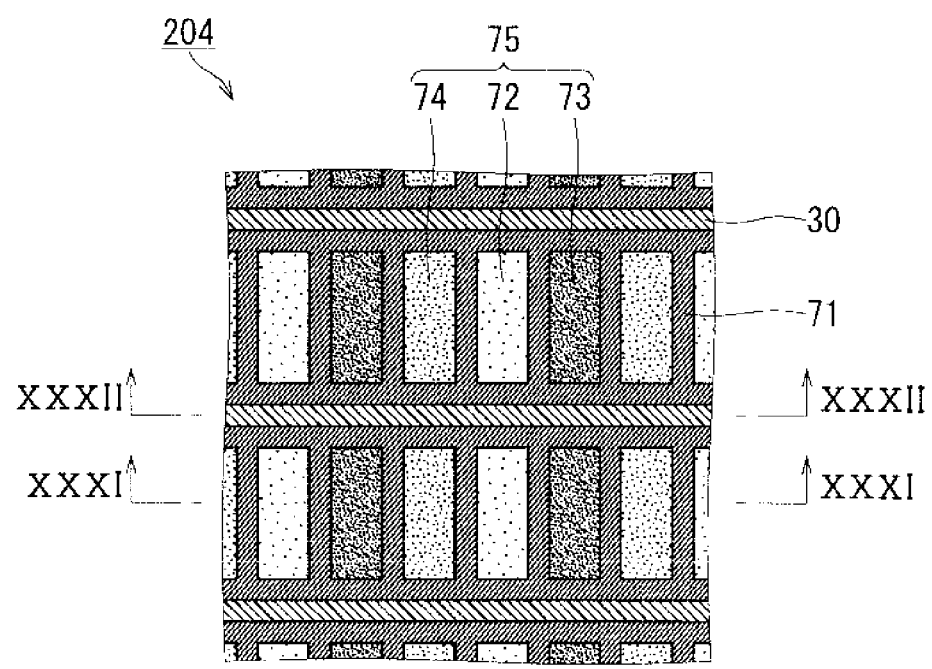
FIG. 30 is a plan view schematically showing the configuration of a color filter substrate included in a display panel in a fourth embodiment of the present invention.
Figure 31:
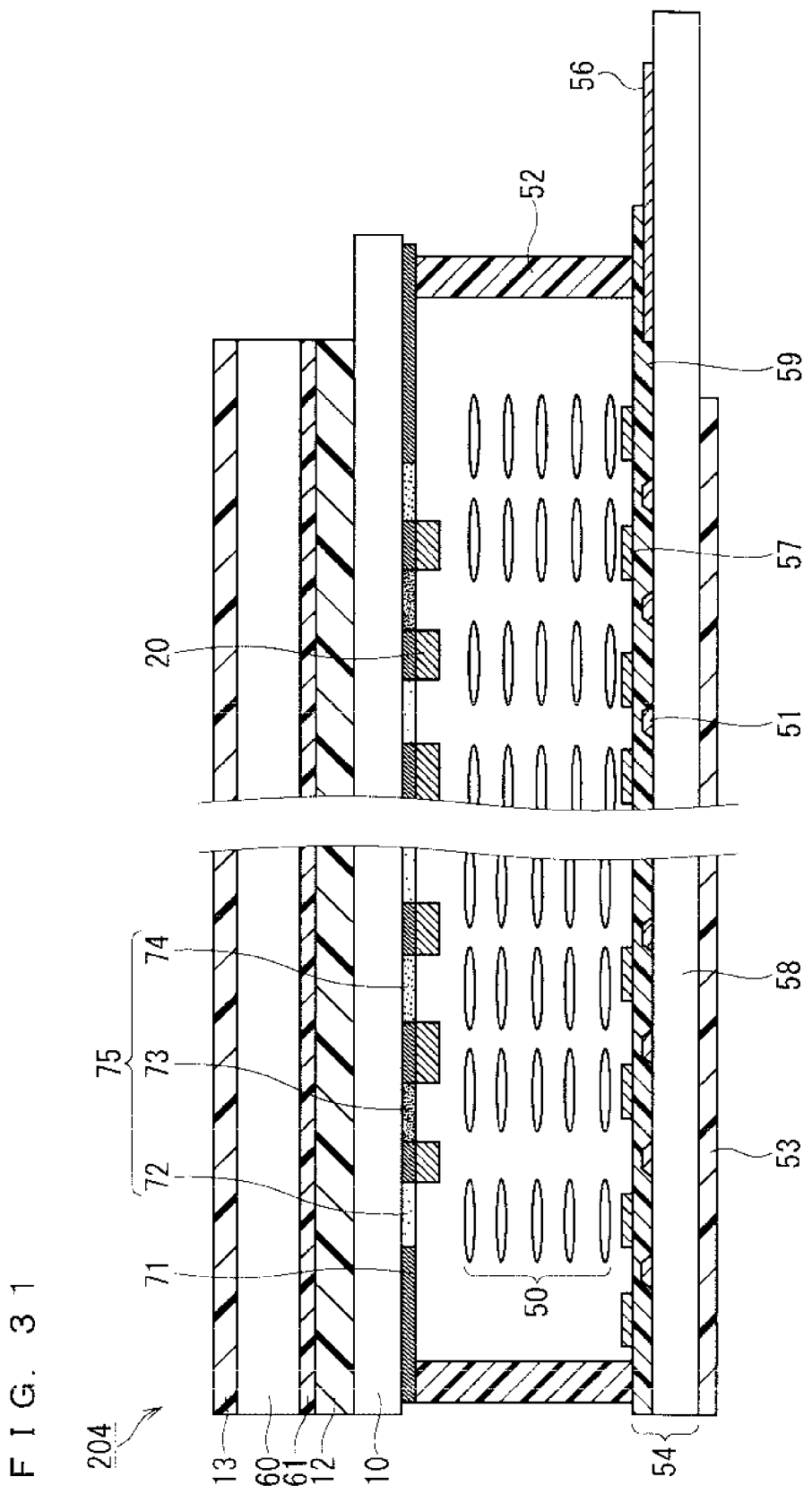
FIG. 31 is a schematic cross-sectional view taken along line XXXI-XXXI in FIG. 30.
Figure 32:
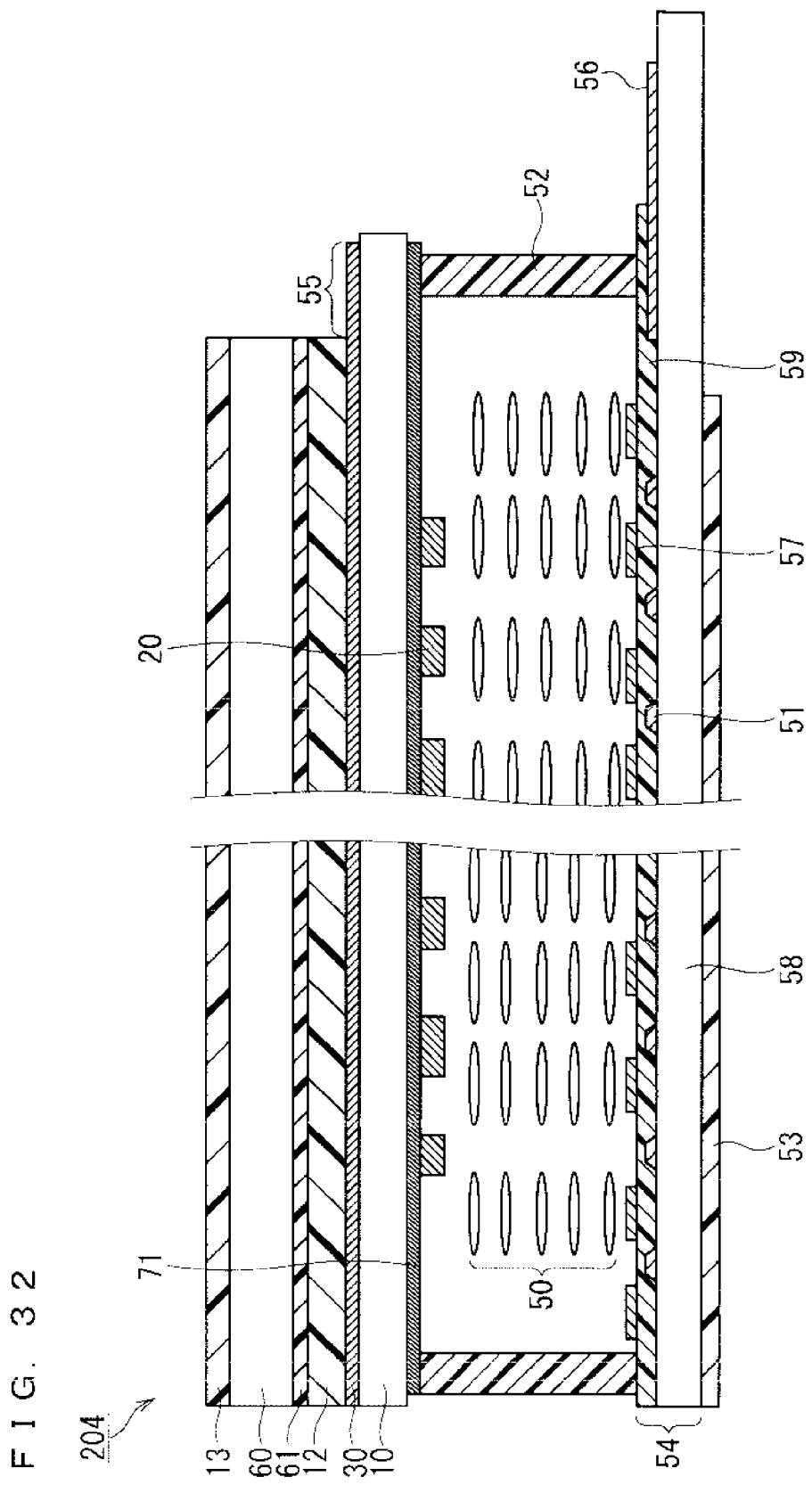
FIG. 32 is a schematic cross-sectional view taken along line XXXII-XXXII in FIG. 30.

FIG. 30 is a plan view schematically showing the configuration of a color filter substrate included in a display panel 204 in the present embodiment. FIGS. 31 and 32 are respectively schematic cross-sectional views taken along lines XXXI-XXXI and XXXII-XXXII in FIG. 30.

As shown in FIG. 31, in the display panel 204, the width of the inner sensor electrode 20 (dimension in the left-right direction) is the same as the width of the light-shielding portion 71. Thus, the width of the inner sensor electrode 20 can be secured to the maximum while image unevenness caused by the inner sensor electrode 20 protruding from the light-shielding portion 71 being suppressed in a plan view. Since the width of the inner sensor electrode 20 is large, its electric resistance can be lowered and noise from the TFT-array substrate 54 to the outer sensor electrode 30 can be effectively shielded. Thus, the detection sensitivity of the touch sensor can be enhanced.

It should be noted that since the configuration other than the above is substantially the same as the configuration of the first to third embodiments described above, the same or corresponding elements are denoted by the same reference numerals, and the description of the elements will not be repeated.

Fifth Embodiment

Figure 33:
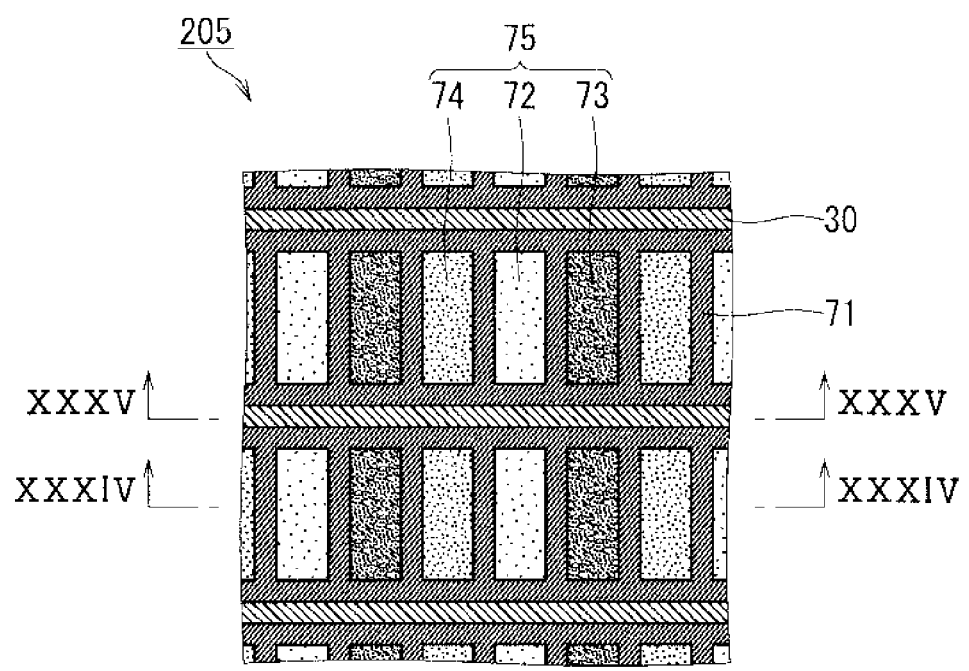
FIG. 33 is a plan view schematically showing the configuration of a color filter substrate included in a display panel in a fifth embodiment of the present invention.
Figure 34:
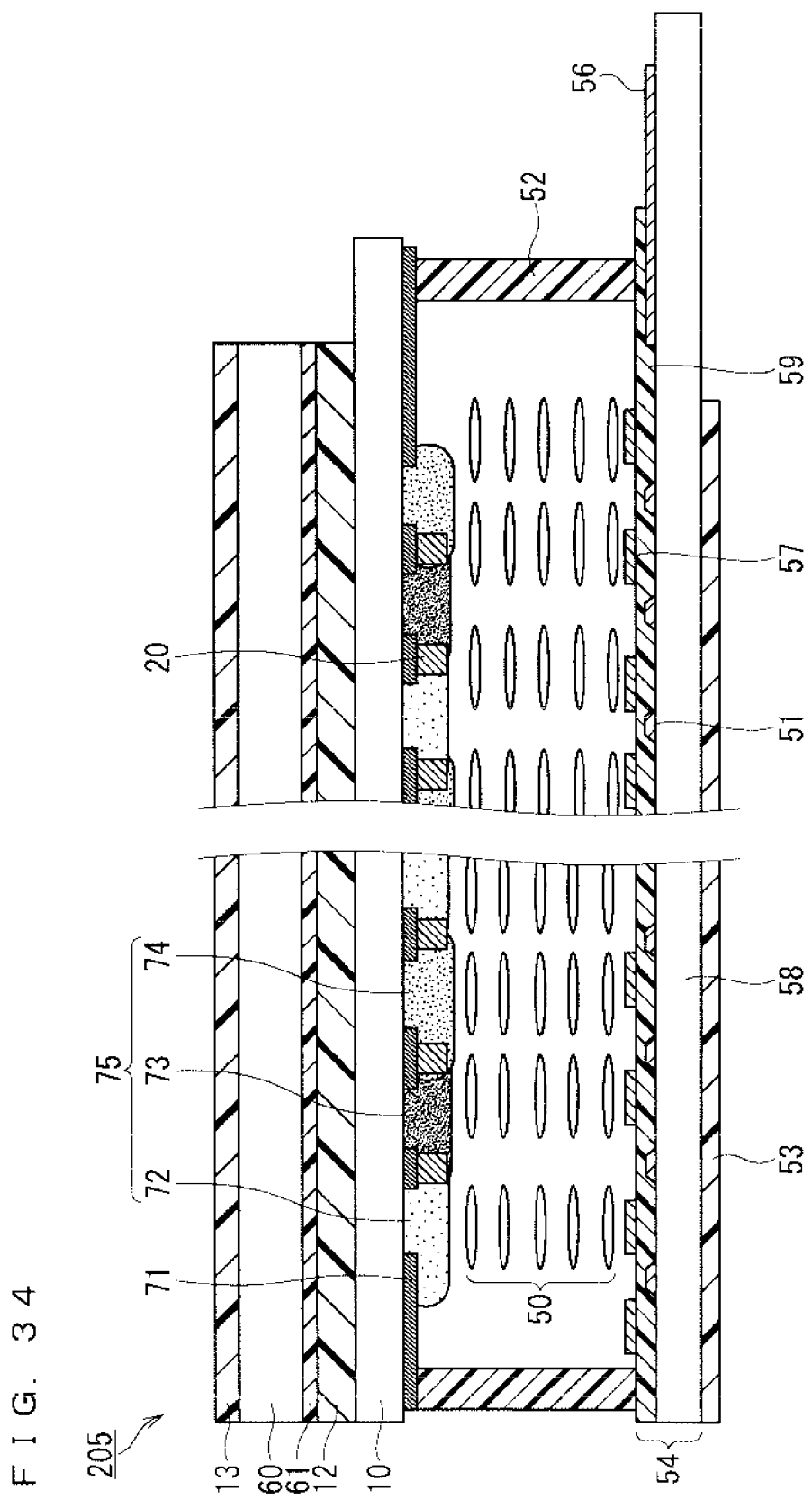
FIG. 34 is a schematic cross-sectional view taken along line XXXIV-XXXIV in FIG. 33.
Figure 35:
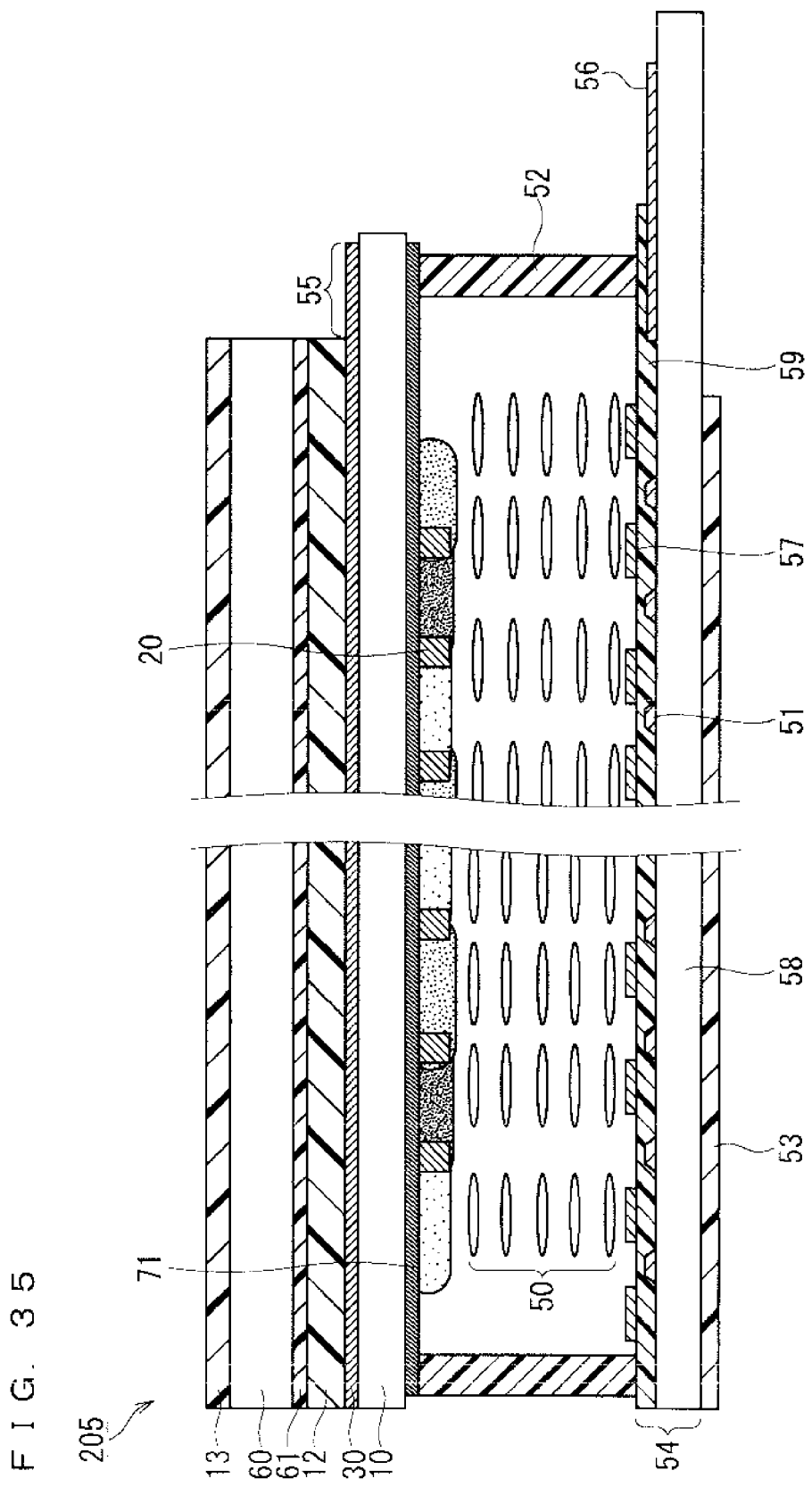
FIG. 35 is a schematic cross-sectional view taken along line XXXV-XXXV in FIG. 33.

FIG. 33 is a plan view schematically showing the configuration of a color filter substrate included in a display panel 205 in the present embodiment. FIGS. 34 and 35 are respectively schematic cross-sectional views taken along lines XXXIV-XXXIV and XXXV-XXXV in FIG. 33.

In the display panel 205 in the present embodiment, the color material portion 75 at least partially covers the inner sensor electrodes 20 arranged on the inner surface (lower surface in FIGS. 34 and 35) of the first substrate 10. Preferably, the color material portion 75 covers the side surface (the left surface and the right surface in FIGS. 34 and 35) of the inner sensor electrode 20. More preferably, the color material portion 75 further covers the surface of the inner sensor electrode 20 facing the second substrate 58 (the lower surface in FIGS. 34 and 35). Still more preferably, the inner sensor electrode 20 is completely surrounded by the light-shielding portion 71 and the color material portion 75 in a cross-sectional view (view in FIGS. 34 and 35).

In order to obtain the configuration as described above, as shown in FIGS. 34 and 35, it is preferable that adjacent color material layers of the color material layers 72 to 74 overlap each other at their boundaries. In addition, it is preferable that the inner sensor electrode 20 is included in the light-shielding portion 71 in a plan view.

According to the present embodiment, the color material portion 75 at least partially covers the inner sensor electrodes 20. Thus, reflected light from the inner sensor electrode 20 can be suppressed. Therefore, image unevenness caused by the existence of the inner sensor electrode 20 can be further suppressed.

It should be noted that since the configuration other than the above is substantially the same as the configuration of any one of the first to fourth embodiments described above, the same or corresponding elements are denoted by the same reference numerals, and the description of the elements will not be repeated.

Sixth Embodiment

Figure 36:
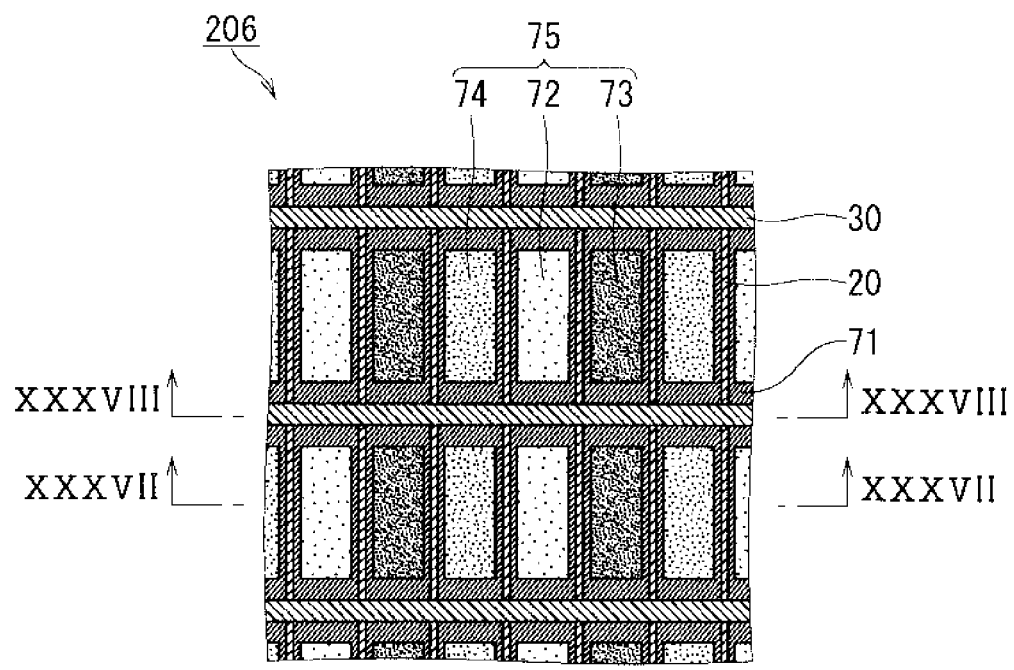
FIG. 36 is a plan view schematically showing the configuration of a color filter substrate included in a display panel in a sixth embodiment of the present invention.
Figure 37:
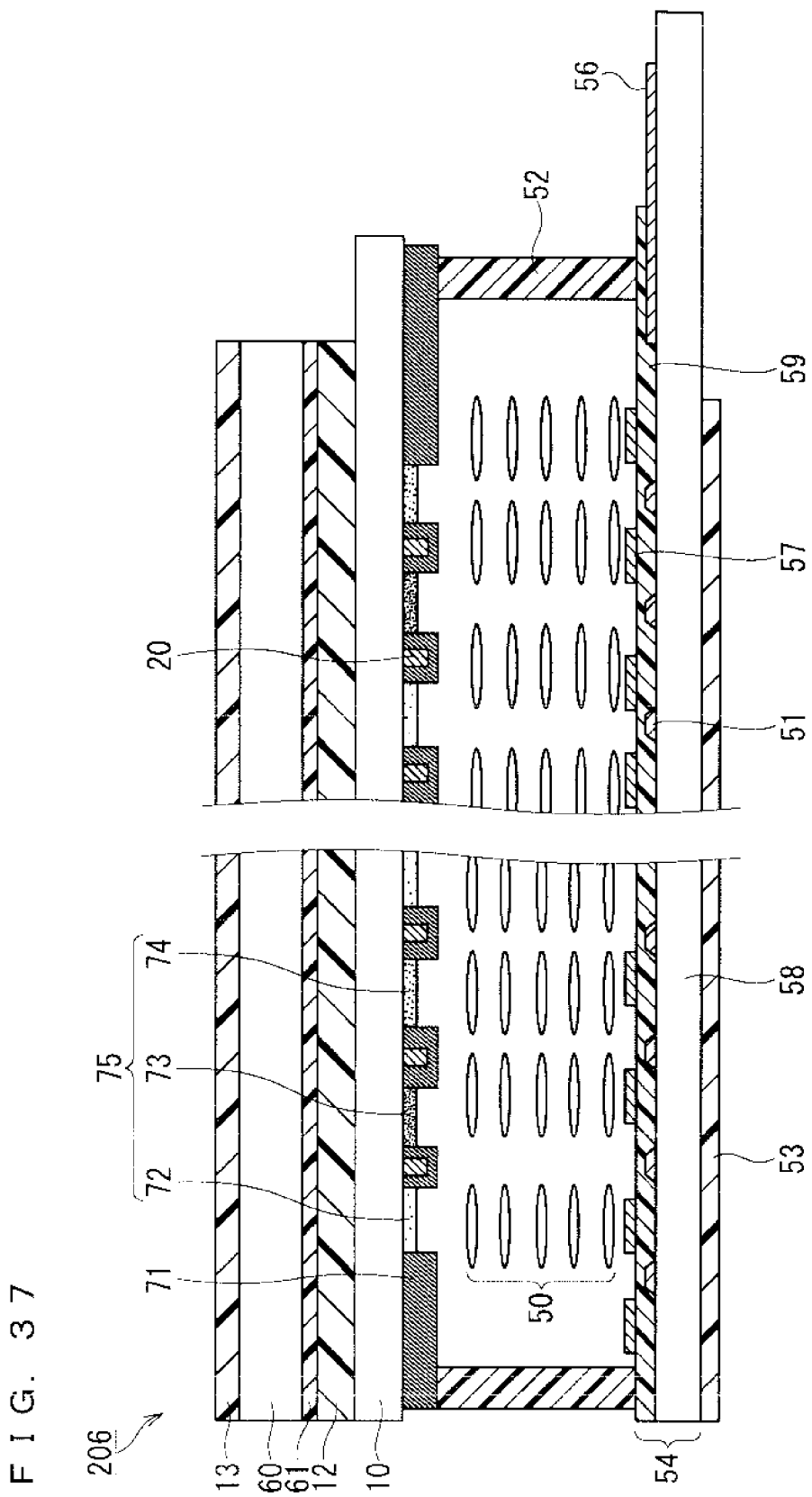
FIG. 37 is a schematic cross-sectional view taken along line XXXVII-XXXVII in FIG. 36.
Figure 38:
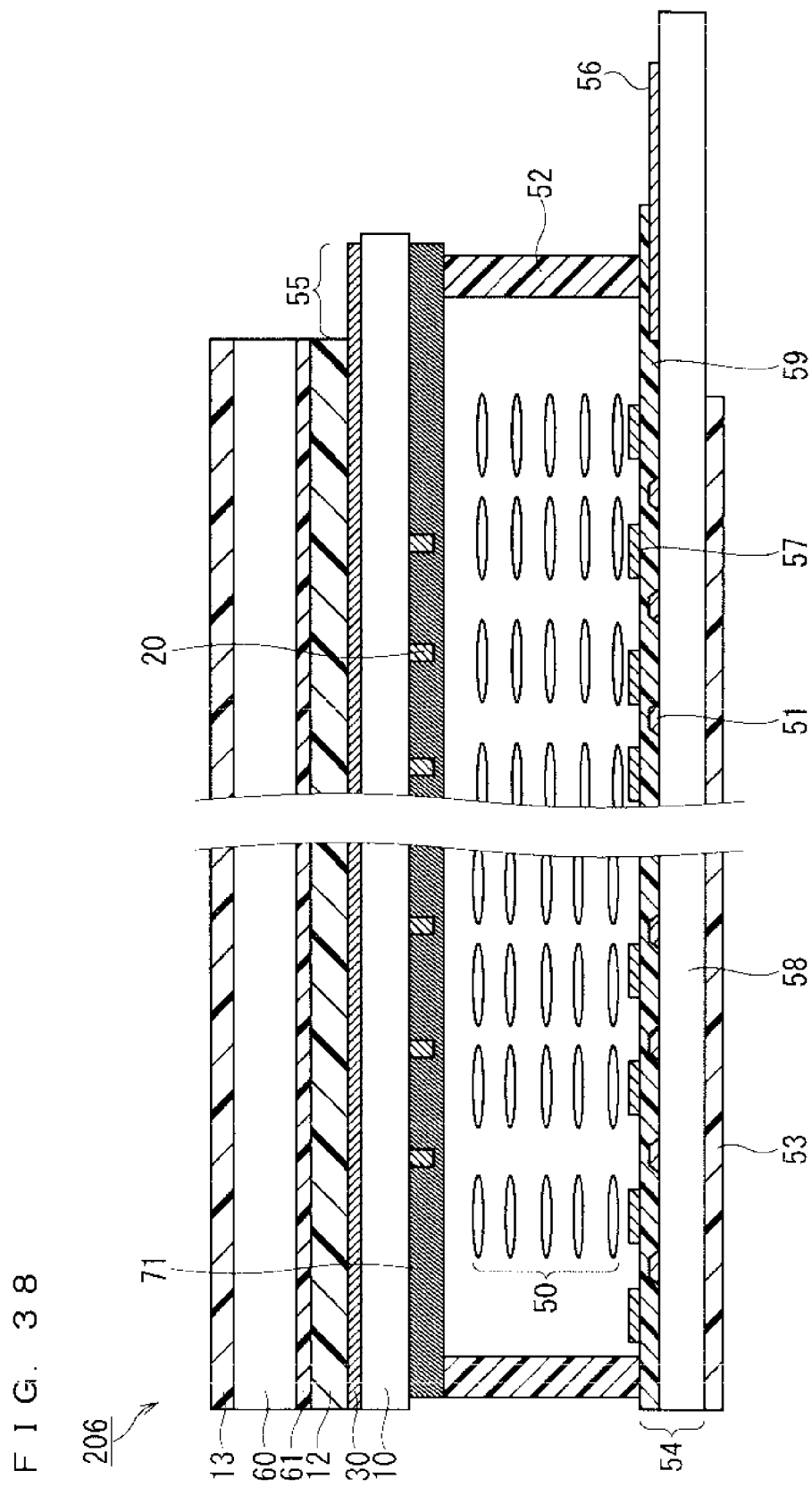
FIG. 38 is a schematic cross-sectional view taken along line XXXVIII-XXXVIII in FIG. 36.

FIG. 36 is a plan view schematically showing the configuration of a color filter substrate included in a display panel 206 in the present embodiment. FIGS. 37 and 38 are respectively schematic cross-sectional views taken along lines XXXVII-XXXVII and XXXVIII-XXXVIII in FIG. 36.

In the display panel 206 in the present embodiment, the inner sensor electrode 20 is provided on the inner surface (lower surface in FIGS. 37 and 38) of the first substrate 10 without the interposition of the light-shielding portion 71. The light-shielding portion 71 at least partially covers the inner sensor electrodes 20 arranged on the inner surface of the first substrate 10. Preferably, the light-shielding portion 71 covers the side surface (the left surface and the right surface in FIGS. 37 and 38) of the inner sensor electrode 20 arranged on the inner surface of the first substrate 10. More preferably, the light-shielding portion 71 further covers the facing surface (lower surface in FIGS. 37 and 38) of the inner sensor electrode 20.

The light-shielding portion 71 at least partially covers the inner sensor electrodes 20. Thus, reflected light from the inner sensor electrode 20 can be suppressed. Therefore, deterioration of visibility due to the existence of the inner sensor electrode 20 can be suppressed. In particular, preventing color mixing due to reflection from the inner sensor electrode 20 allows clearer image quality to be obtained.

It should be noted that since the configuration other than the above is substantially the same as the configuration of the first to fourth embodiments described above, the same or corresponding elements are denoted by the same reference numerals, and the description of the elements will not be repeated.

Seventh Embodiment

Figure 39:
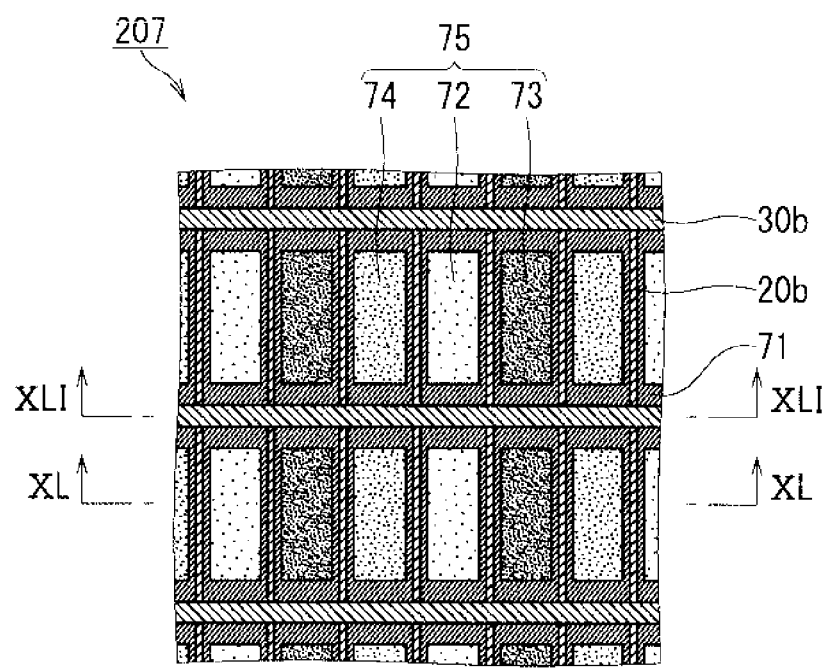
FIG. 39 is a plan view schematically showing the configuration of a color filter substrate included in a display panel in a seventh embodiment of the present invention.
Figure 40:
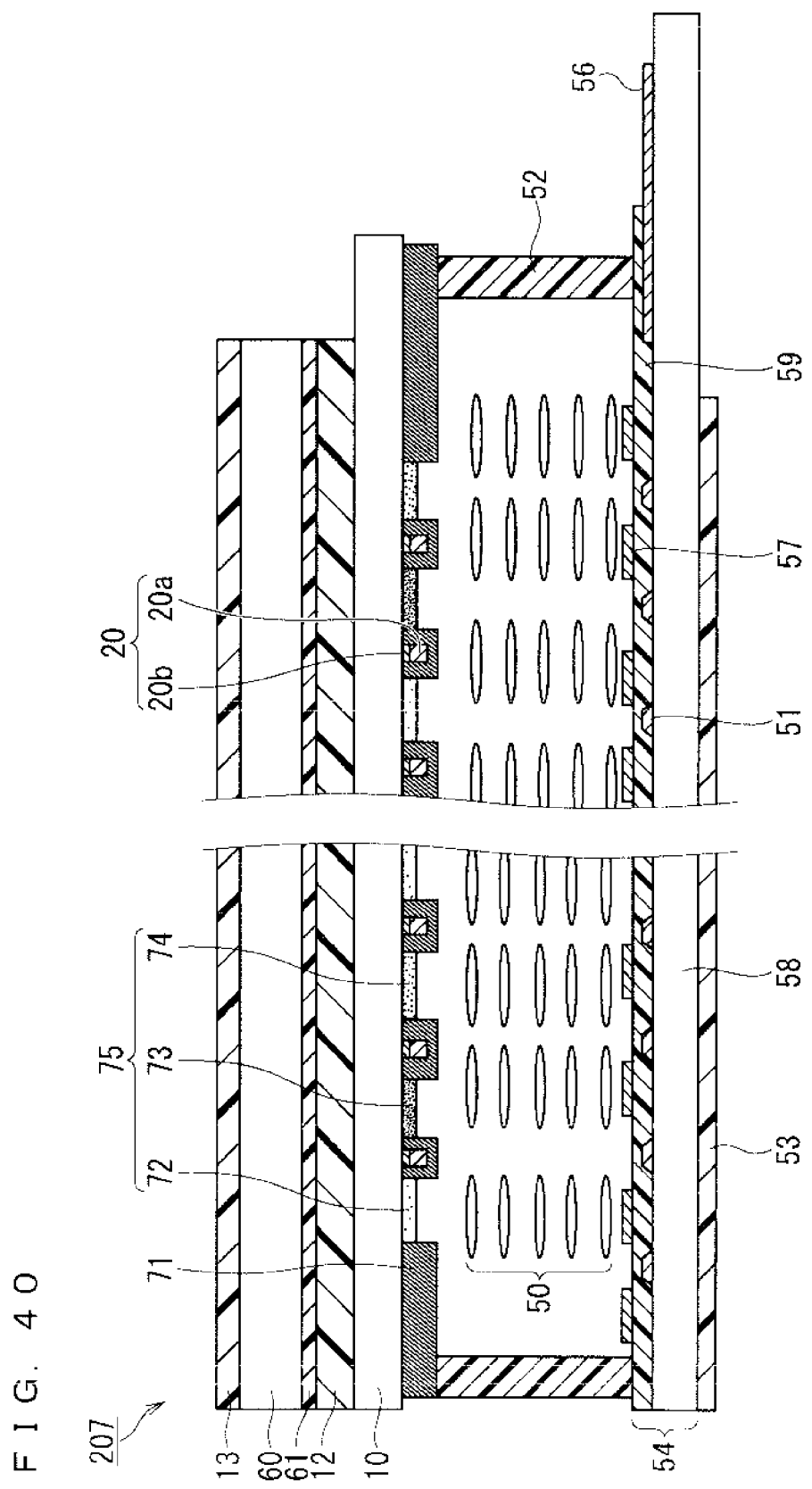
FIG. 40 is a schematic cross-sectional view taken along line XL-XL in FIG. 39.
Figure 41:
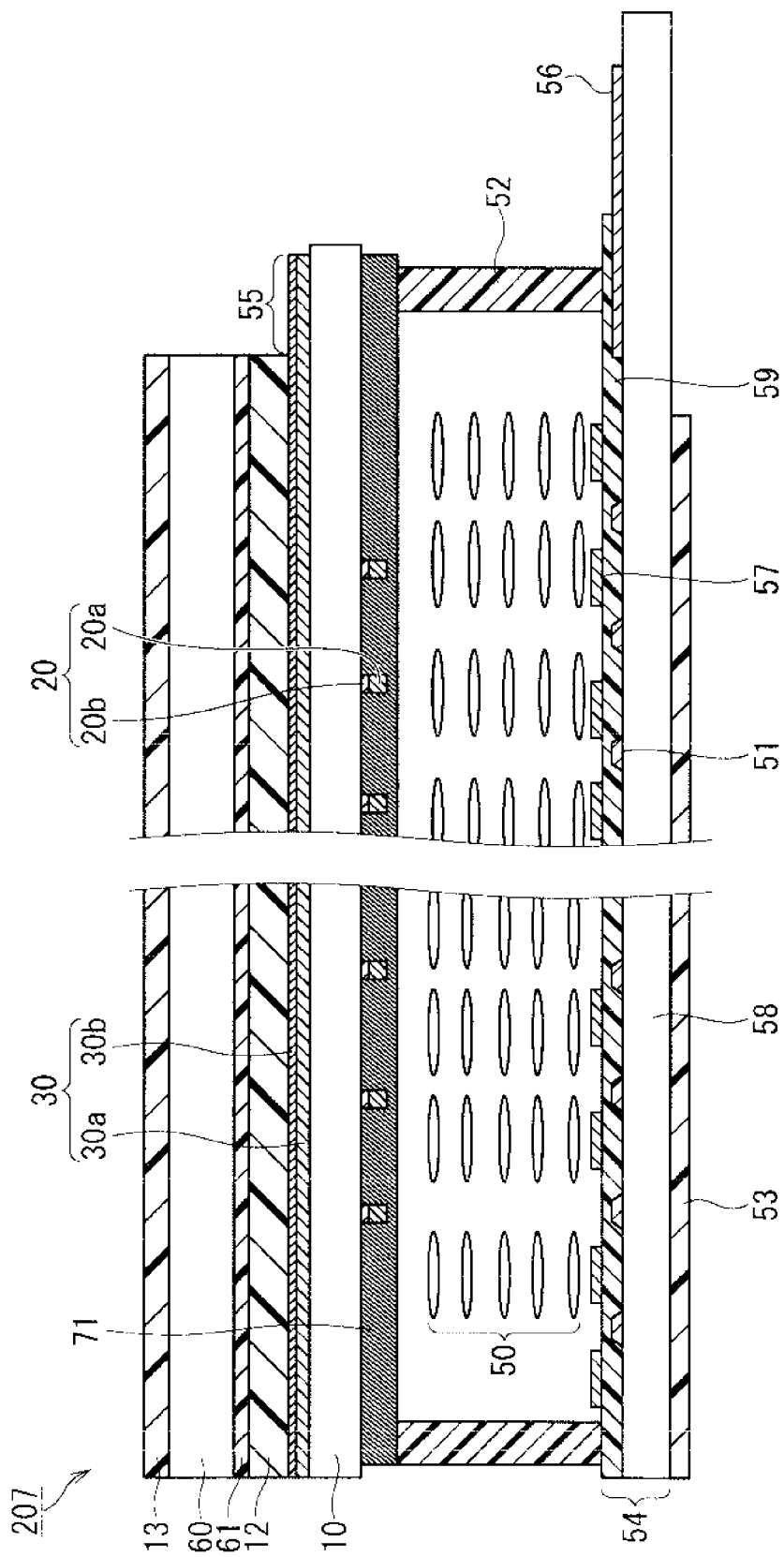
FIG. 41 is a schematic cross-sectional view taken along line XLI-XLI in FIG. 39.

FIG. 39 is a plan view schematically showing the configuration of a color filter substrate included in a display panel 207 in the present embodiment. FIGS. 40 and 41 are respectively schematic cross-sectional views taken along lines XL-XL and XLI-XLI in FIG. 39.

In the display panel 207 in the present embodiment, the inner sensor electrode 20 has a substrate-facing surface that faces the first substrate 10. The substrate-facing surface is covered with an antireflection film 20b (low reflection layer). Of the inner sensor electrode 20, the portion shielded from the first substrate 10 by being covered with the antireflection film 20b is the wiring film 20a. The outer sensor electrode 30 includes an observer-facing surface (a surface opposite to the surface facing the first substrate 10 in FIG. 41) facing the observer. The observer-facing surface is covered with an antireflection film 30b (low reflection layer). Of the outer sensor electrode 30, the portion shielded from the observer by being covered with the antireflection film 30b is the wiring film 30a. The antireflection film 20h may suppress the reflection of light by being made of a material harder to reflect light than the wiring film 20a. Alternatively, the antireflection film 20b may be made of a material having a refractive index different from the refractive index of the wiring film 20a, and the intensity of reflected light may be suppressed by interference of reflected light. The same applies to the antireflection film 30b.

The material of the wiring film 20a can be made of the same material as the material of the outer sensor electrode 30 described in the first embodiment. In addition, the antireflection film 20b may be made of a nitride of the material. For example, the wiring film 20a is made of aluminum-based alloy, and the antireflection film 20b is made of aluminum nitride. Alternatively, a transparent conductive oxide such as ITO may be used as the material of the antireflection film 20b, and in this case, the wiring film 20a may use a laminated structure of a metal and its nitride (for example, a laminated structure of aluminum-based alloy and its nitride).

According to the present embodiment, the substrate-facing surface of the inner sensor electrode 20 is covered with the antireflection film 20b. Thus, reflected light from the inner sensor electrode 20 can be suppressed. Therefore, deterioration of visibility due to the existence of the inner sensor electrode 20 can be suppressed.

The observer-facing surface of the outer sensor electrode 30 is covered with the antireflection film 30b. Thus, the outer sensor electrode 30 is prevented from being visually recognized with the reflection of external light by the observer. Therefore, deterioration of visibility due to the existence of the outer sensor electrode 30 can be suppressed.

It should be noted that since the configuration other than the above is substantially the same as the configuration of any one of the first to sixth embodiments described above, the same or corresponding elements are denoted by the same reference numerals, and the description of the elements will not be repeated.

Eighth Embodiment

Figure 42:
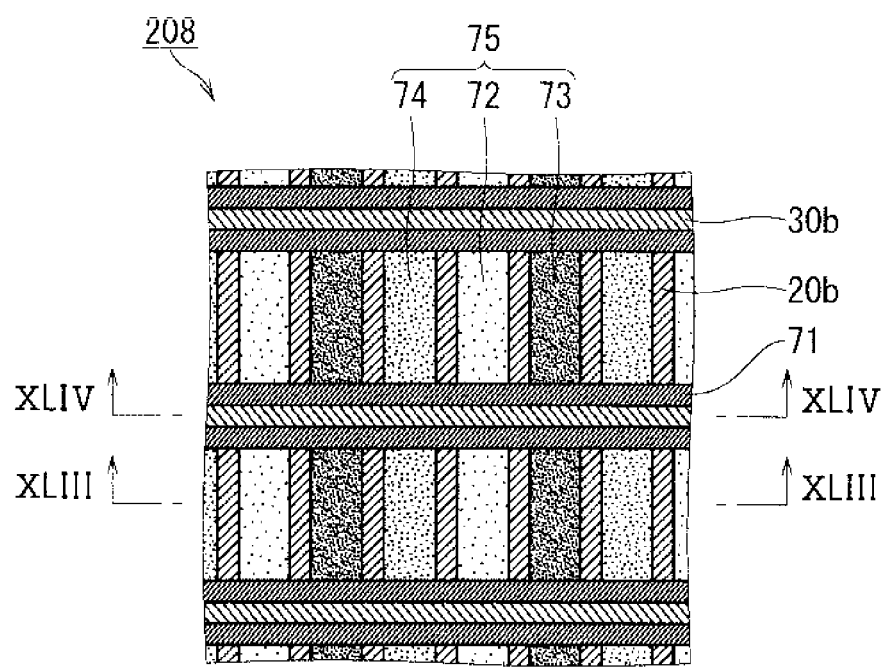
FIG. 42 is a plan view schematically showing the configuration of a color filter substrate included in a display panel in an eighth embodiment of the present invention.
Figure 43:
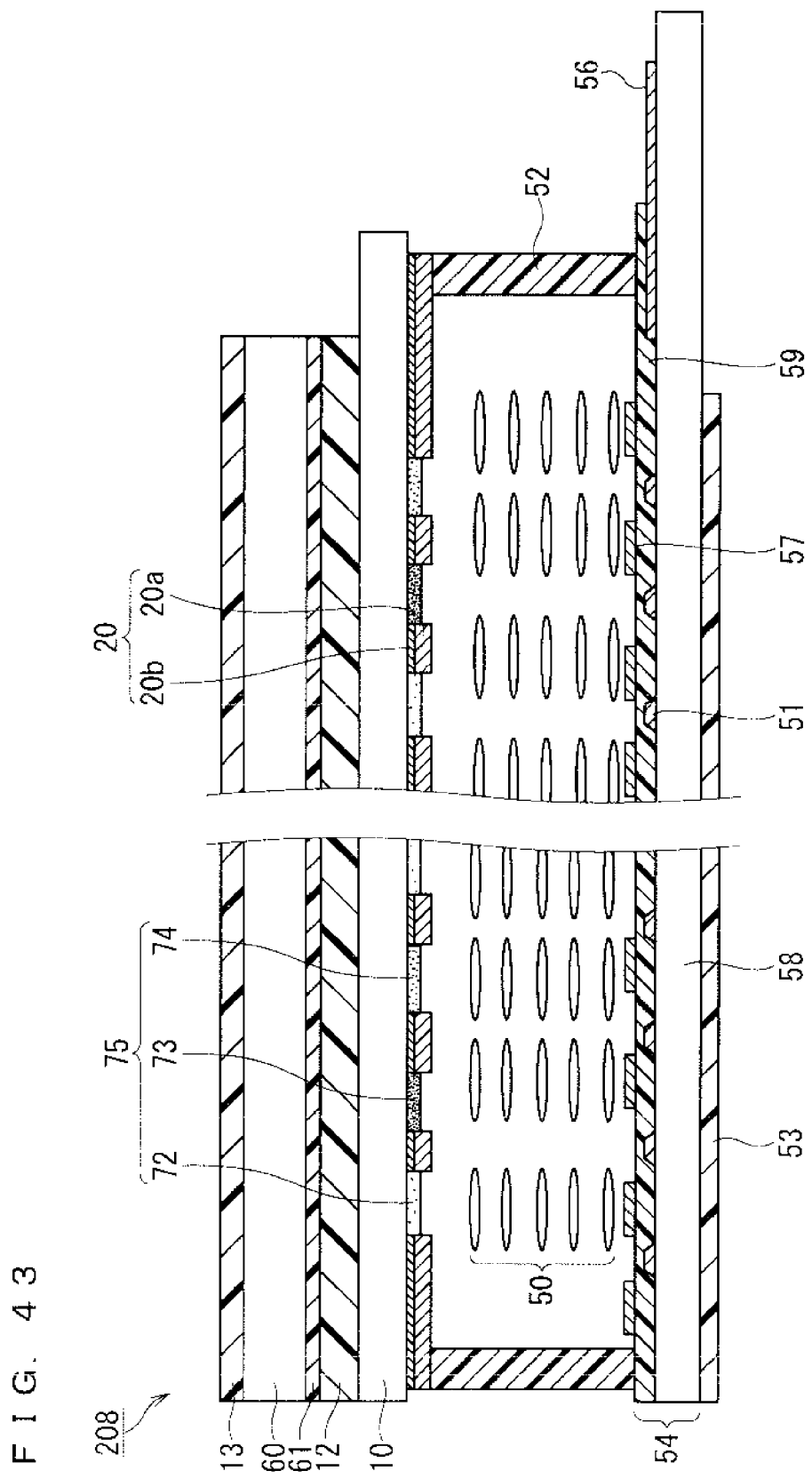
FIG. 43 is a schematic cross-sectional view taken along line XLIII-XLIII in FIG. 42.
Figure 44:
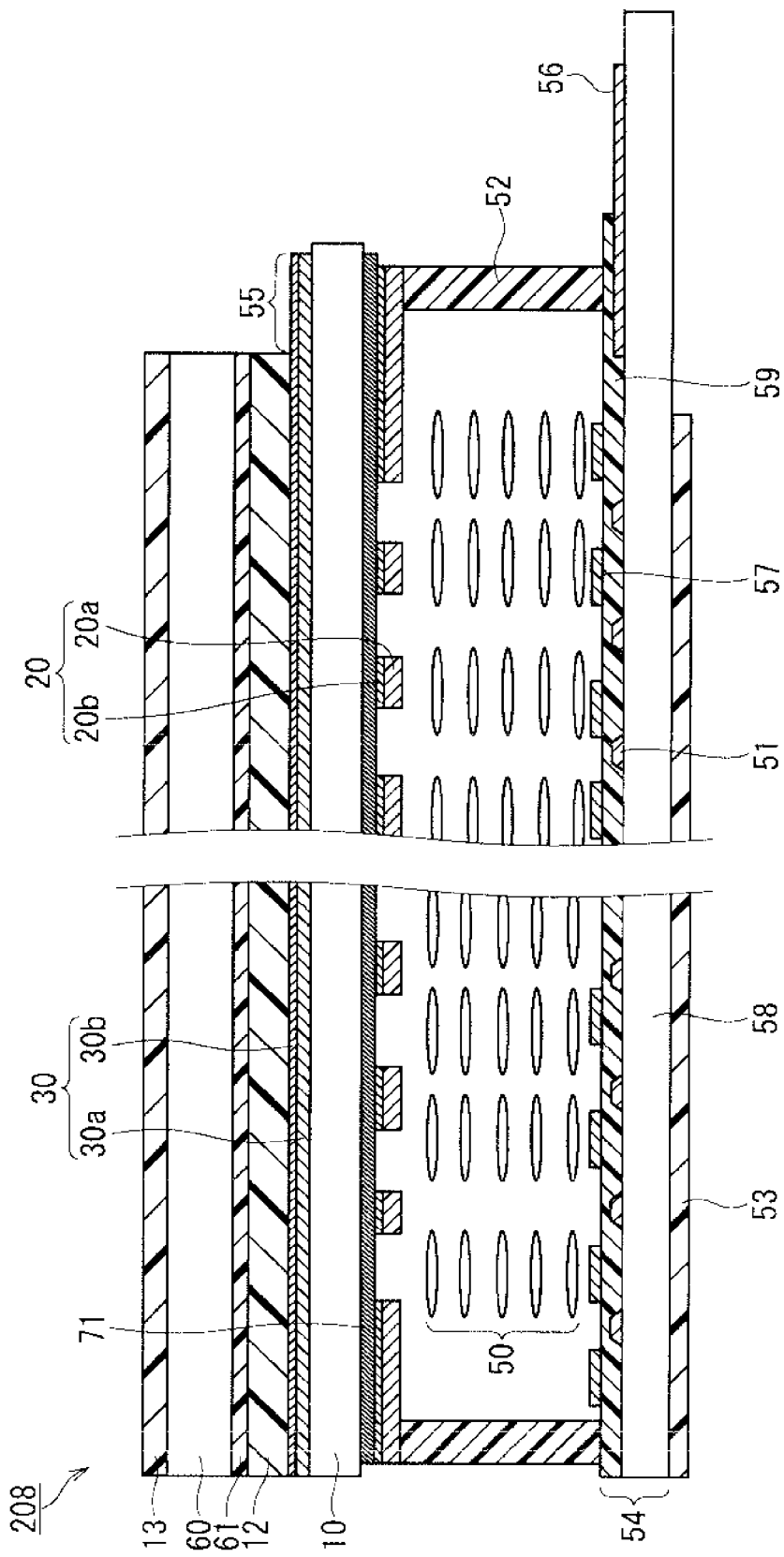
FIG. 44 is a schematic cross-sectional view taken along line XLIV-XLIV in FIG. 42.

FIG. 42 is a plan view schematically showing the configuration of a color filter substrate included in a display panel 208 in the present embodiment. FIGS. 43 and 44 are respectively schematic cross-sectional views taken along lines XLIII-XLIII and XLIV-XLIV in FIG. 42.

In the display panel 208 in the present embodiment, the inner sensor electrode 20 and the color material portion 75 are arranged on the same plane. The color material layers 72 to 74 adjacent to each other in one direction (left-right direction) are separated with the inner sensor electrode 20.

According to the present embodiment, the color material layers 72 to 74 adjacent to each other in one direction are separated with the inner sensor electrode 20. Thus, the light-shielding portion 71 does not have to include a portion for separating the color material layers 72 to 74 adjacent to each other in this direction. Therefore, the configuration of the light-shielding portion 71 can be simplified.

It should be noted that since the configuration other than the above is substantially the same as the configuration of the second, third, fifth, or seventh embodiment described above, the same or corresponding elements are denoted by the same reference numerals, and the description of the elements will not be repeated.

Ninth Embodiment

Figure 45:
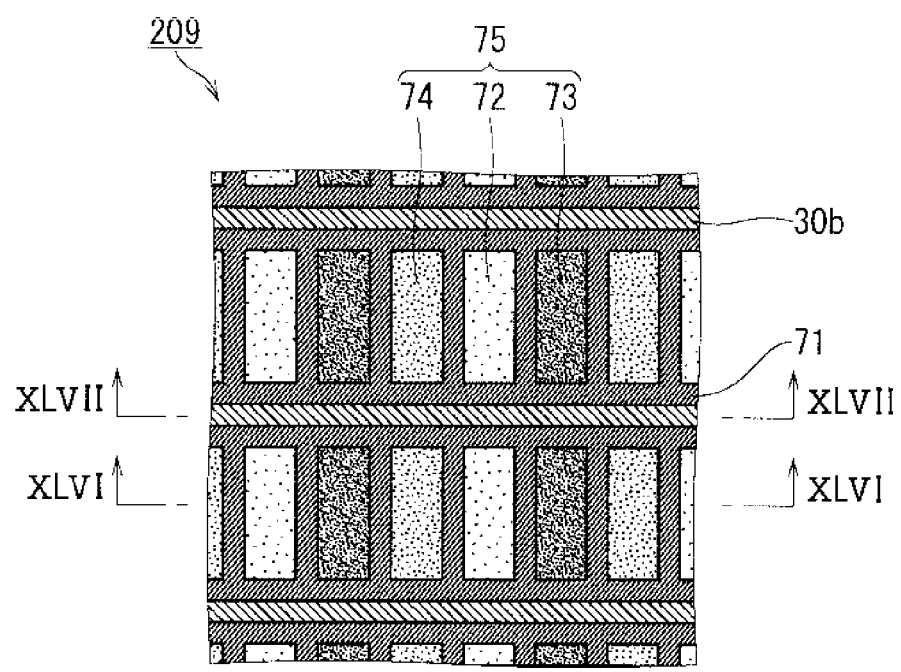
FIG. 45 is a plan view schematically showing the configuration of a color filter substrate included in a display panel in a ninth embodiment of the present invention.
Figure 46:
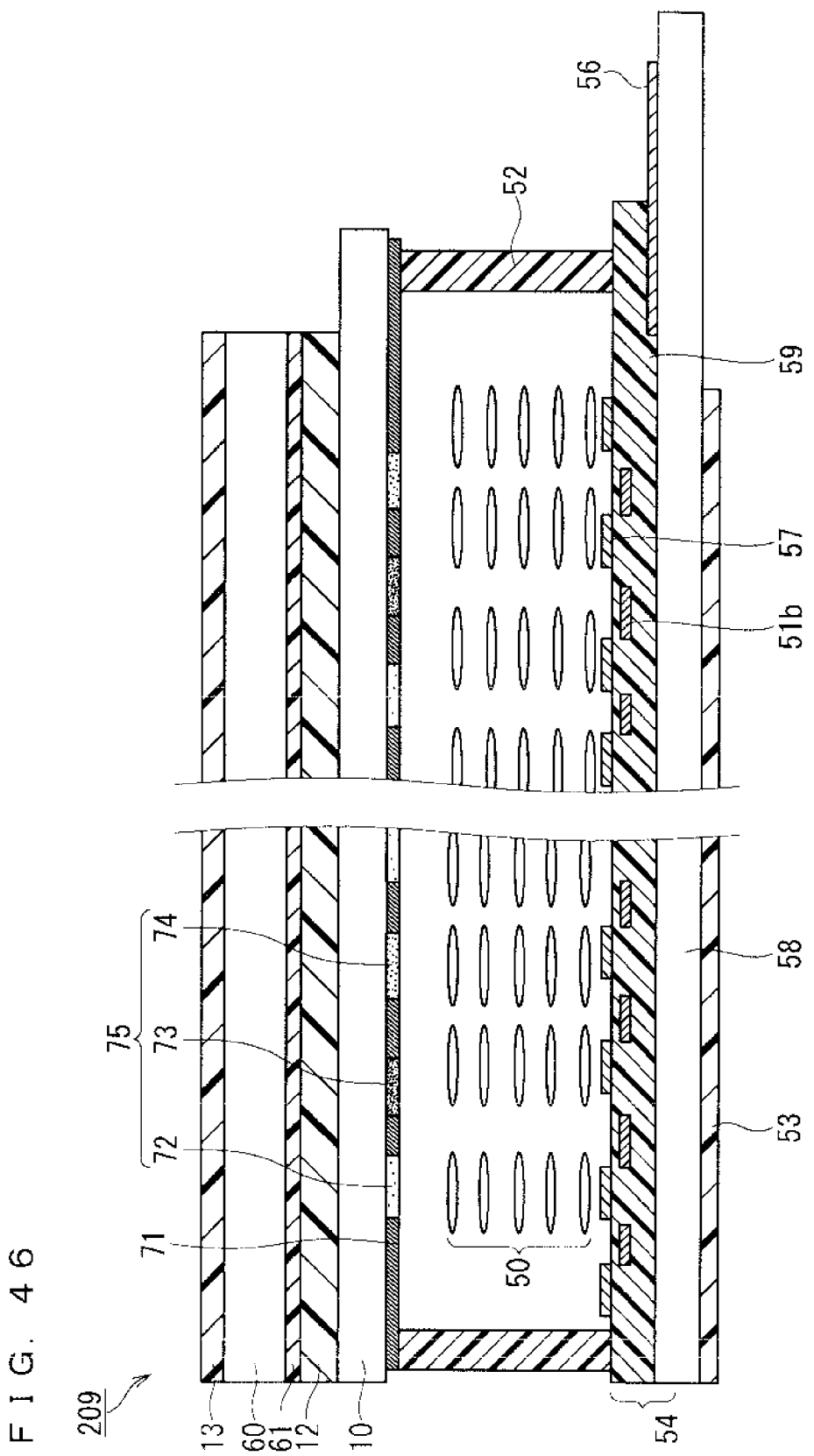
FIG. 46 is a schematic cross-sectional view taken along line XLVI-XLVI in FIG. 45.
Figure 47:
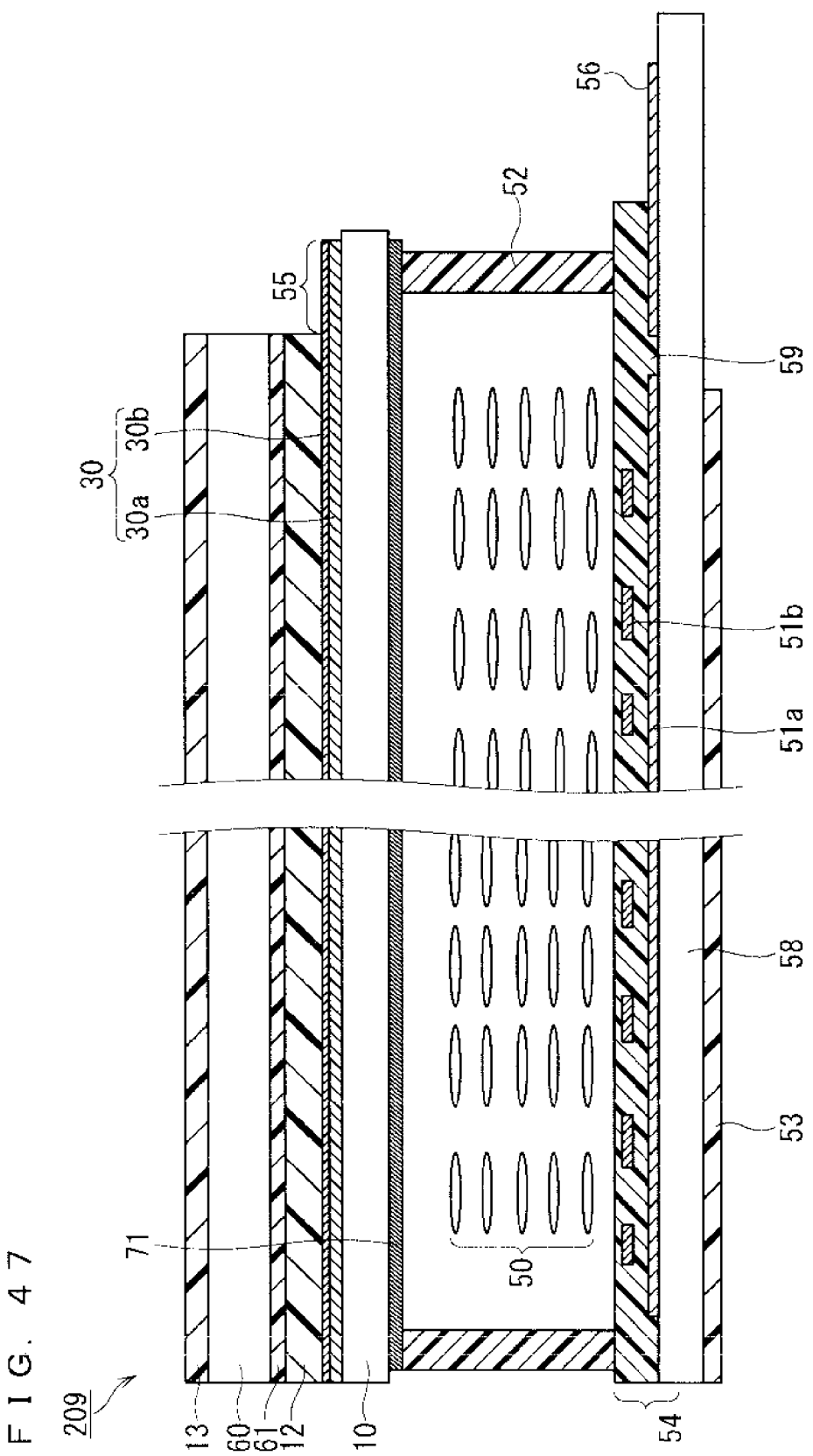
FIG. 47 is a schematic cross-sectional view taken along line XLVII-XLVII in FIG. 45.

FIG. 45 is a plan view schematically showing the configuration of a color filter substrate included in a display panel 209 in the present embodiment. FIGS. 46 and 47 are respectively schematic cross-sectional views taken along lines XLVI-XLVI and XLVII-XLVII in FIG. 45.

The TFT-array substrate 54 includes a gate wiring layer 51a and a source wiring layer 51b provided on the second substrate 58. The gate wiring layer 51a and the source wiring layer 51b are insulated from each other with an interlayer insulating film 59. The TFT-array substrate 54 includes a plurality of transistor elements 67 (FIG. 28) provided on the second substrate 58, each having a source terminal and a drain terminal. The source wiring layer 51b provided on the second substrate 58 is connected to the source terminal of the transistor element 67. In the present embodiment, the source wiring layer 51b also serves as an inner sensor electrode.

According to the present embodiment, the source wiring layer 51b is also used as an inner sensor electrode. Therefore, the aperture ratio of the display device can be increased as compared with the case where a structure different from the source wiring layer 51b is provided as the inner sensor electrode. In addition, the manufacturing process of the display panel 209 is simplified.

In the example in FIG. 47, the outer sensor electrode 30 includes the wiring film 30a and the antireflection film 30b as described in the seventh embodiment. However, as shown in FIGS. 8 and 15 (first and second embodiments), the outer sensor electrode 30 may include a single film.

It should be noted that since the configuration other than the above is substantially the same as the configuration of the first to third embodiments described above, the same or corresponding elements are denoted by the same reference numerals, and the description of the elements will not be repeated.

Tenth Embodiment

Figure 48:
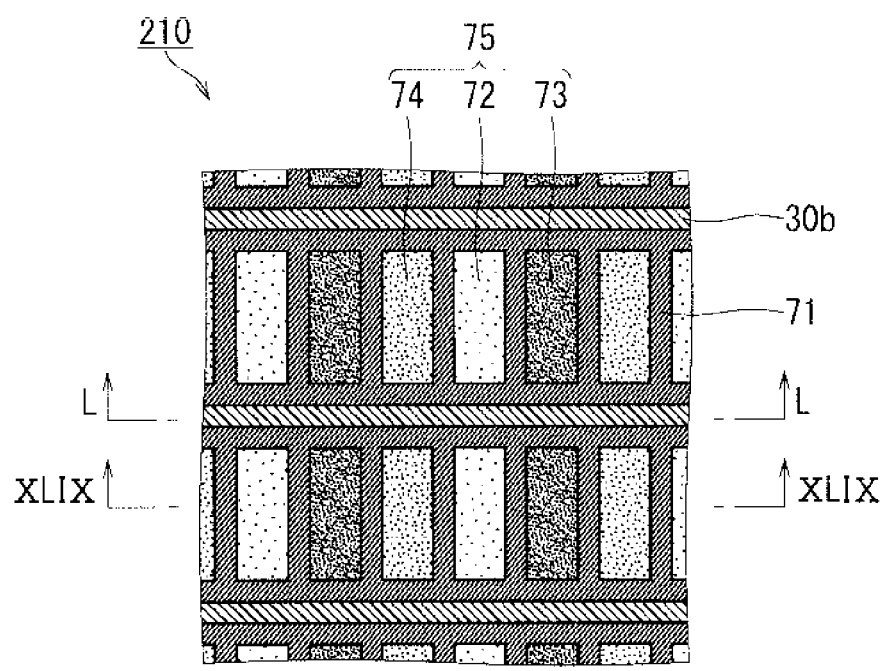
FIG. 48 is a plan view schematically showing the configuration of a color filter substrate included in a display panel in a tenth embodiment of the present invention.
Figure 49:
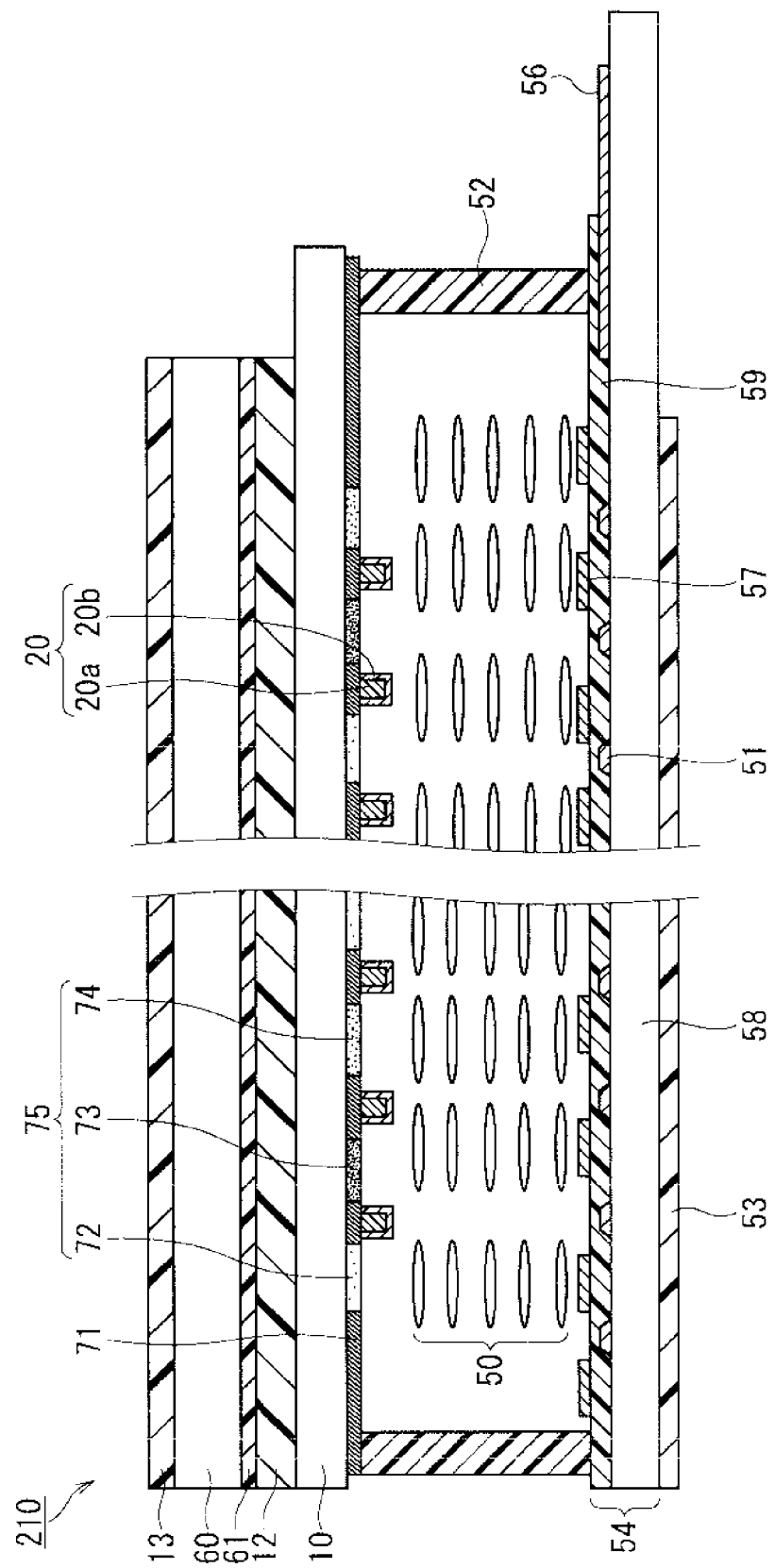
FIG. 49 is a schematic cross-sectional view taken along line XLIX-XLIX in FIG. 48.
Figure 50:
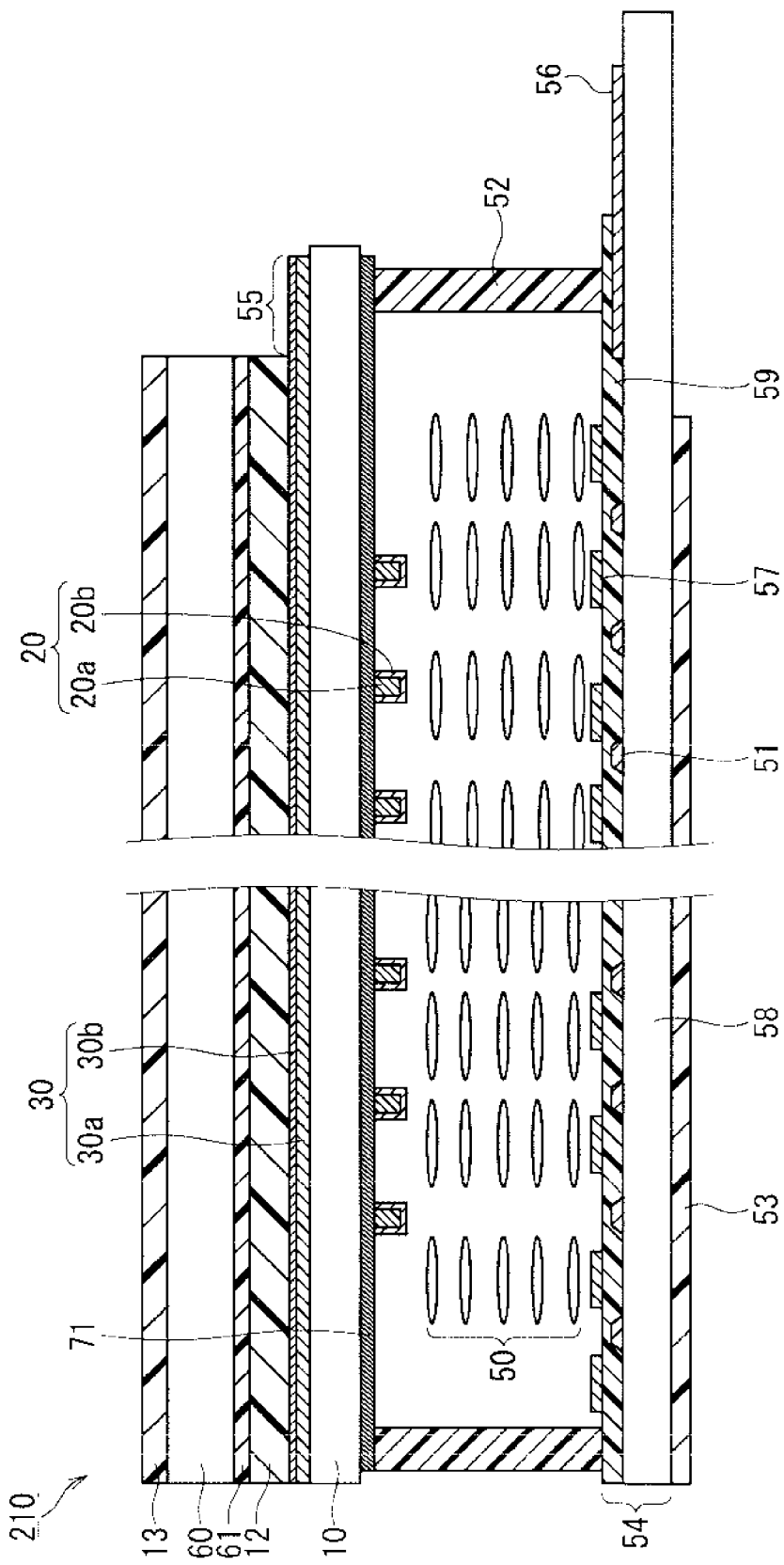
FIG. 50 is a schematic cross-sectional view taken along line L-L in FIG. 48.

FIG. 48 is a plan view schematically showing the configuration of a color filter substrate included in a display panel 210 in the present embodiment. FIGS. 49 and 50 are respectively schematic cross-sectional views taken along lines XLIX-XLIX and L-L in FIG. 48.

In the display panel 210 in the present embodiment, the side surface of the inner sensor electrode 20 is covered with an antireflection film 20b. The inner sensor electrode 20 includes a wiring film 20a covered with the antireflection film 20b. The side surface is a surface connecting the surface facing the first substrate 10 and the surface facing the second substrate 58 of the inner sensor electrode 20. It should be noted that in FIG. 50, the surface facing the second substrate 58 of the inner sensor electrode 20 (lower surface in the drawing) is also covered with the antireflection film 20b.

The side surface of the outer sensor electrode 30 is covered with an antireflection film 30b. The outer sensor electrode 30 includes a wiring film 30a covered with the antireflection film 30b. It should be noted that the above-described side surface corresponds to the upper side and the lower side of a rectangle representing the structure of reference numeral "30b" in FIG. 48. The side surface is a surface connecting the surface facing the observer and the surface facing the first substrate 10 of the outer sensor electrode 30. It should be noted that in FIG. 50, the surface facing the observer of the outer sensor electrode 30 (upper surface in the drawing) is also covered with the antireflection film 30b.

According to the present embodiment, the side surface of the outer sensor electrode 30 is covered with the antireflection film 30b. Thus, the reflection of external light due to the outer sensor electrode 30 is reduced. Therefore, it is difficult for the outer sensor electrode 30 to be visually recognized from the observer. Therefore, deterioration of visibility due to the existence of the outer sensor electrode 30 can be suppressed. The same applies to the inner sensor electrode 20. If the above-described antireflection film is provided on at least one of the outer sensor electrode 30 and the inner sensor electrode 20, the effects of this can be obtained.

It should be noted that since the configuration other than the above is substantially the same as the configuration of any one of the first to ninth embodiments described above, the same or corresponding elements are denoted by the same reference numerals, and the description of the elements will not be repeated.

Eleventh Embodiment

Figure 51:
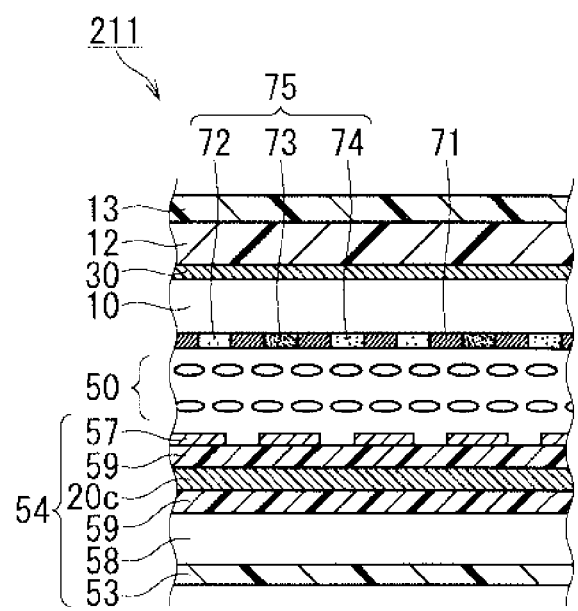
FIG. 51 is a partial cross-sectional view schematically showing the configuration of a display panel in an eleventh embodiment of the present invention.

FIG. 51 is a partial cross-sectional view schematically showing the configuration of a display panel 211 in the present embodiment. The TFT-array substrate 54 of the display panel 211 in the present embodiment includes a common electrode 20c. The common electrode 20c is arranged to face the pixel electrode 57 with the interposition of the interlayer insulating film 59. A voltage is applied between the common electrode 20c and the pixel electrode 57, which causes an electric field for modulating the liquid crystal layer 50 to be generated. In the present embodiment, the common electrode 20c also serves as an inner sensor electrode.

According to the present embodiment, the common electrode 20c is also used as an inner sensor electrode. Therefore, the aperture ratio of the display device can be increased as compared with the case where a structure different from the structure of the common electrode 20c is provided as the structure of the inner sensor electrode. In addition, the manufacturing process of the display panel 211 is simplified.

It should be noted that in FIG. 51, the common electrode 20c is arranged between the pixel electrode 57 and the second substrate 58, but this arrangement does not necessarily have to be used. For example, the pixel electrode 57 may be arranged between the common electrode 20c and the second substrate 58.

It should be noted that since the configuration other than the above is substantially the same as the configuration of the first to third embodiments described above, the same or corresponding elements are denoted by the same reference numerals, and the description of the elements will not be repeated.

Twelfth Embodiment

Figure 52:
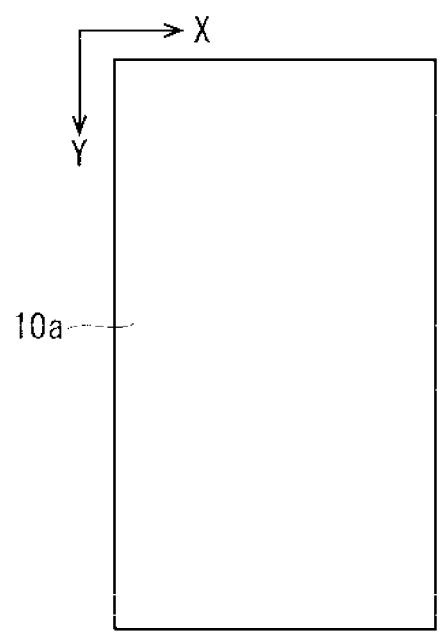
FIG. 52 is a plan view schematically showing the configuration of a first substrate included in a display panel in a twelfth embodiment of the present invention.

FIG. 52 is a plan view schematically showing the configuration of a first substrate 10a included in a display panel in the present embodiment. The first substrate 10a has a rectangular shape. This rectangular shape has short sides along one direction. In the present embodiment, the short side is parallel to the left-right direction (X direction in the drawing) of the observer.

Since the configuration other than the above is substantially the same as the configuration of any one of the first to eleventh embodiments described above, the same or corresponding elements are denoted by the same reference numerals, and the description of the elements will not be repeated. According to the present embodiment, when the short side of the first substrate 10a is parallel to the left-right direction of the observer, substantially the same effects as the effects of each of the above embodiments can be obtained. It should be noted that a display device mounted on a portable terminal device such as a smartphone often has its short side direction in the left-right direction of the observer.

Thirteenth Embodiment (Configuration)

Figure 53:
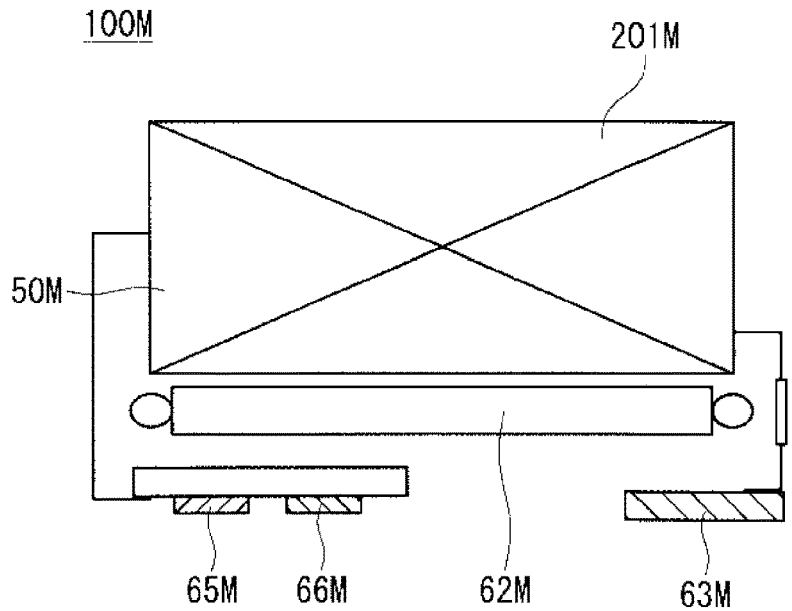
FIG. 53 is a cross-sectional view schematically showing the configuration of a display device including a display panel in a thirteenth embodiment of the present invention.

FIG. 53 is a cross-sectional view schematically showing the configuration of a display device 100M including a display panel 201M in the present embodiment. The display device 100M includes a display panel 201M, a backlight 62M, a liquid-crystal drive circuit board 63M, a touch detection IC (Integrated Circuit) 65M, and a microcontroller 66M, the display panel 201M is provided with a touch sensor, that is, is a display panel with a touch sensor. In other words, a touch screen is integrated on the display panel 201M. In the present embodiment and other embodiments to be described below, the case where the display panel 201M is a liquid crystal panel will be described in detail in particular. The touch detection IC 65M constitutes an external circuit for detecting a change in electrostatic capacitance due to a touch.

Figure 54:
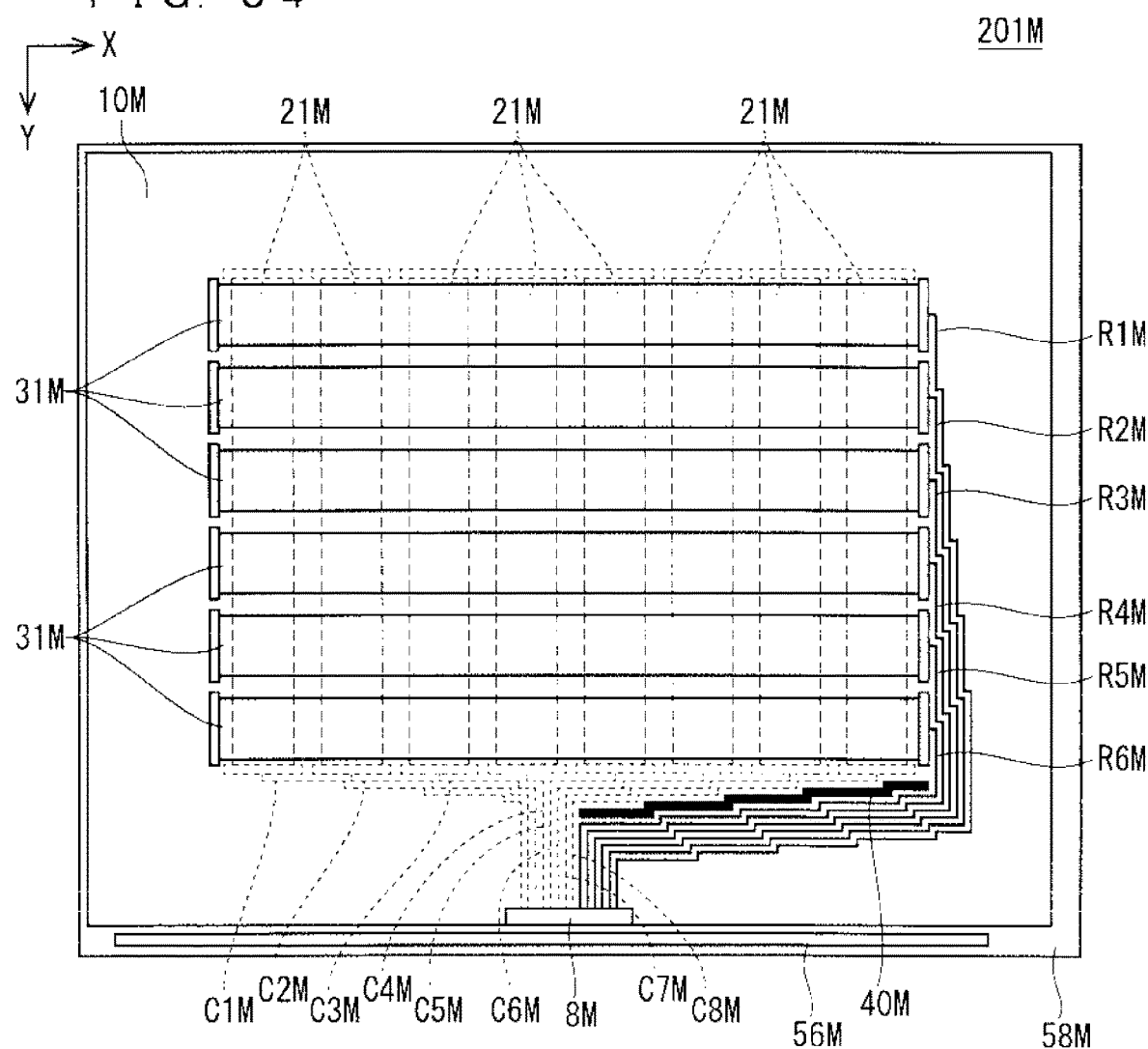
FIG. 54 is a plan view schematically showing the configuration of the display panel in FIG. 53.

FIG. 54 is a plan view schematically showing the configuration of the display panel 201M. The display panel 201M includes a first substrate 10M and a second substrate 58M facing each other. The first substrate 10M has translucency and is typically a transparent glass substrate. The second substrate 58M has translucency when the backlight 62M (FIG. 53) is used, and is typically a transparent glass substrate.

The first substrate 10M has a rectangular shape. The rectangular shape has a long side along one direction. In the present embodiment, this one direction is the X direction (row direction) of the display panel 201M parallel to the left-right direction of the observer. In addition, the short side of the rectangular shape is along the Y direction (column direction) parallel to the vertical direction of the observer. The X and Y directions intersect each other, and are typically orthogonal. The second substrate 58M may have a shape that is roughly similar to the shape of the first substrate 10M.

The display panel 201M is provided with a projected capacitive type touch sensor. Specifically, the display panel 201M is provided with a touch-screen terminal portion 8M, a plurality of column-direction wiring portions 21M, a plurality of row-direction wiring portions 31M, lead wiring lines C1M to C8M, and lead wiring lines R1M to R6M. Each of the row-direction wiring portions 31M extends along the X direction. The row-direction wiring portions 31M are arranged at intervals in the Y direction. Each of the column-direction wiring portions 21M extends along the Y direction. The column-direction wiring portions 21M are arranged at intervals in the X direction. The row-direction wiring portions 31M and the column-direction wiring portions 21M are separated with the first substrate 10M.

The touch-screen terminal portion SM is provided at an end portion of the first substrate 10M, the respective row-direction wiring portions 31M are connected to the touch-screen terminal portion SM through the lead wiring lines R1M to R6M. The respective column-direction wiring portions 21M are connected to the touch-screen terminal portion 8M through the lead wiring lines C1M to C8M. The touch-screen terminal portion 8M is connected to the touch detection IC 65M (FIG. 53). The touch detection IC 65M detects the position on the touch screen indicated by the pointer based on the electrostatic capacitance formed between each of the row-direction wiring portions 31M and the column-direction wiring portions 21M and the pointer.

For example, the lead wiring lines R1M to R6M are arranged along the outer periphery of the detectable area in the order from the lead wiring lines closest to the touch-screen terminal portion 8M, and are arranged along other lead wiring lines after reaching the arrangement position of the other lead wiring lines. Thus, the lead wiring lines R1M to R6M are crammed onto the outer peripheral side of the detectable area to be arranged. In addition, similarly, the lead wiring lines C1M to C8M are also crammed onto the outer peripheral side of the detectable area to be arranged in the order from the lead wiring lines closest to the touch-screen terminal portion 8M, and are arranged along other lead wiring lines after reaching the arrangement position of the other lead wiring lines. Thus, cramming the lead wiring lines R1M to R6M and the lead wiring lines C1M to C8M as closely as possible onto the outer peripheral side of the detectable area to arrange allows the outer peripheral portion of the display panel 201M to be reduced. In addition, a shield electrode 40M may be arranged between the lead wiring lines R1M to R6M in the row direction and the lead wiring lines C1M to C6M in the column direction. Thus, the influence of electromagnetic noise generated from the display portion or noise between the lead wiring lines can be reduced. The shield electrode 40M can be formed at the same time as the outer sensor electrode 30M or the inner sensor electrode 20M described below.

Figure 55:
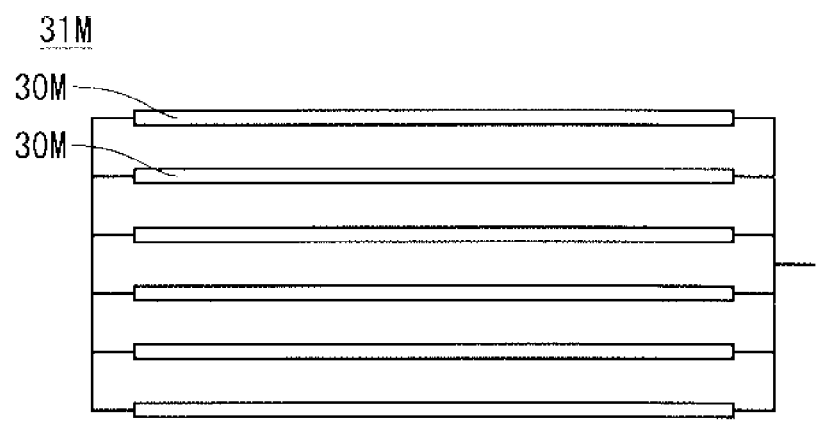
FIG. 55 is a plan view schematically showing the configuration of each of the row-direction wiring portions in FIG. 54.

FIG. 55 is a plan view schematically showing the configuration of each of the row-direction wiring portions 31M. Each of the row-direction wiring portions 31M includes at least one outer sensor electrode 30M, and typically includes a plurality of outer sensor electrodes 30M connected in parallel with each other. Each of the outer sensor electrodes 30M extends along the X direction (FIG. 54).

The outer sensor electrode 30M is made of metal. Preferably, the outer sensor electrode 30M contains at least any one of atoms of silver, copper, aluminum, molybdenum, and titanium. Specifically, the outer sensor electrode 30M is a single layer film or a multilayer film of a metal material such as aluminum, or a multilayer film of a metal material and another material. For example, a laminated structure of a metal and its nitride may be used. It should be noted that the "metallic material" may be an alloy material including the above atoms.

Figure 56:
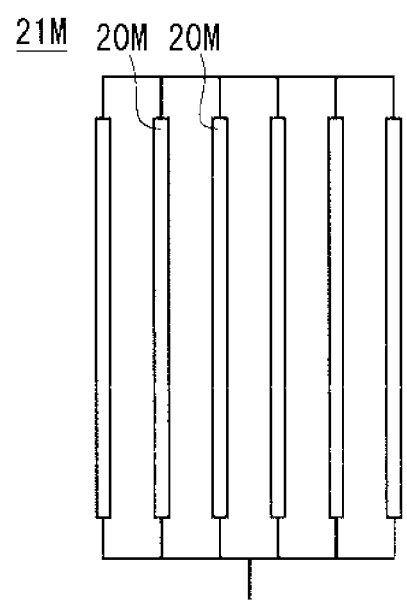
FIG. 56 is a plan view schematically showing the configuration of each of the column-direction wiring portions in FIG. 54.

FIG. 56 is a plan view schematically showing the configuration of each of the column-direction wiring portions 21M. Each of the column-direction wiring portions 21M includes at least one inner sensor electrode 20M, and typically includes a plurality of inner sensor electrodes 20M connected in parallel with each other. Each of the inner sensor electrodes 20M extends along the Y direction (FIG. 54). The inner sensor electrode 20M may be made of the same material as the outer sensor electrode 30M.

Figure 57:
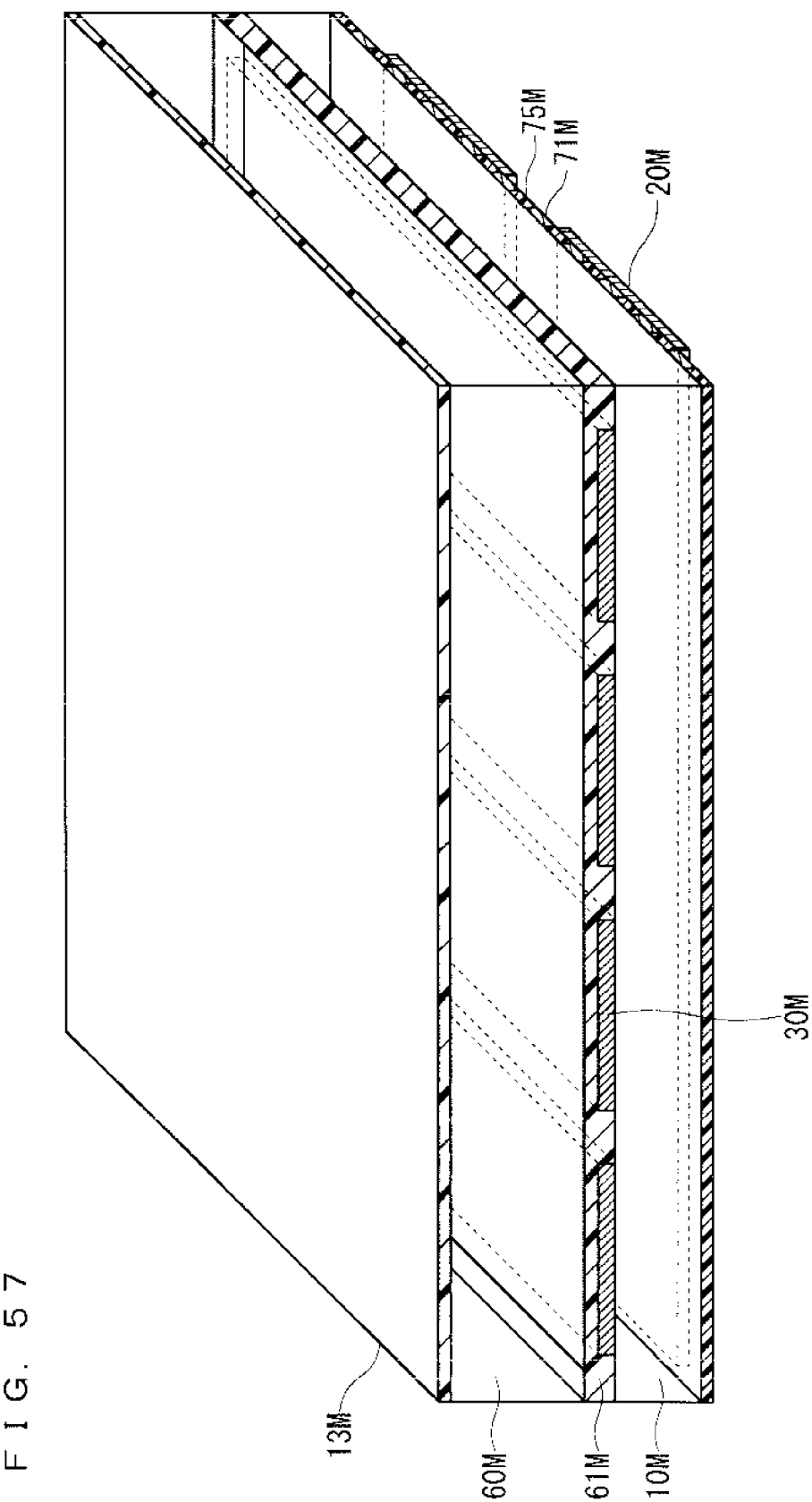
FIG. 57 is a partial perspective view schematically showing the configuration of a detectable area of a touch screen integrated on the display panel.

FIG. 57 is a partial perspective view schematically showing the configuration of a detectable area of a touch screen integrated on the display panel 201M. This configuration corresponds to the color filter substrate included in the display panel 201M, and includes a first substrate 10M, a light-shielding portion 71M (black matrix), a color material portion 75M, an inner sensor electrode 20M, and a plurality of outer sensor electrodes 30M. In the present embodiment, this color filter substrate corresponds to a touch screen having an on-cell structure. The first substrate 10M has an observation surface (upper surface in the drawing) facing the observer and an inner surface (lower surface in the drawing) opposite to the observation surface. The second substrate 58M (FIG. 54) faces the inner surface of the first substrate 10M.

The outer sensor electrode 30M is provided on the observation surface of the first substrate 10M. The inner sensor electrode 20M is provided between the inner surface of the first substrate 10M and the second substrate 58M (FIG. 54), and is provided on the inner surface in the present embodiment. Therefore, the outer sensor electrode 30M and the inner sensor electrode 20M are obstructed by the first substrate 10M. A plurality of outer sensor electrodes 30M extending in the row direction (lateral direction in the drawing) and a plurality of inner sensor electrodes 20M extending in the column direction constitute a matrix region in a plan view. In the matrix region, it is desirable from the viewpoint of display quality that each of the proportions of the outer sensor electrode 30M and the inner sensor electrode 20M is the same.

The light-shielding portion 71M is provided on the inner surface of the first substrate 10M and has an opening pattern. The color material portion 75M is provided on the inner surface of the first substrate 10M. The light-shielding portion 71M and the color material portion 75M constitute a color filter layer provided on the inner surface of the first substrate 10M.

It should be noted that an adhesive layer 61M, a protective transparent substrate 60M, and an upper polarizing plate 13M are provided in this order on the observation surface provided with the outer sensor electrode 30M. In order to improve environmental resistance, the protective transparent substrate may be provided on the surface facing the observer of the upper polarizing plate 13M with the interposition of the adhesive layer.

Figure 58:
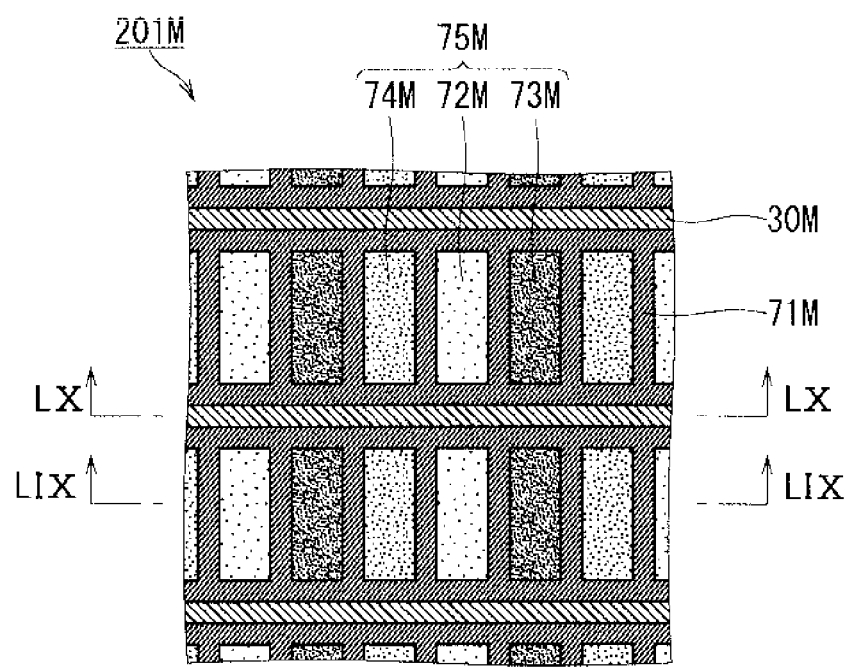
FIG. 58 is a partial plan view schematically showing the configuration of a color filter substrate included in the display panel in the thirteenth embodiment of the present invention.
Figure 59:
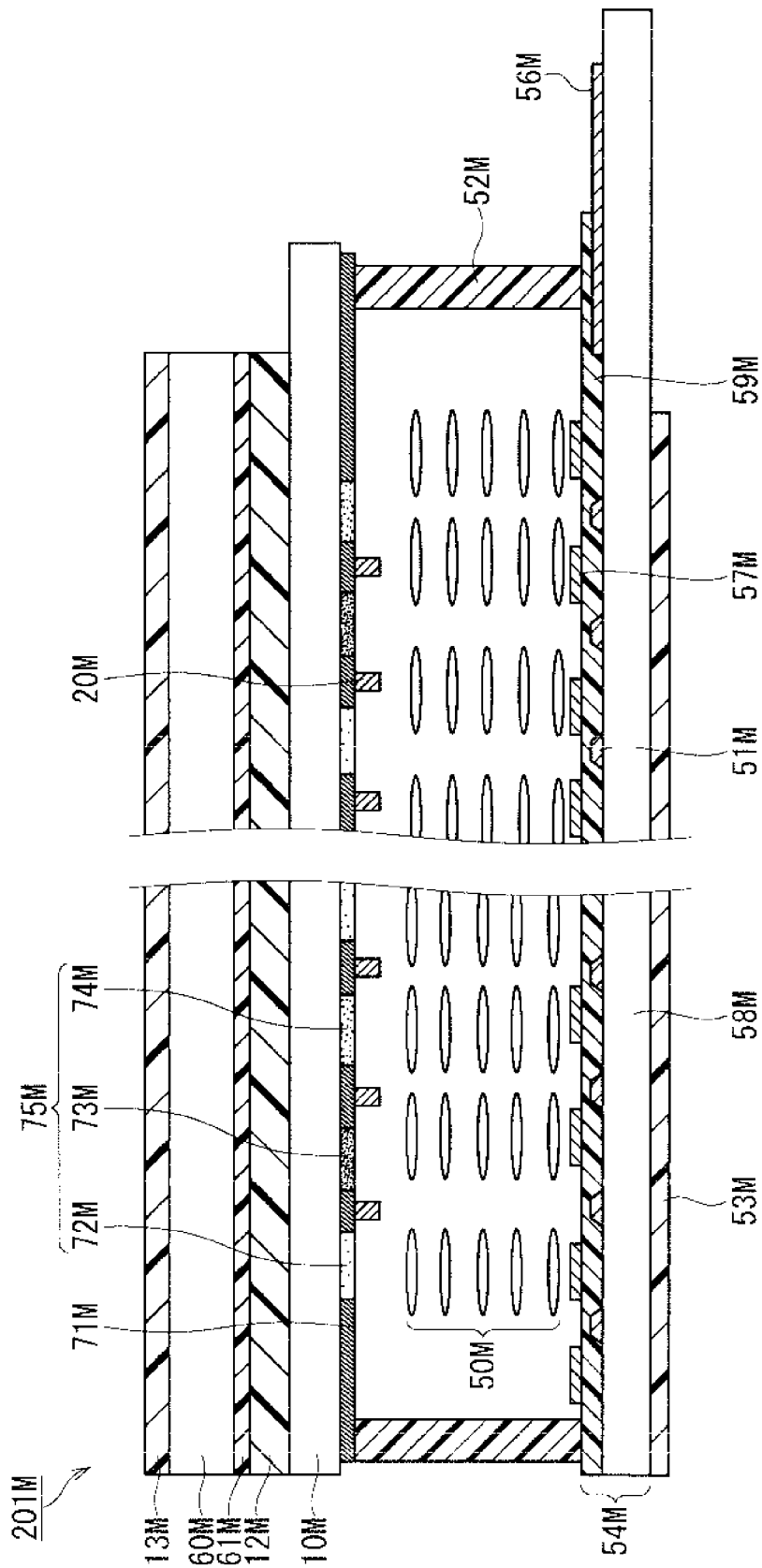
FIG. 59 is a schematic cross-sectional view taken along line LIX-LIX in FIG. 58.
Figure 60:
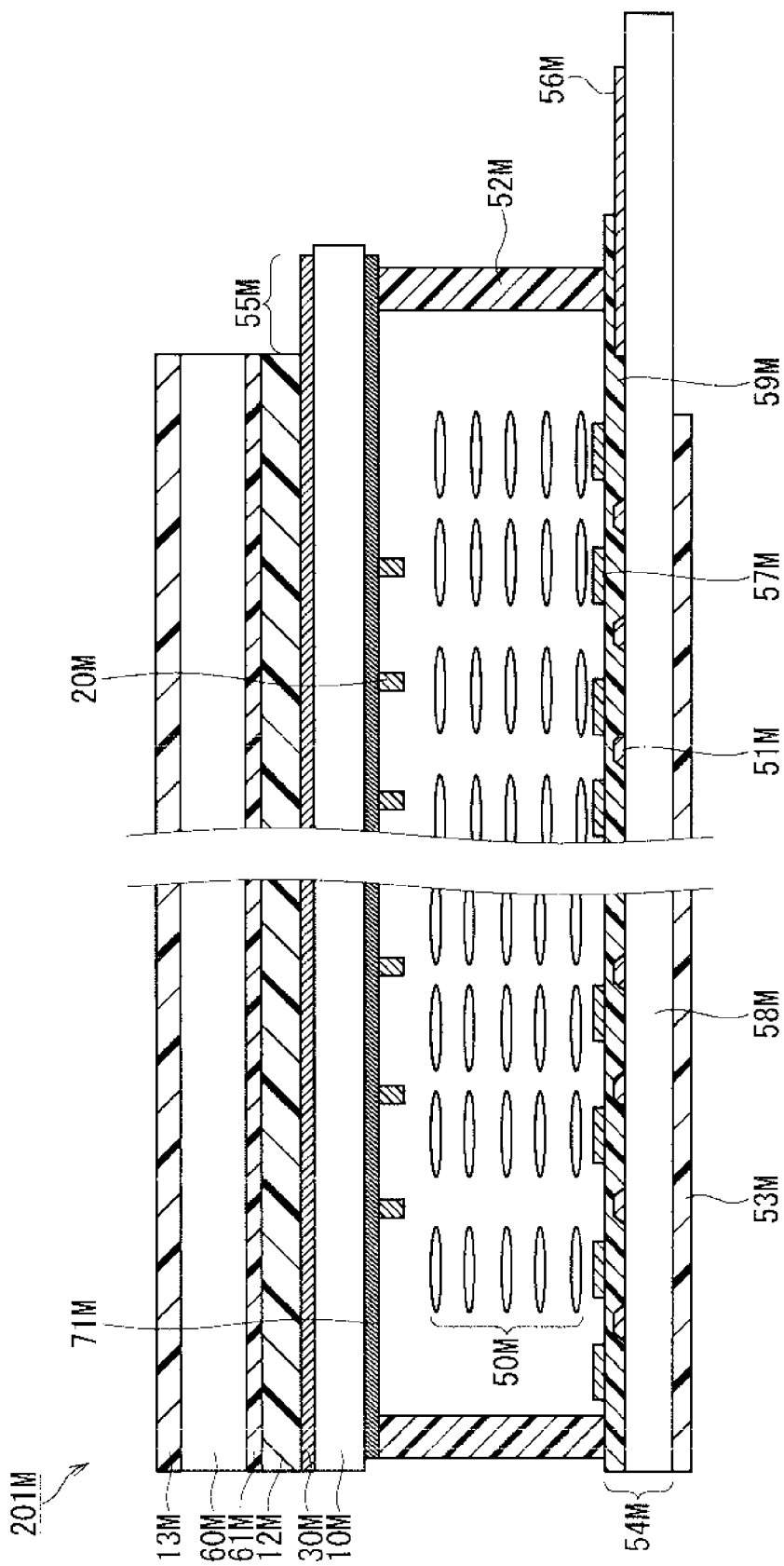
FIG. 60 is a schematic cross-sectional view taken along line LX-LX in FIG. 58.

FIG. 58 is a partial plan view schematically showing the configuration of a color filter substrate included in the display panel 201M. In other words, FIG. 58 is a partial plan view of the main part in FIG. 57 as viewed from the observation surface (as viewed from the upper direction in FIG. 57). FIGS. 59 and 60 are respectively schematic cross-sectional views taken along lines LIX-LIX and LX-LX in FIG. 58.

The color material portion 75M includes a plurality of color material layers 72M to 74M arranged corresponding to the opening pattern of the light-shielding portion 71M. The color material layers 72M to 74M have different colors from each other. For example, the color material layer 72M has red (R), the color material layer 73M has green (G), and the color material layer 74M has blue (B). In the present embodiment, the color material portion 75M has a stripe array. In the stripe array, color material layers having the same color of the color material layers 72M to 74M are arrayed along the stripe direction (vertical direction in FIG. 58). That is, the stripe direction corresponds to the Y direction (FIG. 54). Therefore, the color material portion 75M includes color material layers 72M to 74M adjacent to each other and having a common color in the Y direction (vertical direction in the drawing).

As described above, the outer sensor electrode 30M is arranged on the observation surface of the first substrate 10M, and is preferably arranged so as to at least partially overlap with the light-shielding portion 71M in a plan view. More preferably, as shown in FIG. 58, the outer sensor electrode 30M is included in the light-shielding portion 71M in a plan view. The inner sensor electrode 20M is preferably arranged so as to at least partially overlap with the light-shielding portion 71M in a plan view. More preferably, the inner sensor electrode 20M is included in the light-shielding portion 71M in a plan view. In the present embodiment, the inner sensor electrode 20M is arranged on the inner surface of the first substrate 10M with the interposition of the light-shielding portion 71M.

The outer sensor electrode 30M may be covered with the protective film 12M on the observation surface (upper surface in FIGS. 59 and 60) of the first substrate 10M. An electrode further extending from the outer sensor electrode 30M and being exposed without being covered with the protective film 12M is the touch screen terminal 55M (FIG. 60). Each of the touch screen terminals 55M is connected to the touch-screen terminal portion 8M (FIG. 54). Part or all of the protective film 12M may be formed of a transparent inorganic insulating film, an organic inorganic insulating film, or an organic insulating film. As the transparent inorganic insulating film, a silicon-based inorganic insulating film such as a silicon oxide film, a silicon nitride film, a silicon oxynitride film, or a metal oxide film such as alumina can be used. As a material of the organic inorganic insulating film, a polymer material in which the main chain is made of silicon oxide, silicon nitride, or silicon oxynitride, and organic matter is bonded to the side chains or functional groups can be used. As the material of the organic insulating film, for example, an acrylic resin, a polyimide resin, an epoxy resin, a novolak resin, an olefin resin, or the like, whose main chain is made of carbon and which is obtained by curing by high-temperature firing, can be used.

The display panel 201M (FIG. 59) has a function of displaying an image with the display function unit constituted by a color filter substrate including the first substrate 10M, a TFT-array substrate 54M including the second substrate 58M, and a liquid crystal layer 50M as a display function layer provided between them. The liquid crystal layer 50M is scaled between the first substrate 10M and the second substrate 58M with a sealant 52M. An upper polarizing plate 13M and a lower polarizing plate 53M are respectively provided on one side and the other side of the liquid crystal layer 50M.

On the second substrate 58M, the TFT-array substrate 54M includes: a pixel electrode 57M, a transistor element (not shown) for switching the voltage applied to the pixel electrode 57M, a TFT-array wiring layer 51M for supplying a voltage for driving the liquid crystal layer 50M to this transistor element, an interlayer insulating film 59M covering the TFT-array wiring layer 51M, and a TFT-array terminal 56M for connecting the TFT-array wiring layer 51M to an external circuit.

(Formation Timing of Outer Sensor Electrode in Manufacture)

In the manufacture of the display panel 201M, the light-shielding portion 71M, the color material portion 75M, and the inner sensor electrode 20M are preferably formed on the inner surface of the first substrate 10M after the outer sensor electrode 30M is formed on the observation surface of the first substrate 10M. Therefore, preferably, the material of the protective film 12M covering the outer sensor electrode 30M has sufficient resistance to chemical medical fluids or moisture used in the formation process of the color material portion 75M during manufacture or under the use environment after manufacture. It should be noted that an overcoat film covering the inner sensor electrode 20M may be provided as the protective film of the inner sensor electrode 20M.

Since the color material portion 75M is easily decomposed and discolored by high temperature treatment, high temperature treatment cannot be performed on the first substrate 10M provided with the color material portion 75M. Forming the outer sensor electrode 30M ahead of the color material portion 75M allows the outer sensor electrode 30M to be formed at a high temperature. Thus, the protective film 12M having high hardness can be formed. The hardness of the protective film 12M is preferably the same degree (specifically, hardness 7 or more) as that of dust floating in the air and glass. Thus, friction with the stage during conveyance in the manufacturing process, or the occurrence of scratches caused by use after manufacture is suppressed. Such scratches cause disconnection or corrosion or are visually recognized as display defects due to changes in the state of transmission or reflection of light. Therefore, such scratches cause a decrease in yield. The material of the protective film 12M is, for example, an inorganic insulating film such as $SiO_2$ or $SiN$, or an organic insulating film.

It should be noted that assuming that the outer sensor electrode 30M is formed after the step of laminating the color filter substrate having the first substrate 10M and the TFT-array substrate 54M having the second substrate 58M and the step of injecting and scaling the liquid crystal between them, when a defect in the touch sensor is found by inspection, the loss cost increases because the display panel 201M is already close to completion. On the other hand, if the outer sensor electrode 30M is formed at an early stage as described above, the loss cost is reduced, which is also advantageous from the aspect of environmental conservation.

Comparative Example

Figure 61:
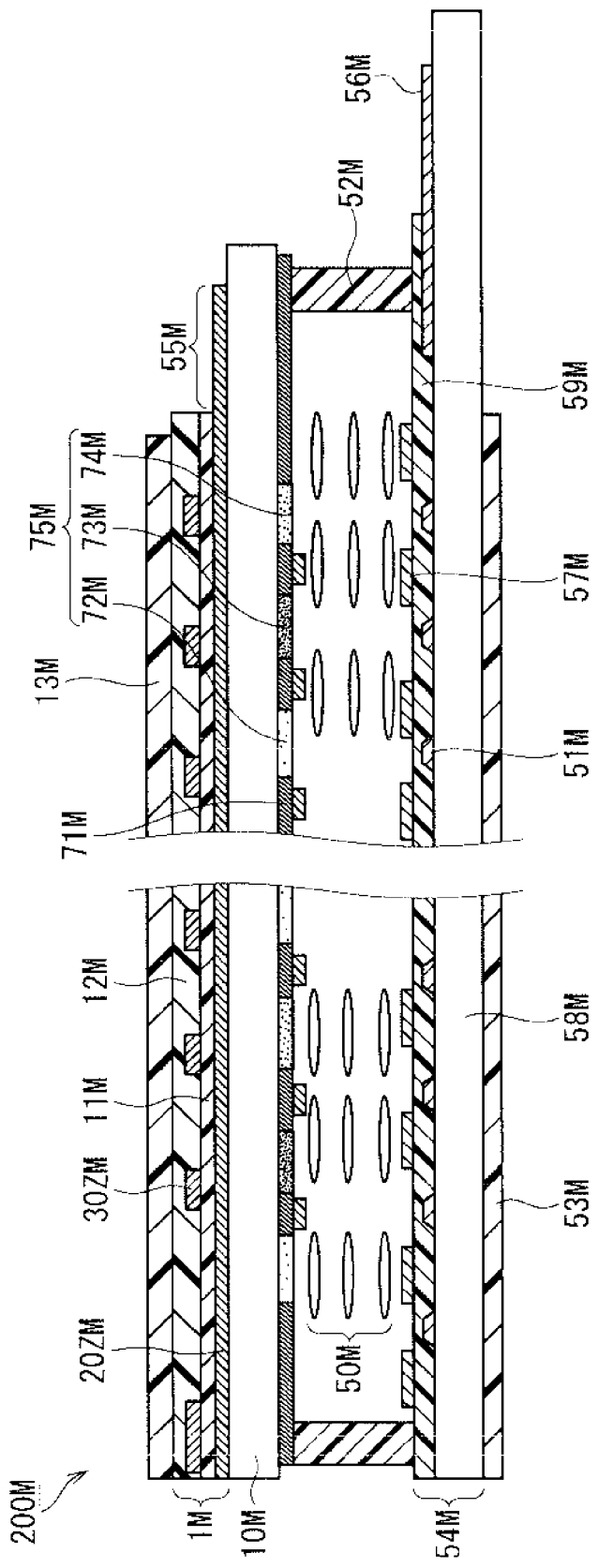
FIG. 61 is a cross-sectional view showing the configuration of a display panel of a comparative example.

With reference to FIG. 61, in the display panel 200M of the comparative example, an outer sensor electrode 20ZM and an outer sensor electrode 30ZM are provided instead of the inner sensor electrode 20M and the outer sensor electrode 30M (FIG. 59). The outer sensor electrode 20ZM and the outer sensor electrode 30ZM are arranged on the observation surface of the first substrate 10M. The outer sensor electrode 20ZM and the outer sensor electrode 30M are separated by an interlayer insulating film 11M. With the above configuration, the touch screen unit 1M including the outer sensor electrode 20ZM, the outer sensor electrode 30M, and the interlayer insulating film 11M is configured on the observation surface of the first substrate 10M.

Figure 62:
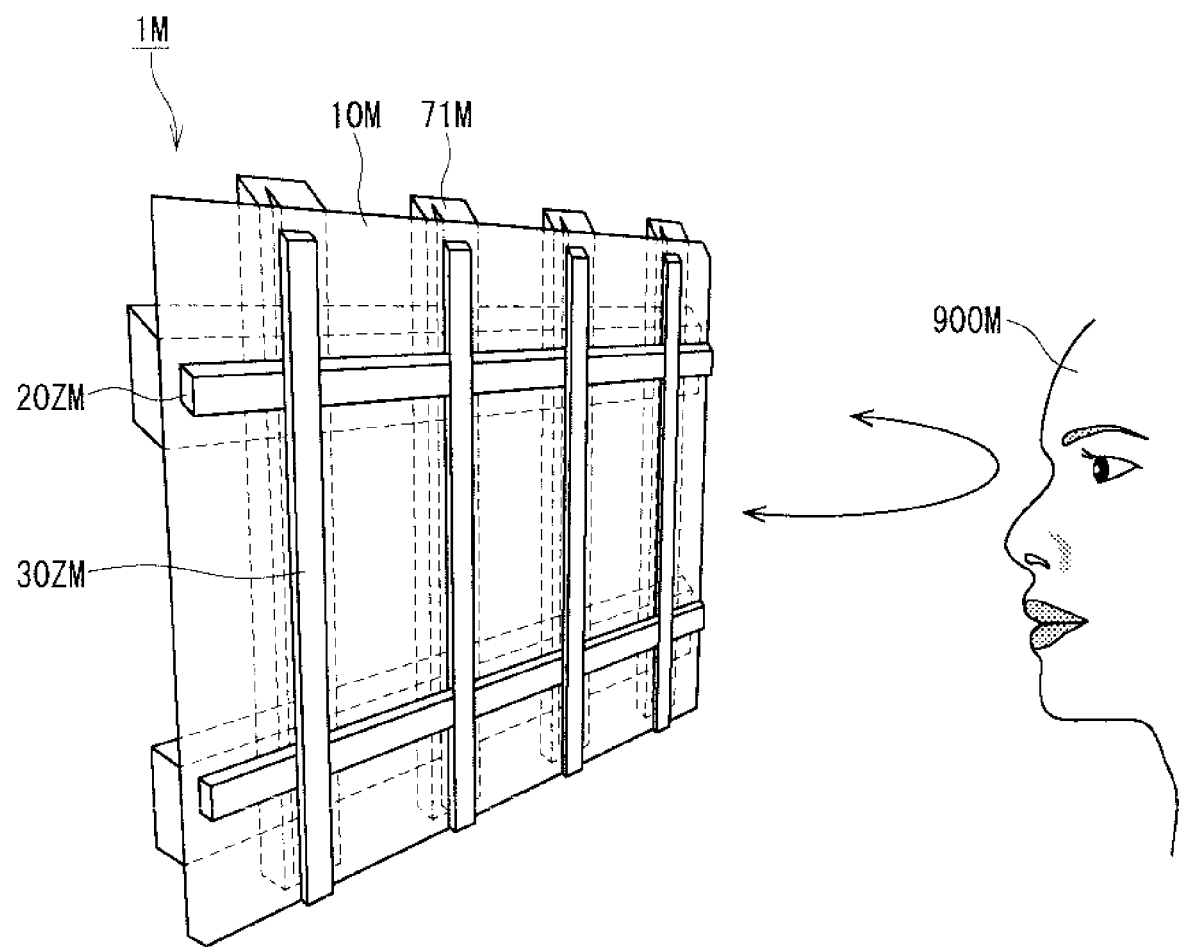
FIG. 62 is a perspective view showing a state of occurrence of image unevenness in the display panel in FIG. 61.

With reference to FIG. 62, the outer sensor electrode 20ZM extends in the left-right direction of the observer. The outer sensor electrode 30ZM extends in the vertical direction of the observer. When the touch screen unit 1M having such a configuration is provided, the observer 900M may visually recognize large image unevenness due to the difference between the left and right viewing angles (see arrows in the drawing). The reason for this will be described below.

Figure 63:
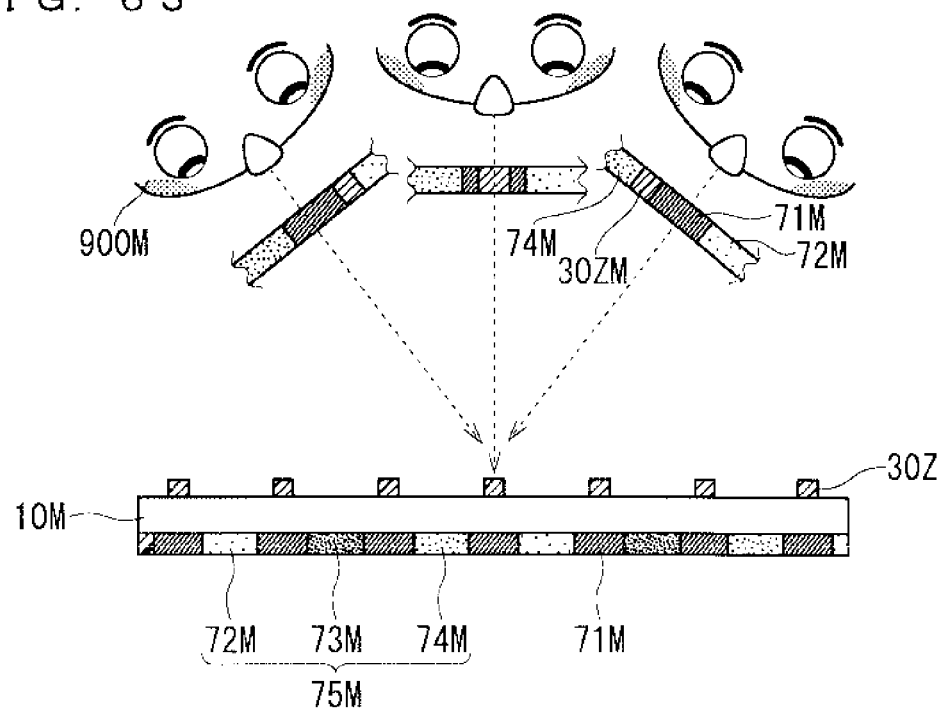
FIG. 63 is a diagram for illustrating the cause of occurrence of image unevenness in the display panel in FIG. 61.
Figure 66:
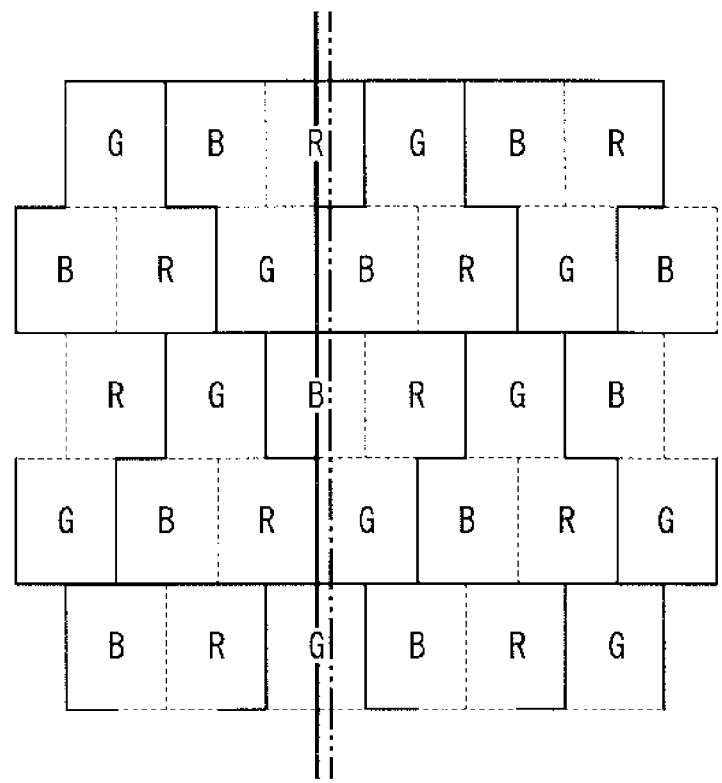
FIG. 66 is a plan view for illustrating the relationship between image unevenness and arrangement of pixel portions in the display panel in FIG. 61.
Figure 67:
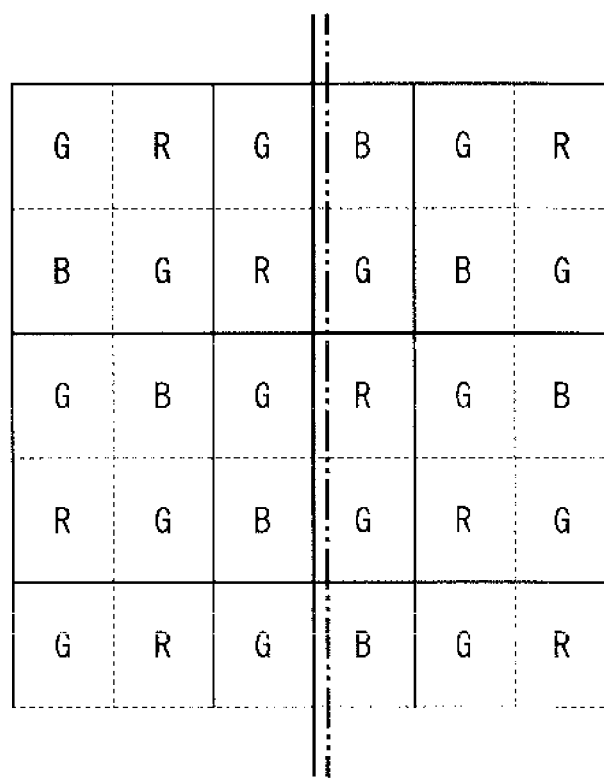
FIG. 67 is a plan view for illustrating the relationship between image unevenness and arrangement of pixel portions in the display panel in FIG. 61.
Figure 70:
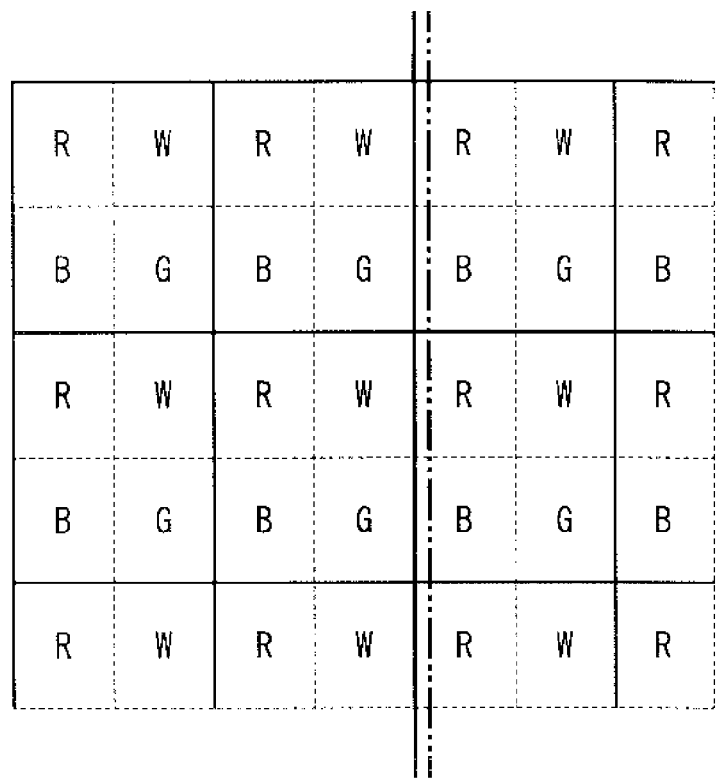
FIG. 70 is a plan view for illustrating the relationship between image unevenness and arrangement of pixel portions in the display panel in FIG. 61.
Figure 71:
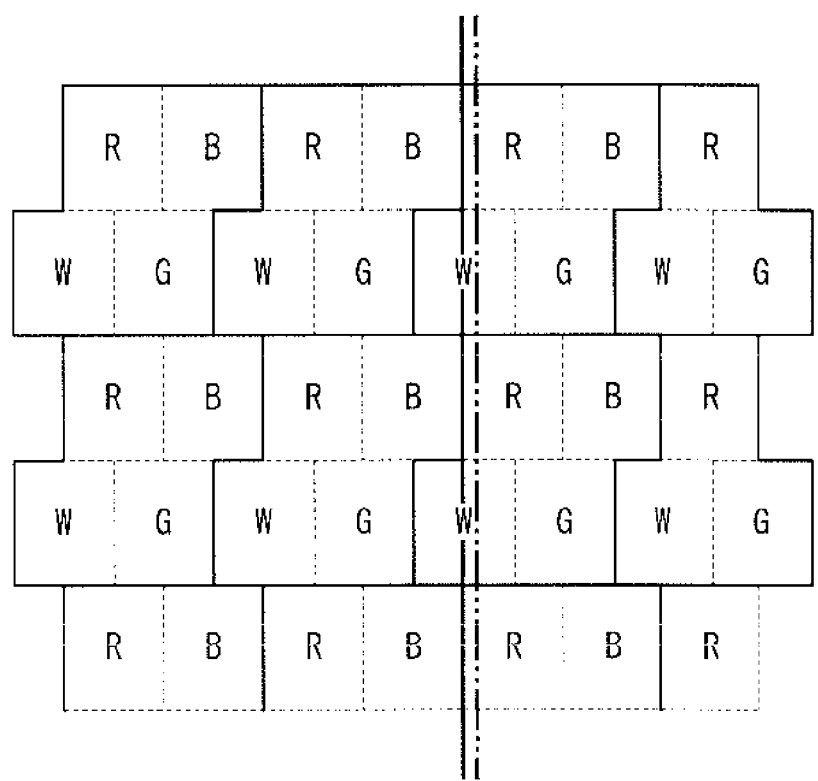
FIG. 71 is a plan view for illustrating the relationship between image unevenness and arrangement of pixel portions in the display panel in FIG. 61.
Figure 72:
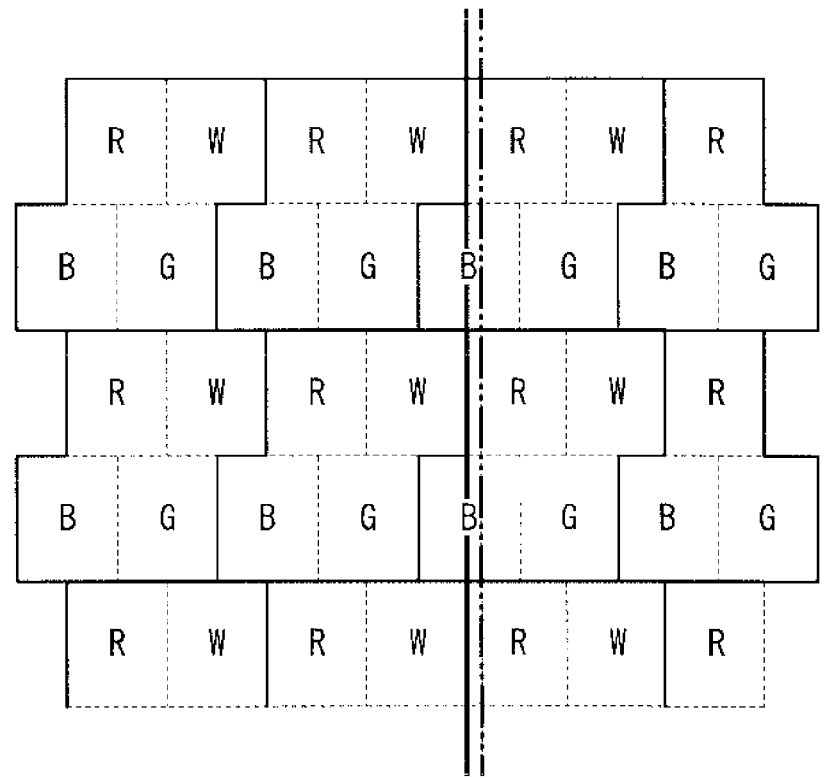
FIG. 72 is a plan view for illustrating the relationship between image unevenness and arrangement of pixel portions in the display panel in FIG. 61.

With reference to FIG. 63, which of the light-shielding portion 71M, the color material layer 72M, and the color material layer 74M the outer sensor electrode 30ZM extending in the vertical direction shields as viewed from the observer 900M depends on the left and right viewing angles of the observer 900M. When the color material layer 72M is partially shielded, the luminance of the color displayed by the color material layer 72M (for example, red (R)) decreases. Similarly, when the color material layer 74M is partially shielded, the luminance of the color displayed by the color material layer 74M (for example, blue (B)) decreases. In the unit pixel constituted by the color material layers 72M to 74M (FIG. 58), when the luminance of a specific color decreases, the original color is not expressed. This causes color unevenness. In addition, when the luminance of each color decreases to the same degree in one unit pixel, luminance unevenness occurs due to the difference in degree of luminance reduction between unit pixels. As described above, in the comparative example, image unevenness, specifically, color unevenness or luminance unevenness, is likely to occur remarkably. The relationship between this image unevenness and the arrangement of the color material portion 75M will be described in detail below.

Each of FIGS. 64 to 67 shows a case where the color material portion includes an RGB array. More specifically, FIGS. 64 to 67 respectively show a stripe array, a mosaic array, a delta array, and a 2G square array. In the stripe array, color material layers having the same color are arranged along the vertical direction. In the mosaic array, all the colors of R, (i, and B are repeatedly arranged along the vertical direction. In the delta array, R, G, and B form a triangular lattice. In the 2G square array, one R, two Gs. and one B form a tetragonal lattice. In each drawing, one area surrounded by a solid line corresponds to a unit pixel. In addition, the position of the shade to be given to the color material portion 75M in each of the case where one outer sensor electrode 30ZM is viewed from the front and the case where the outer sensor electrode 30ZM is viewed from the left is indicated with a solid line and a two-dot chain line.

In the stripe array (FIG. 64), the luminance of a specific color (R (red) in the drawing) changes depending on the viewing angle. For this reason, color unevenness depending on the viewing angle remarkably occurs. In the mosaic array, the delta array, and the 2G square array (FIGS. 65 to 67), the viewing angle exerts similar influence on the luminance of each of R, G, and B considering color mixing between mutually adjacent unit pixels in the vertical direction. Therefore, luminance unevenness is mainly visually recognized by the observer. It should be noted that from a microscopic viewpoint, that is, from the viewpoint of each unit pixel, it can be said that color unevenness depending on the viewing angle occurs.

Each of FIGS. 68 to 72 shows the same contents as the above when the color material portion includes the RGBW array. It should be noted that "W" corresponds to a color material layer having white color. More specifically. FIGS. 68 to 72 respectively show a stripe array, a first square array, a second square array, a first delta array, and a second delta array. In the illustrated square array, only two colors are repeatedly arranged in the vertical direction. In the stripe array, remarkable color unevenness occurs as in the case of the RGB array described above. In the square array and the delta array, in the array shown in the present example, since the influence of the viewing angle at a certain position exerts only on two specific colors, color unevenness occurs. Except in the case of stripe array, when the array is changed, color unevenness can be suppressed by color mixture between mutually adjacent unit pixels, but in that case, luminance unevenness is visually recognized.

As described above, even in any case of the RGB array and RGBW array, when the stripe array is used, remarkable color unevenness is visually recognized in the configuration of the comparative example (FIG. 63). On the other hand, according to the present embodiment, the outer sensor electrode 30M extends so as to be orthogonal to the extending direction of the stripe array, which can avoid the occurrence of color unevenness.

In addition, as described above, even in any case of the RGB array and the RGBW array, in the configuration of the comparative example (FIG. 63), when color unevenness is avoided, luminance unevenness occurs. On the other hand, according to the present embodiment, the outer sensor electrode 30M extends in the left-right direction of the observer, which can avoid luminance unevenness depending on the viewing angle in the left-right direction.

(Summary of Effects)

According to the present embodiment, the touch sensor is constituted with the inner sensor electrode 20M and the outer sensor electrode 30M (FIG. 60). Since the inner sensor electrode 20M is not arranged on the observation surface of the first substrate 10M, the inner sensor electrode 20M can be arranged in a position relatively close to the color material portion 75M. Therefore, image unevenness depending on the viewing angle due to the existence of the inner sensor electrode 20M is small. Furthermore, the outer sensor electrode 30M extends parallel to the left-right direction of the observer. Therefore, the location shaded with the outer sensor electrode as viewed from the observer in the color material portion 75M does not substantially depend on the viewing angle in the left-right direction. From the above, image unevenness depending on the viewing angle in the left-right direction can be suppressed.

The outer sensor electrode 30M extends along the long side direction of the first substrate 10M (X direction in FIG. 54). Therefore, the location of the color material portion 75M shaded by the outer sensor electrode as viewed from the observer is not substantially dependent on the viewing angle in the long side direction. From the above, image unevenness depending on the viewing angle in the long side direction can be suppressed. Therefore, in a display device in which the long side direction is the left-right direction, image unevenness depending on the viewing angle in the left-right direction can be suppressed. It should be noted that in a large-sized display device in which the viewing angle problem is particularly likely to occur, typically, the long side direction is the left-right direction.

The outer sensor electrode 30M is made of metal. Thus, the wiring resistance can be reduced. Therefore, a narrower wiring width and a wider pitch between wiring lines can be applied. Thus, the light transmittance in the detectable area can be improved and the size of the touch screen can be increased. The same effect can be obtained when the inner sensor electrode 20M is made of metal. In addition, since the wiring resistance is small, touch detection can be performed in a short response time, that is, at high speed.

The outer sensor electrode 30M contains at least any one of atoms of silver, copper, aluminum, molybdenum, and titanium. Thus, the wiring resistance of the outer sensor electrode 30M can be reduced. Therefore, the sensitivity of the touch sensor can be enhanced.

When the color material portion 75M has a stripe arrangement (FIG. 64), in other words, when the color material layers 72M to 74M are adjacent to each other and have a common color in a direction orthogonal to the left-right direction, if the sensor electrode arranged on the observation surface of the first substrate 10M is along the left-right direction, the sensor electrode causes large color unevenness depending on the viewing angle in the left-right direction. According to the present embodiment, such color unevenness can be suppressed.

When the inner sensor electrode 20M (FIG. 59) is included in the light-shielding portion 71M in a plan view, the inner sensor electrode 20M is hardly visible from the observer. Therefore, image unevenness caused by the existence of the inner sensor electrode 20M can be further suppressed. As the inner sensor electrode 20M fits inside the light-shielding portion 71M in the left-right direction, the viewing angle area in which image unevenness does not occur in the left-right direction becomes wider.

The outer sensor electrode 30M (FIG. 58) is included in the light-shielding portion 71M in a plan view. Thus, the shade extending vertically from the outer sensor electrode 30M is less likely to overlap with the color material portion 75M. Therefore, image unevenness in the vertical direction caused by the existence of the outer sensor electrode 30M can be further suppressed. As the outer sensor electrode 30M fits inside the light-shielding portion 71M in the vertical direction, the viewing angle area in which image unevenness does not occur in the vertical direction becomes wider.

The inner sensor electrode 20M and the outer sensor electrode 30M (FIG. 60) are separated by the first substrate 10M. Thus, electrical insulation properties between the inner sensor electrode 20M and the outer sensor electrode 30M are sufficiently secured. Therefore, the withstand voltage of the touch sensor can be sufficiently secured. In addition, the first substrate 10M is also used as a substrate for constituting a color filter substrate. This makes it possible to reduce the size and weight of the display panel 201M.

The outer sensor electrode 30M (FIG. 60) is provided on the observation surface of the first substrate 10M. This places the outer sensor electrode 30M close to the touch position. Therefore, the detection sensitivity is enhanced.

The row-direction wiring portion 31M (FIG. 55) is preferably formed by a plurality of outer sensor electrodes 30M being electrically connected. Thus, even if the outer sensor electrode 30M is locally disconnected, it is avoided that the sensor function is greatly impaired. In addition, since a gap is provided between a plurality of outer sensor electrodes 30M constituting each of the row-direction wiring portions 31M (FIG. 55), reduction in the luminance of the image to be displayed can be suppressed. The same applies to the column-direction wiring portion 21M (FIG. 56).

The environmental resistance of the display panel 201M is enhanced by the protective transparent substrate 60M (FIG. 59). Using metal for the material of the outer sensor electrode 30M enhances water resistance and chemical resistance as compared with using an oxide conductor. The environmental resistance is further enhanced with the protective film 12M.

Modified Example of Column-Direction Wiring Portion

In FIG. 56, the case where each of the column-direction wiring portions 21M includes inner sensor electrodes 20M patterned in an approximately rectangular shape is described. The inner sensor electrode 20M exists in the entirety of the approximately rectangular shape.

Figure 73:
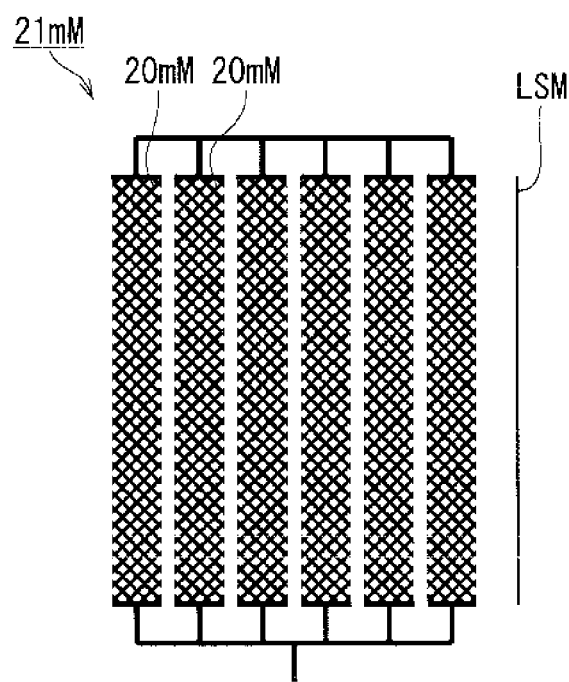
FIG. 73 is a plan view schematically showing a first modified example of FIG. 56.

In a first modified example (FIG. 73), each of the column-direction wiring portions 21mM includes inner sensor electrodes 20mM patterned in an approximately rectangular shape. Within this rectangle, the inner sensor electrode 20mM exists in a mesh shape. Using a mesh-shaped configuration causes the inner sensor electrode 20mM to be less likely to be visually recognized by the observer. Thus, even if the inner sensor electrode has a portion not included in the light-shielding portion 71M (FIG. 58) in a plan view, it is avoided that the inner sensor electrode has a significant influence on the image quality. Therefore, the inner sensor electrode 20mM can be provided more widely. The widely provided inner sensor electrode 20mM can effectively shield the noise from the TFT-array substrate 54M to the outer sensor electrode 30M. This will be described in detail below.

When a mutual capacitance type touch sensor is provided with the outer sensor electrode 30M and the inner sensor electrode 20M, the outer sensor electrode 30M functions as a detection electrode and the inner sensor electrode 20M functions as an excitation (drive) electrode. When the detection electrode and the excitation electrode are arranged on the same plane, the interelectrode capacitance required for detection is formed by the electric field in the lateral direction. Therefore, it is necessary to provide a certain distance between the electrodes. On the other hand, in the present embodiment, the detection electrode and the excitation electrode are arranged on different planes, and the interelectrode capacitance is formed by the electric field in the longitudinal direction. Therefore, the inner sensor electrode 20M as the excitation electrode can be arranged as densely as possible. Thus, the outer sensor electrode 30M as a detection electrode, which is more susceptible to noise than the excitation electrode, can be effectively shielded from the noise generated from the TFT-array substrate 54M with the densely arranged inner sensor electrode 20M.

Figure 74:
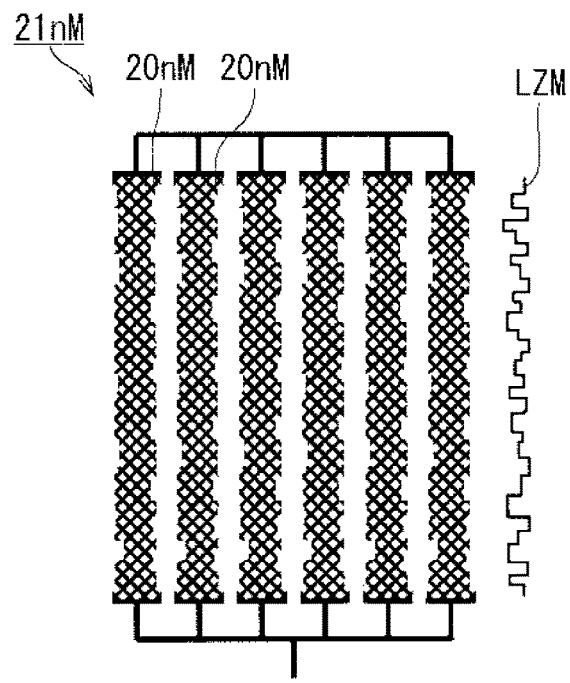
FIG. 74 is a plan view schematically showing a second modified example of FIG. 56.

In the first modified example, the outer edge of the mesh-shaped inner sensor electrode 20mM extends linearly along the vertical direction (along the straight line LS in the drawing). Since such an outer edge reflects the light regularly, the outer edge is easily visually recognized from the observer. To avoid this, in the column-direction wiring portion 21nM of the second modified example (FIG. 74), the outer edge of the mesh-shaped inner sensor electrode 20nM nonlinearly extends in a zigzag in the vertical direction (along the line LZ in the drawing).

Example of Switching-Circuit Structure in TFT-Array Substrate

Figure 75:
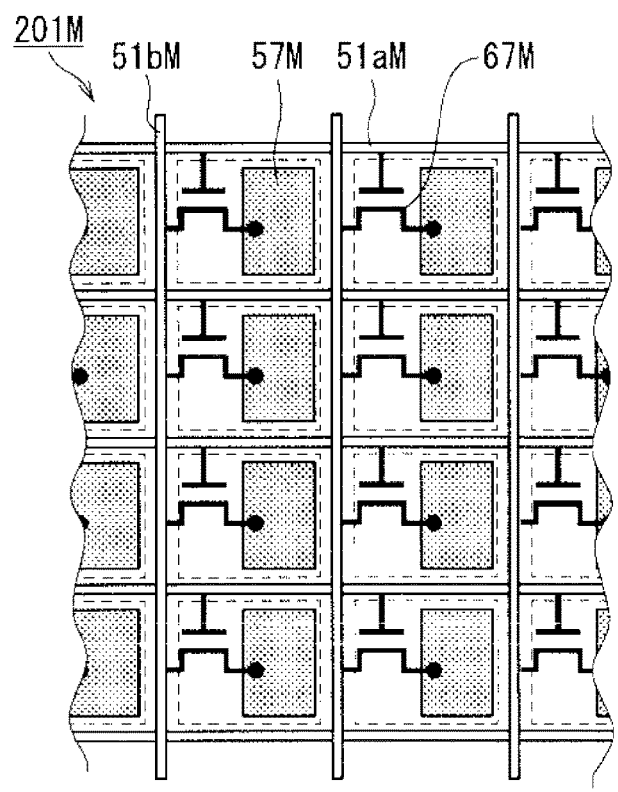
FIG. 75 is a plan view showing an example of a switching-circuit structure in a TFT-array substrate.

FIG. 75 is a plan view showing a general switching-circuit structure (single-gate single-source structure) in the TFT-array substrate 54M (FIG. 59). The TFT-array substrate 54M is provided with a plurality of pixels each having a transistor element 67M (switching element) and a pixel electrode 57M. On the second substrate 58M, a plurality of gate wiring layers 51aM extending in the row direction (left-right direction in the drawing) and a plurality of source wiring layers 51bM extending in the column direction (vertical direction in the drawing) are provided. A pixel exists between the adjacent gate wiring layers 51aM in the column direction. A pixel always exists between the adjacent source wiring layers 51bM in the row direction. In other words, the gate wiring layers 51aM arranged at equal intervals and the source wiring layers 51bM arranged at equal intervals cross each other, thereby forming pixels arranged in a matrix. Each of the gate wiring layers 51aM is connected to a pixel on one side (lower side in the drawing) of the gate wiring layer 51aM. One source wiring layer 51bM is connected to each pixel along one column.

Fourteenth Embodiment

FIG. 76 is a plan view showing an example of the switching-circuit structure in the TFT-array substrate 54M (sec FIG. 59) included in the display panel 202M in the present embodiment. The display panel 202M includes a plurality of gate wiring pairs 51PM arranged on the second substrate 58M, each of the gate wiring pairs 51PM including two gate wiring layers 51aM. Each of the gate wiring pairs 51PM passes between adjacent pixels in the vertical direction (direction crossing the left-right direction). In other words, an area where two pixels exist between adjacent gate wiring layers 51aM in the column direction and an area where no pixel exists between the adjacent gate wiring layers 51aM in the column direction are arranged alternately in the column direction. Of the two gate wiring layers 51aM included in a gate wiring pair 51PM, the upper gate wiring layer 51aM is connected to the upper pixel and the lower gate wiring layer 51aM is connected to the lower pixel. One source wiring layer 51bM is connected, every other pixel, to two pixels along the column sandwiching the source wiring layer 51bM. This circuit structure is also referred to as "dual-gate half-source structure".

In the present embodiment, the light-shielding portion 71M has a portion with a wide width (dimension in the vertical direction) in a position corresponding to the gate wiring pair 51PM in a plan view. The outer sensor electrode 30M is arranged in a position corresponding to this wide portion. Thus, increasing the width (dimension in the vertical direction) of the outer sensor electrode 30M while avoiding the occurrence of image unevenness allows the wiring resistance to be lowered. Therefore, the detection time of the touch sensor can be shortened, and the detection sensitivity can be enhanced.

In addition, the aperture ratio of the pixel can be increased with the dual-gate half-source structure. In addition, since the number of signal lines of the TFT-array substrate is reduced, the cost of the IC of the drive circuit can be reduced.

It should be noted that since the configuration other than the above is substantially the same as the configuration of the thirteenth embodiment described above, the same or corresponding elements are denoted by the same reference numerals, and the description of the elements will not be repeated.

Fifteenth Embodiment

Figure 78:
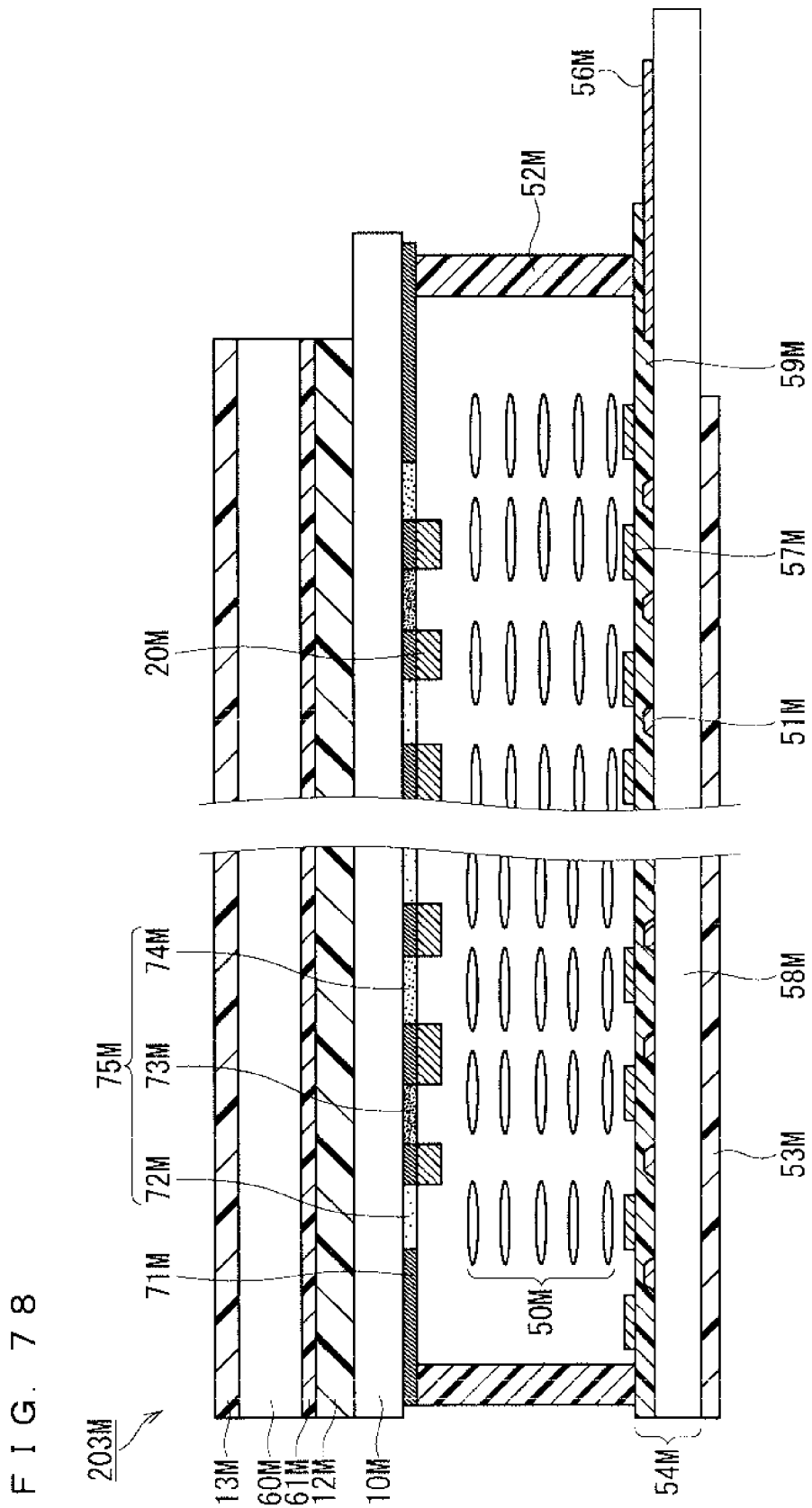
FIG. 78 is a schematic cross-sectional view taken along line LXXVIII-LXXVIII in FIG. 77.
Figure 79:
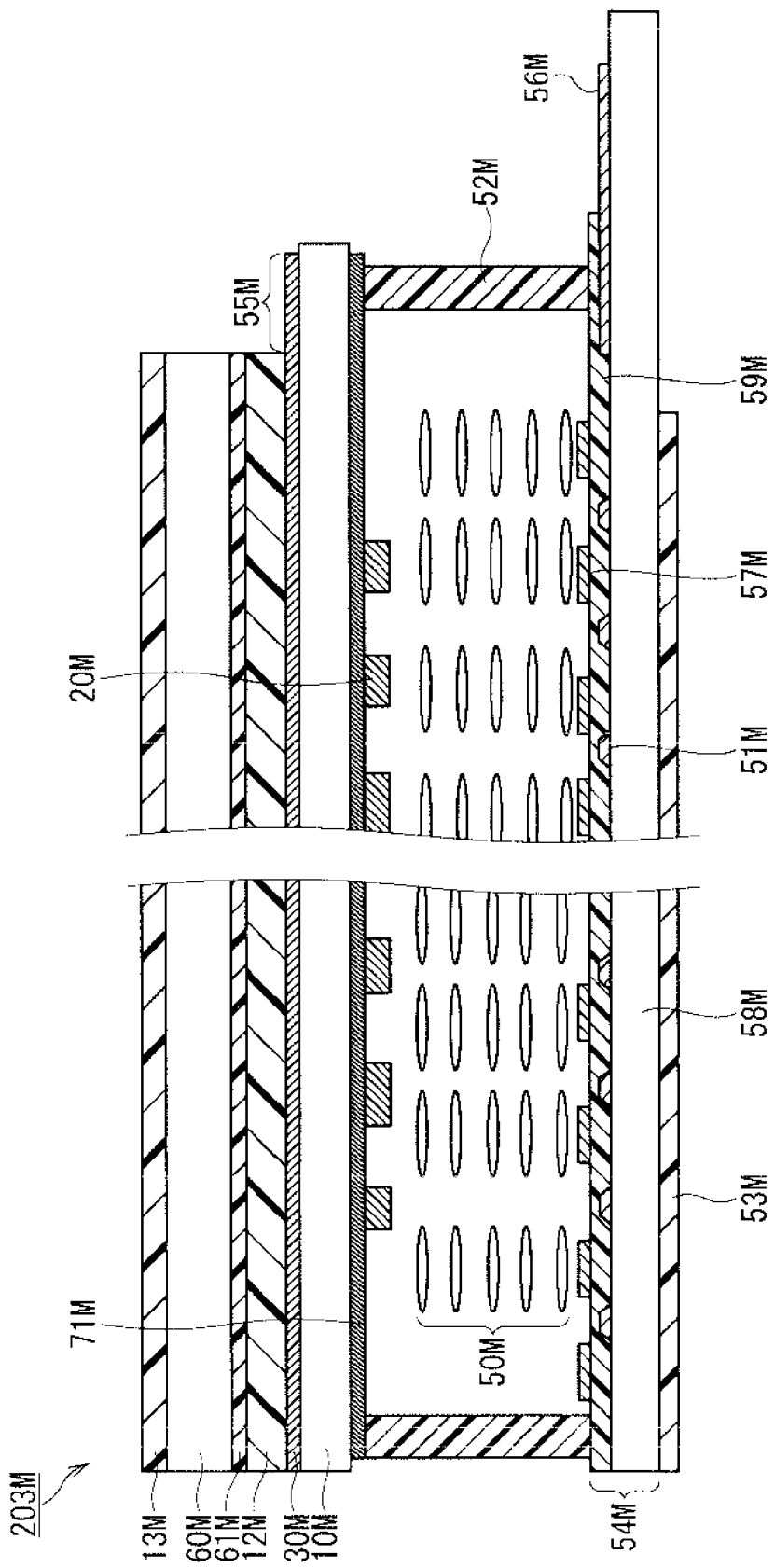
FIG. 79 is a schematic cross-sectional view taken along line LXXIX-LXXIX in FIG. 77.

FIG. 77 is a plan view schematically showing the configuration of a color filter substrate included in a display panel 203M in the present embodiment. FIG. 78 is a schematic cross-sectional view taken along line LXXVIII-LXXVIII in FIG. 77. FIG. 79 is a schematic cross-sectional view taken along line LXXIX-LXXIX in FIG. 77.

As shown in FIG. 78, in the display panel 203M, the width of the inner sensor electrode 20M (dimension in the left-right direction) is the same as the width of the light-shielding portion 71M. Thus, the width of the inner sensor electrode 20M can be secured to the maximum while image unevenness caused by the inner sensor electrode 20M protruding from the light-shielding portion 71M being suppressed in a plan view. Since the width of the inner sensor electrode 20M is large, its electric resistance can be lowered and noise from the TFT-array substrate 54M to the outer sensor electrode 30M can be effectively shielded. Thus, the detection sensitivity of the touch sensor can be enhanced.

It should be noted that since the configuration other than the above is substantially the same as the configuration of the thirteenth or fourteenth embodiment described above, the same or corresponding elements are denoted by the same reference numerals, and the description of the elements will not be repeated.

Sixteenth Embodiment

Figure 80:
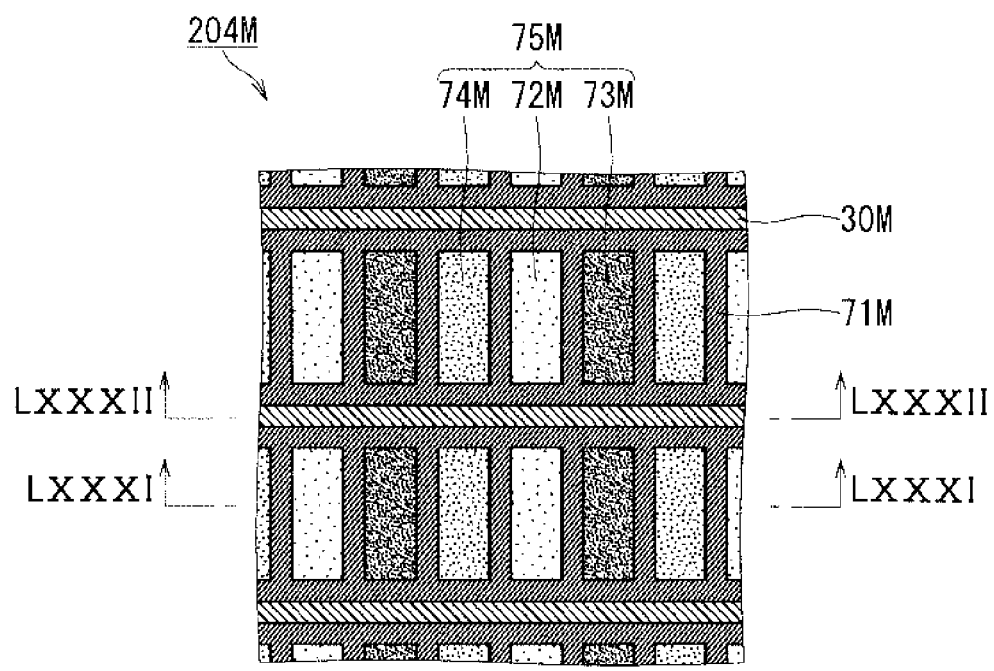
FIG. 80 is a plan view schematically showing the configuration of a color filter substrate included in a display panel in a sixteenth embodiment of the present invention.
Figure 81:
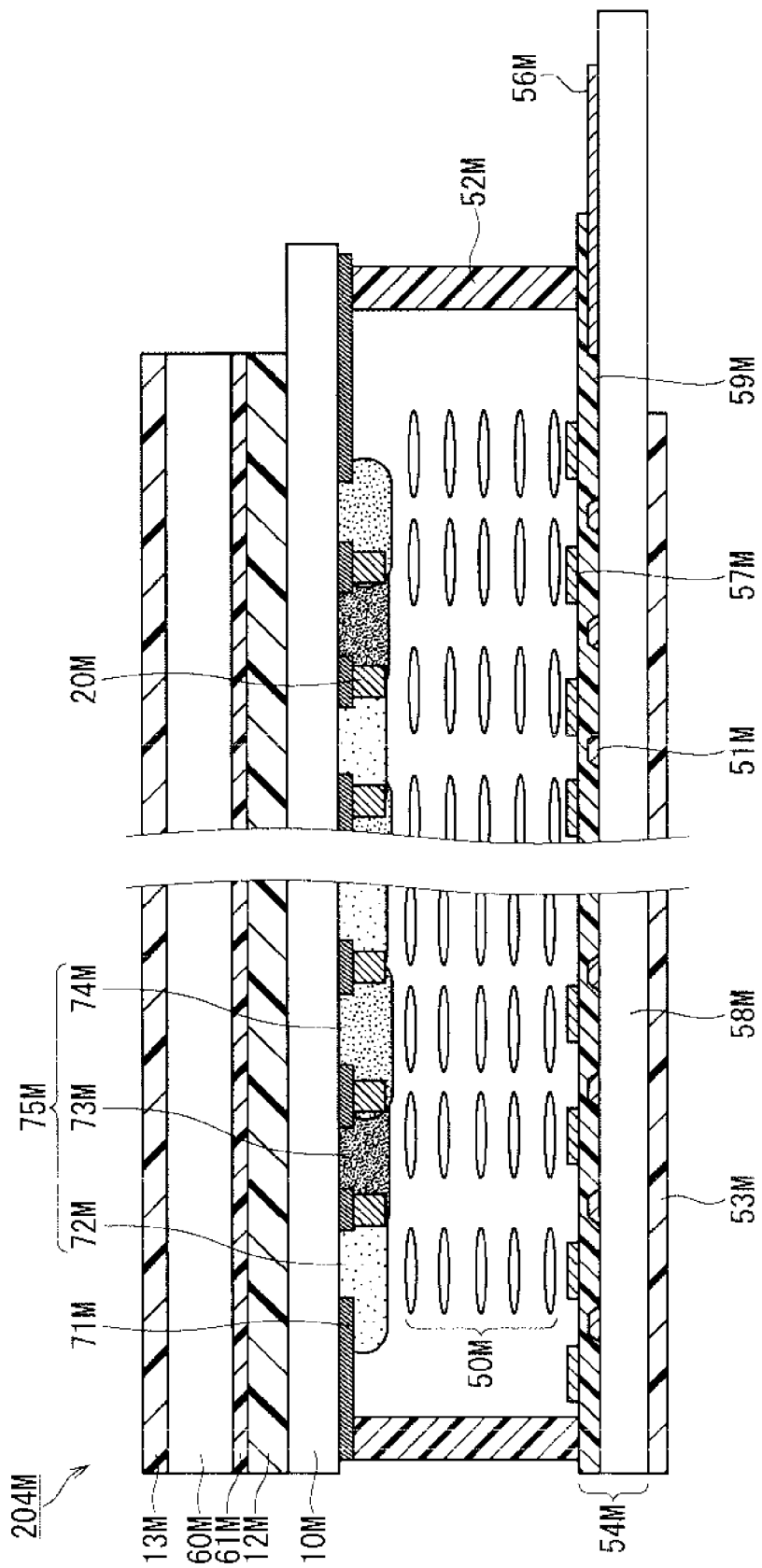
FIG. 81 is a schematic cross-sectional view taken along line LXXXI-LXXXI in FIG. 80.
Figure 82:
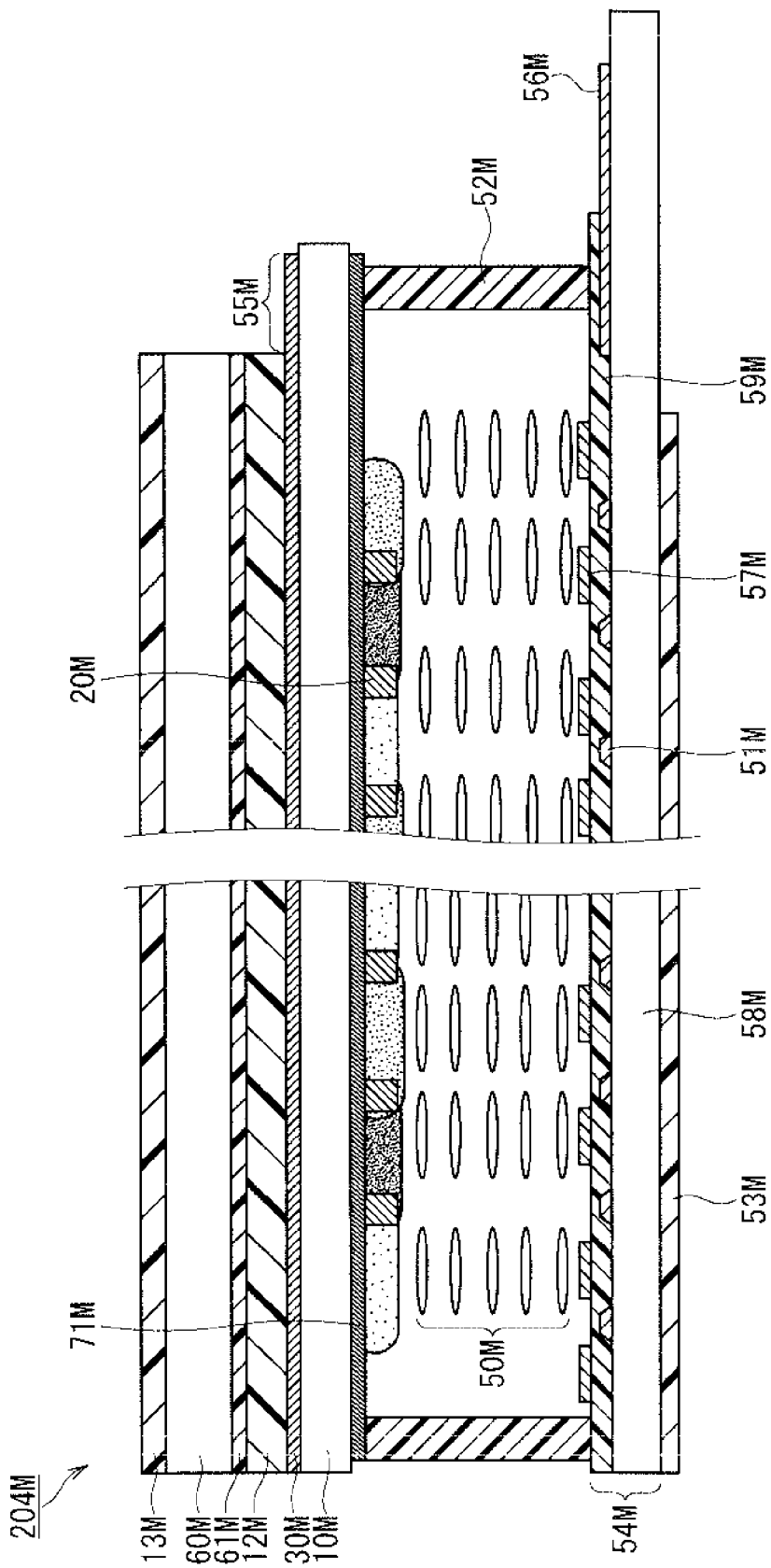
FIG. 82 is a schematic cross-sectional view taken along line LXXXII-LXXXII in FIG. 80.

FIG. 80 is a plan view schematically showing the configuration of a color filter substrate included in a display panel 204M in the present embodiment. FIG. 81 is a schematic cross-sectional view taken along line LXXXI-LXXXI in FIG. 80. FIG. 82 is a schematic cross-sectional view taken along line LXXXII-LXXXII in FIG. 80.

In the display panel 204M in the present embodiment, the color material portion 75M at least partially covers the inner sensor electrodes 20M arranged on the inner surface (lower surface in FIGS. 81 and 82) of the first substrate 10M. Preferably, the color material portion 75M covers the side surface (the left surface and the right surface in FIGS. 81 and 82) of the inner sensor electrode 20M. More preferably, the color material portion 75M further covers the surface of the inner sensor electrode 20M facing the second substrate 58M (the lower surface in FIGS. 81 and 82). Still more preferably, in the cross-sectional view (view in FIGS. 81 and 82), the inner sensor electrode 20M is completely surrounded by the light-shielding portion 71M and the color material portion 75M.

In order to obtain the configuration as described above, as shown in FIGS. 81 and 82, it is preferable that adjacent color material layers of the color material layers 72M to 74M overlap each other at their boundaries. In addition, it is preferable that the inner sensor electrode 20M is included in the light-shielding portion 71M in a plan view.

According to the present embodiment, the color material portion 75M at least partially covers the inner sensor electrodes 20M. Thus, reflected light from the inner sensor electrode 20M can be suppressed. Therefore, image unevenness caused by the existence of the inner sensor electrode 20M can be further suppressed.

It should be noted that since the configuration other than the above is substantially the same as the configuration of any one of the thirteenth to fifteenth embodiments described above, the same or corresponding elements are denoted by the same reference numerals, and the description of the elements will not be repeated.

Seventeenth Embodiment

Figure 83:
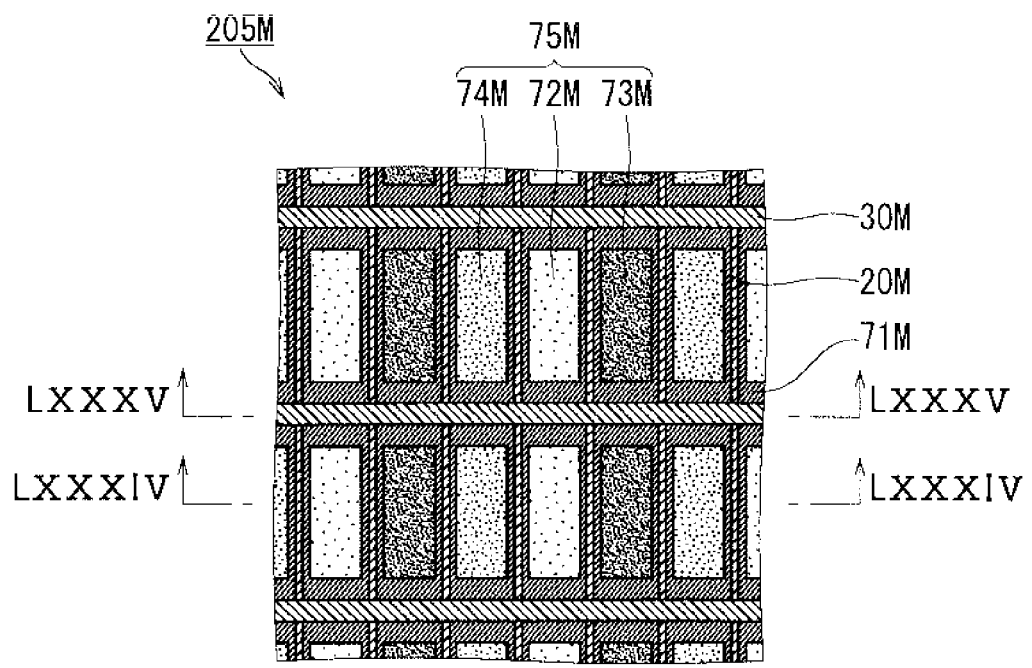
FIG. 83 is a plan view schematically showing the configuration of a color filter substrate included in a display panel in a seventeenth embodiment of the present invention.
Figure 84:
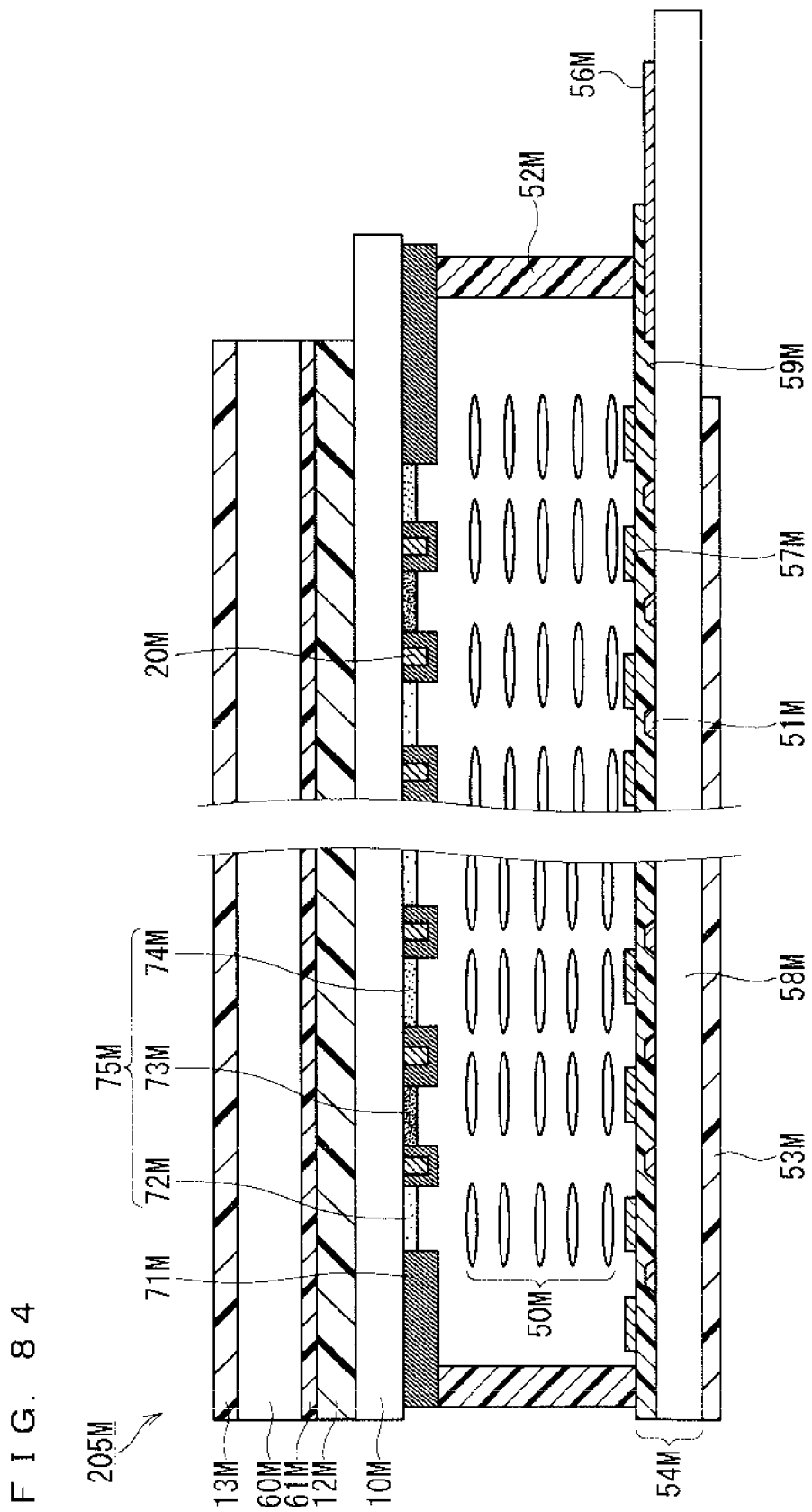
FIG. 84 is a schematic cross-sectional view taken along line LXXXIV-LXXXIV in FIG. 83.
Figure 85:
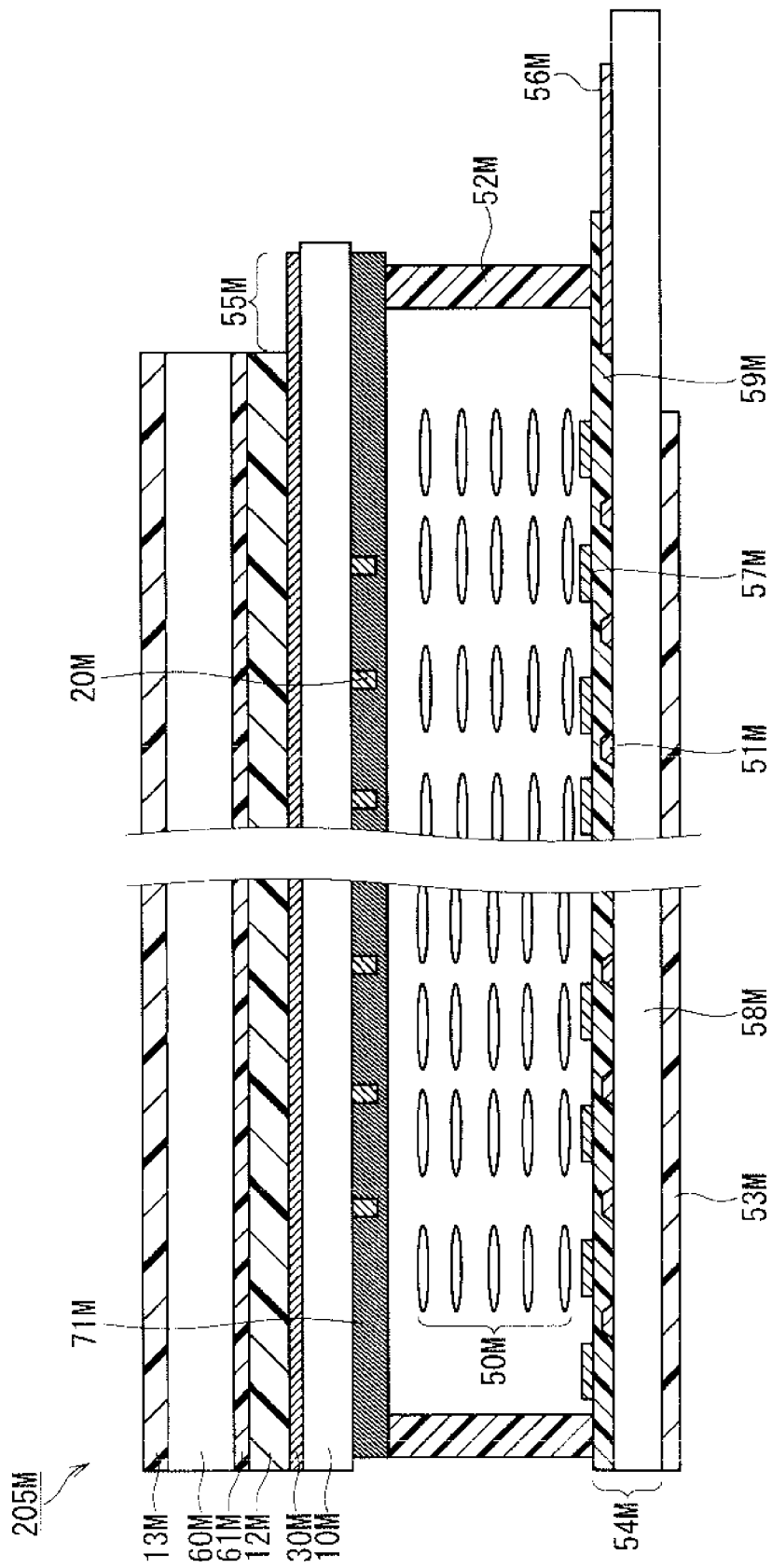
FIG. 85 is a schematic cross-sectional view taken along line LXXXV-LXXXV in FIG. 83.

FIG. 83 is a plan view schematically showing the configuration of a color filter substrate included in a display panel 205M in the present embodiment. FIG. 84 is a schematic cross-sectional view taken along line LXXXIV-LXXXIV in FIG. 83. FIG. 85 is a schematic cross-sectional view taken along line LXXXV-LXXXV in FIG. 83.

In the display panel 205M in the present embodiment, the inner sensor electrode 20M is provided on the inner surface (lower surface in FIGS. 84 and 85) of the first substrate 10M without the interposition of the light-shielding portion 71M. The light-shielding portion 71M at least partially covers the inner sensor electrodes 20M arranged on the inner surface of the first substrate 10M. Preferably, the light-shielding portion 71M covers the side surface (the left surface and the right surface in FIGS. 84 and 85) of the inner sensor electrode 20M arranged on the inner surface of the first substrate 10M. More preferably, the light-shielding portion 71M further covers the facing surface (lower surface in FIGS. 84 and 85) of the inner sensor electrode 20M.

The light-shielding portion 71M at least partially covers the inner sensor electrodes 20M. Thus, reflected light from the inner sensor electrode 20M can be suppressed. Therefore, deterioration of visibility due to the existence of the inner sensor electrode 20M can be suppressed. In particular, preventing color mixing due to reflection from the inner sensor electrode 20M allows clearer image quality to be obtained.

It should be noted that since the configuration other than the above is substantially the same as the configuration of the thirteenth to fifteenth embodiments described above, the same or corresponding elements are denoted by the same reference numerals, and the description of the elements will not be repeated.

Eighteenth Embodiment

Figure 86:
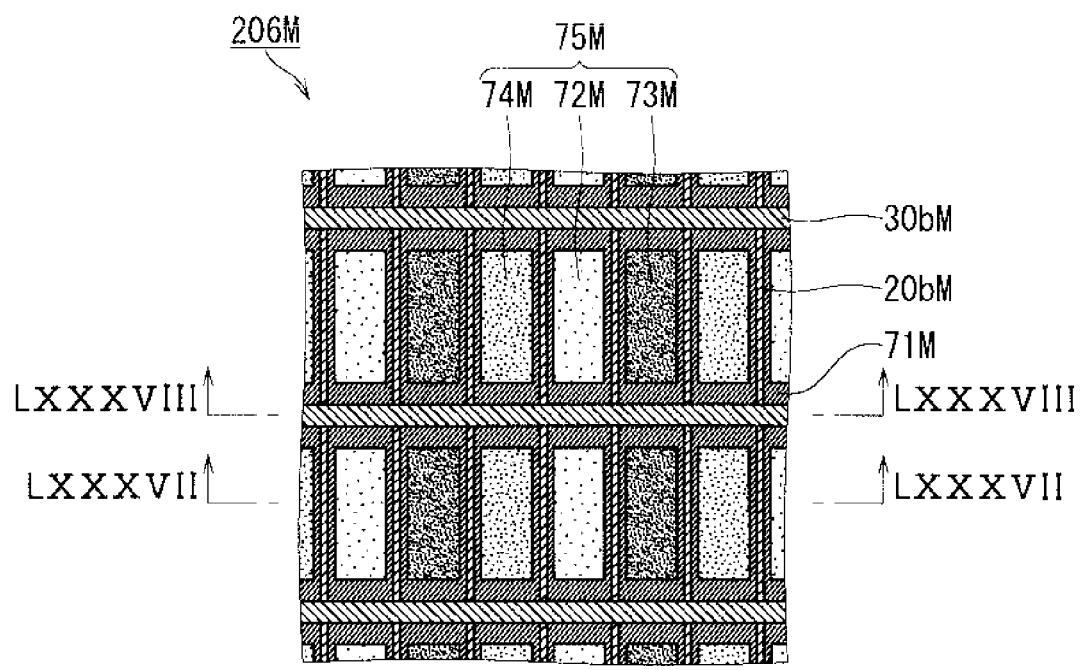
FIG. 86 is a plan view schematically showing the configuration of a color filter substrate included in a display panel in an eighteenth embodiment of the present invention.
Figure 87:
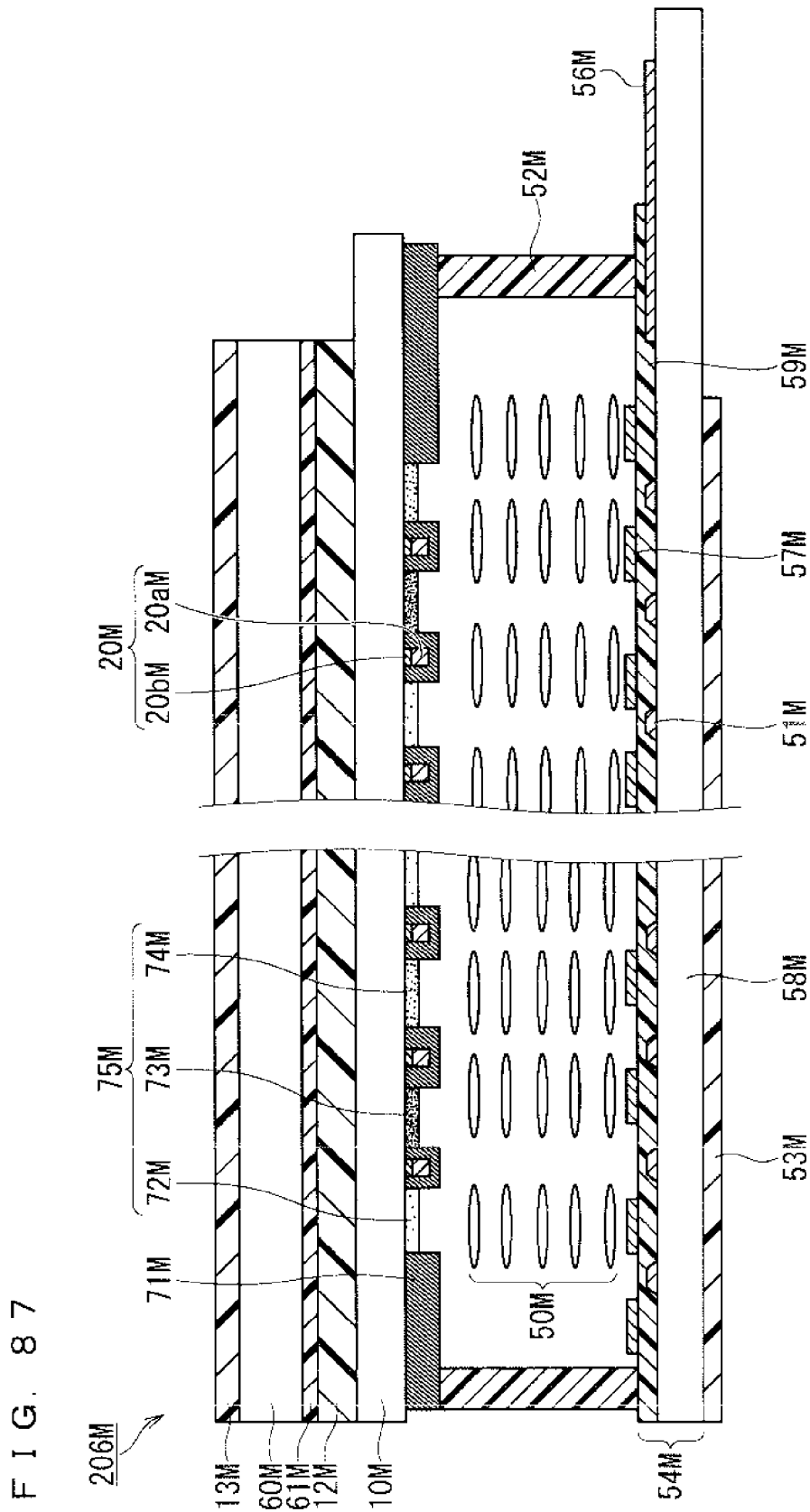
FIG. 87 is a schematic cross-sectional view taken along line LXXXVII-LXXXVII in FIG. 86.
Figure 88:
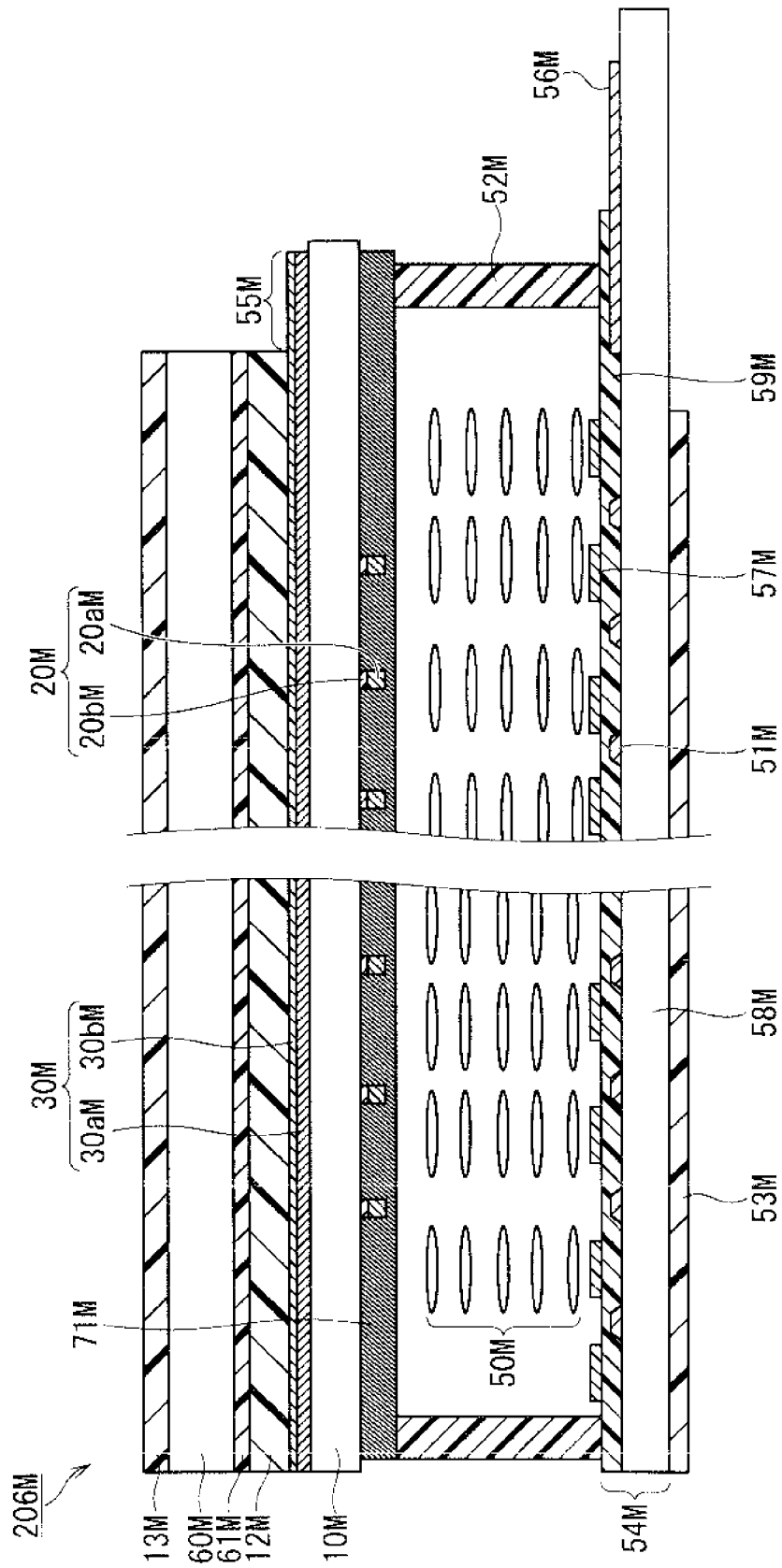
FIG. 88 is a schematic cross-sectional view taken along line LXXXVIII-LXXXVIII in FIG. 86.

FIG. 86 is a plan view schematically showing the configuration of a color filter substrate included in a display panel 206M in the present embodiment. FIG. 87 is a schematic cross-sectional view taken along line LXXXVII-LXXXVII in FIG. 86. FIG. 88 is a schematic cross-sectional view taken along line LXXXVIII-LXXXVIII in FIG. 86.

In the display panel 206M in the present embodiment, the inner sensor electrode 20M has a substrate-facing surface that faces the first substrate 10M. The substrate-facing surface is covered with an antireflection film 20$b$M (low reflection layer). Of the inner sensor electrode 20M, the portion shielded from the first substrate 10M by being covered with the antireflection film 20bM is the wiring film 20aM. The outer sensor electrode 30M includes an observer-facing surface (a surface opposite to the surface facing the first substrate 10M in FIG. 88) facing the observer. The observer-facing surface is covered with an antireflection film 30bM (low reflection layer). Of the outer sensor electrode 30M, the portion shielded from the observer by being covered with the antireflection film 30bM is the wiring film 30aM. The antireflection film 20bM may suppress the reflection of light by being made of a material harder to reflect light than the wiring film 20aM. Alternatively, the antireflection film 20bM may be made of a material having a refractive index different from the refractive index of the wiring film 20aM, and the intensity of reflected light may be suppressed by interference of reflected light. The same applies to the antireflection film 30bM.

The material of the wiring film 20aM can be made of the same material as the material of the outer sensor electrode 30M described in the thirteenth embodiment. In addition, the antireflection film 20bM may be made of a nitride of the material. For example, the wiring film 20aM is made of aluminum-based alloy, and the antireflection film 20bM is made of aluminum nitride. Alternatively, a transparent conductive oxide such as ITO may be used as the material of the antireflection film 20bM, and in this case, the wiring film 20aM may use a laminated structure of a metal and its nitride (for example, a laminated structure of aluminum-based alloy and its nitride).

According to the present embodiment, the substrate-facing surface of the inner sensor electrode 20M is covered with the antireflection film 20bM. Thus, reflected light from the inner sensor electrode 20M can be suppressed. Therefore, deterioration of visibility due to the existence of the inner sensor electrode 20M can be suppressed.

The observer-facing surface of the outer sensor electrode 30M is covered with the antireflection film 30bM. Thus, the outer sensor electrode 30M is prevented from being visually recognized with the reflection of external light by the observer. Therefore, deterioration of visibility due to the existence of the outer sensor electrode 30M can be suppressed.

It should be noted that since the configuration other than the above is substantially the same as the configuration of any one of the thirteenth to seventeenth embodiments described above, the same or corresponding elements are denoted by the same reference numerals, and the description of the elements will not be repeated.

Nineteenth Embodiment

Figure 89:
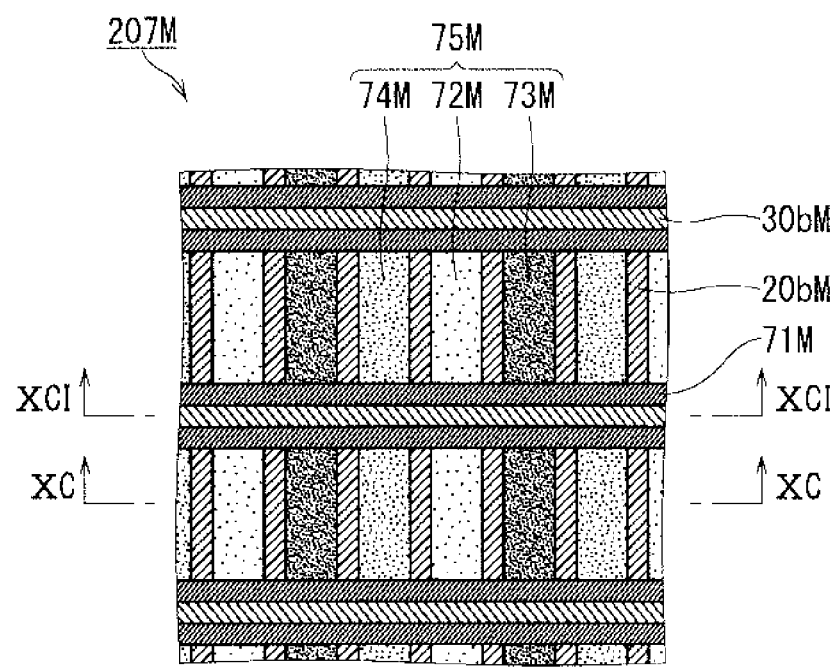
FIG. 89 is a plan view schematically showing the configuration of a color filter substrate included in a display panel in a nineteenth embodiment of the present invention.
Figure 90:
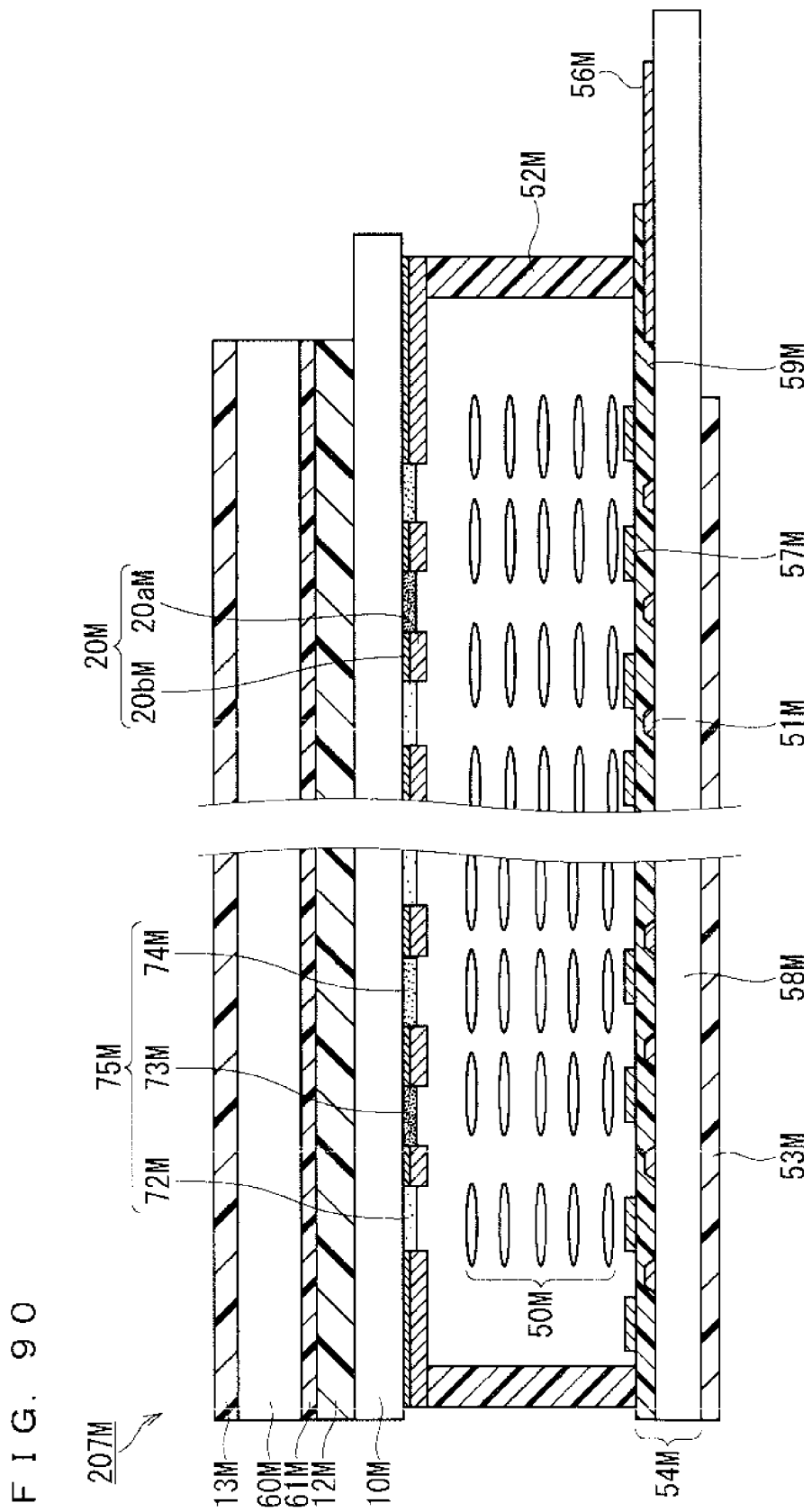
FIG. 90 is a schematic cross-sectional view taken along line XC-XC in FIG. 89.
Figure 91:
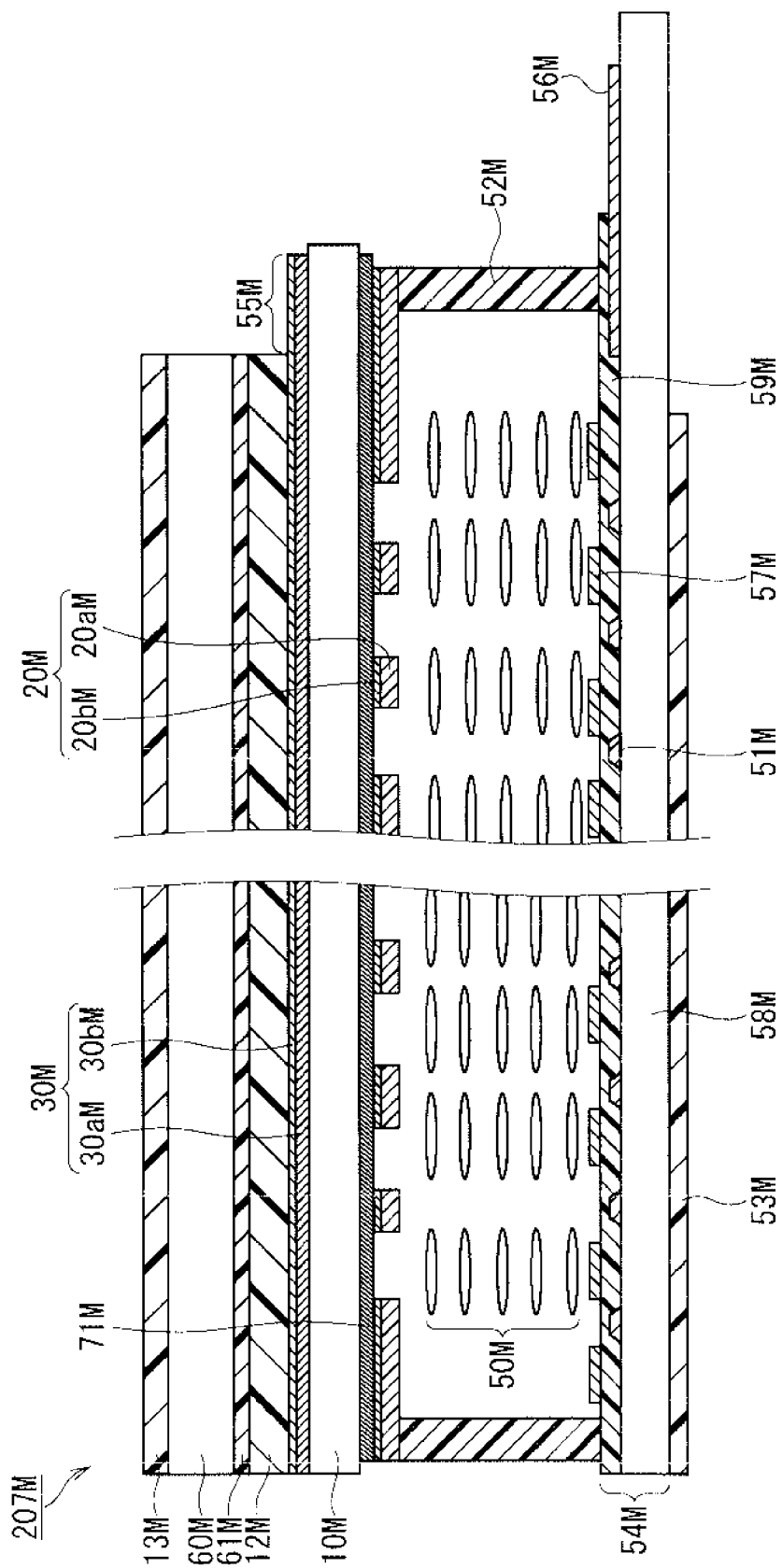
FIG. 91 is a schematic cross-sectional view taken along line XCI-XCI in FIG. 89.

FIG. 89 is a plan view schematically showing the configuration of a color tilter substrate included in a display panel 207M in the present embodiment. FIG. 90 is a schematic cross-sectional view taken along line XC-XC in FIG. 89. FIG. 91 is a schematic cross-sectional view taken along line XCI-XCI in FIG. 89.

In the display panel 207M in the present embodiment, the inner sensor electrode 20M and the color material portion 75M are arranged on the same plane. The color material layers 72M to 74M adjacent to each other in one direction (left-right direction) are separated with the inner sensor electrode 20M.

According to the present embodiment, the color material layers 72M to 74M adjacent to each other in one direction are separated with the inner sensor electrode 20M. Thus, the light-shielding portion 71M does not have to include a portion for separating the color material layers 72M to 74M adjacent to each other in this direction. Therefore, the configuration of the light-shielding portion 71M can be simplified.

It should be noted that since the configuration other than the above is substantially the same as the configuration of the thirteenth, fourteenth, or sixteenth embodiment described above, the same or corresponding elements are denoted by the same reference numerals, and the description of the elements will not be repeated.

Twentieth Embodiment

Figure 92:
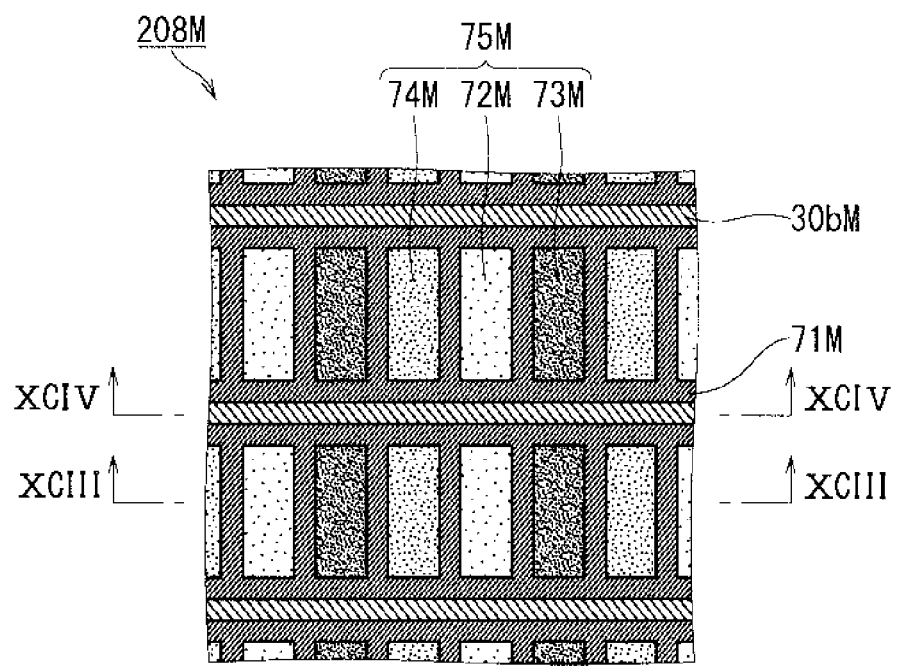
FIG. 92 is a plan view schematically showing the configuration of a color filter substrate included in a display panel in a twentieth embodiment of the present invention.
Figure 93:
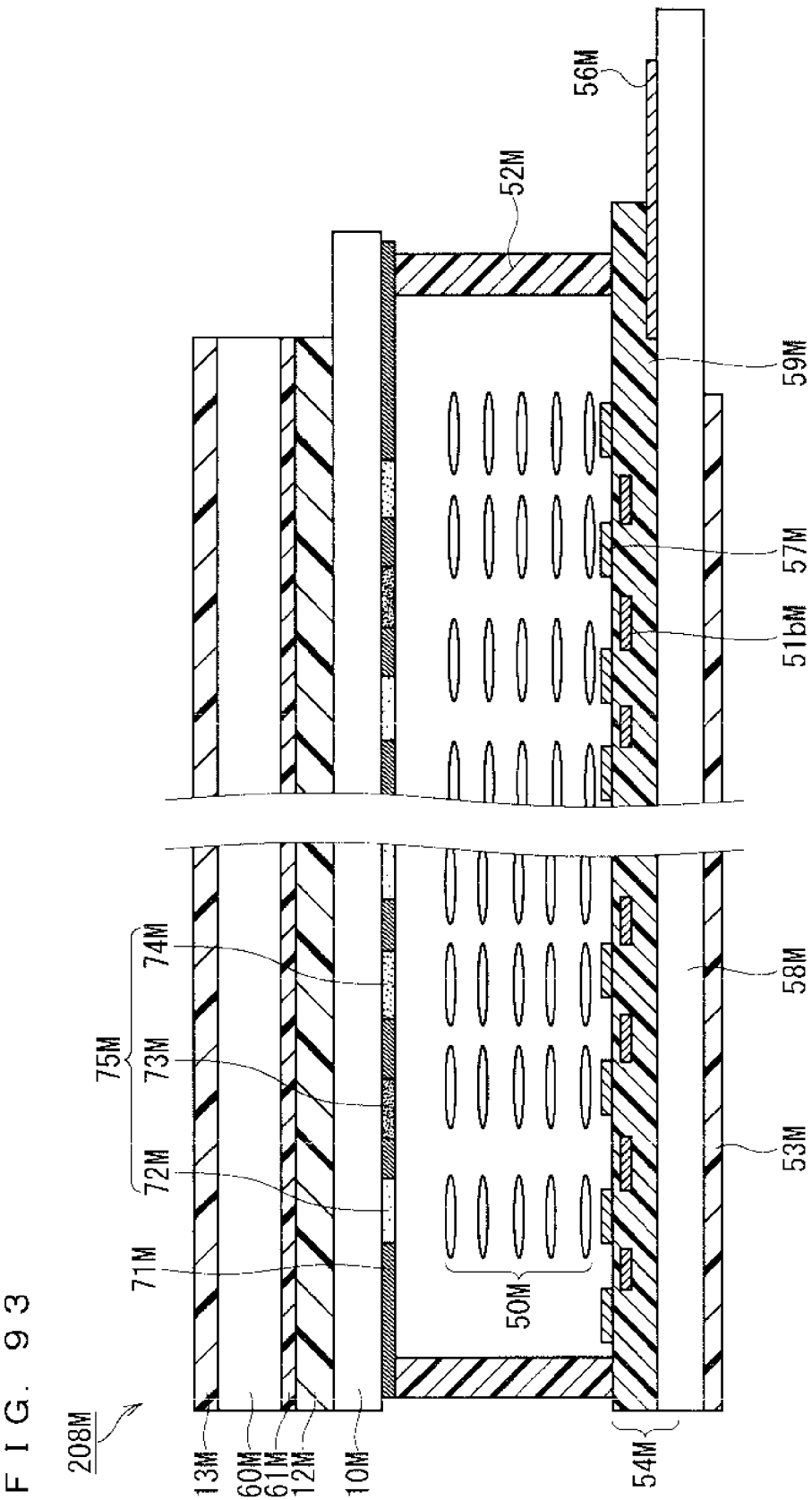
FIG. 93 is a schematic cross-sectional view taken along line XCIII-XCIII in FIG. 92.
Figure 94:
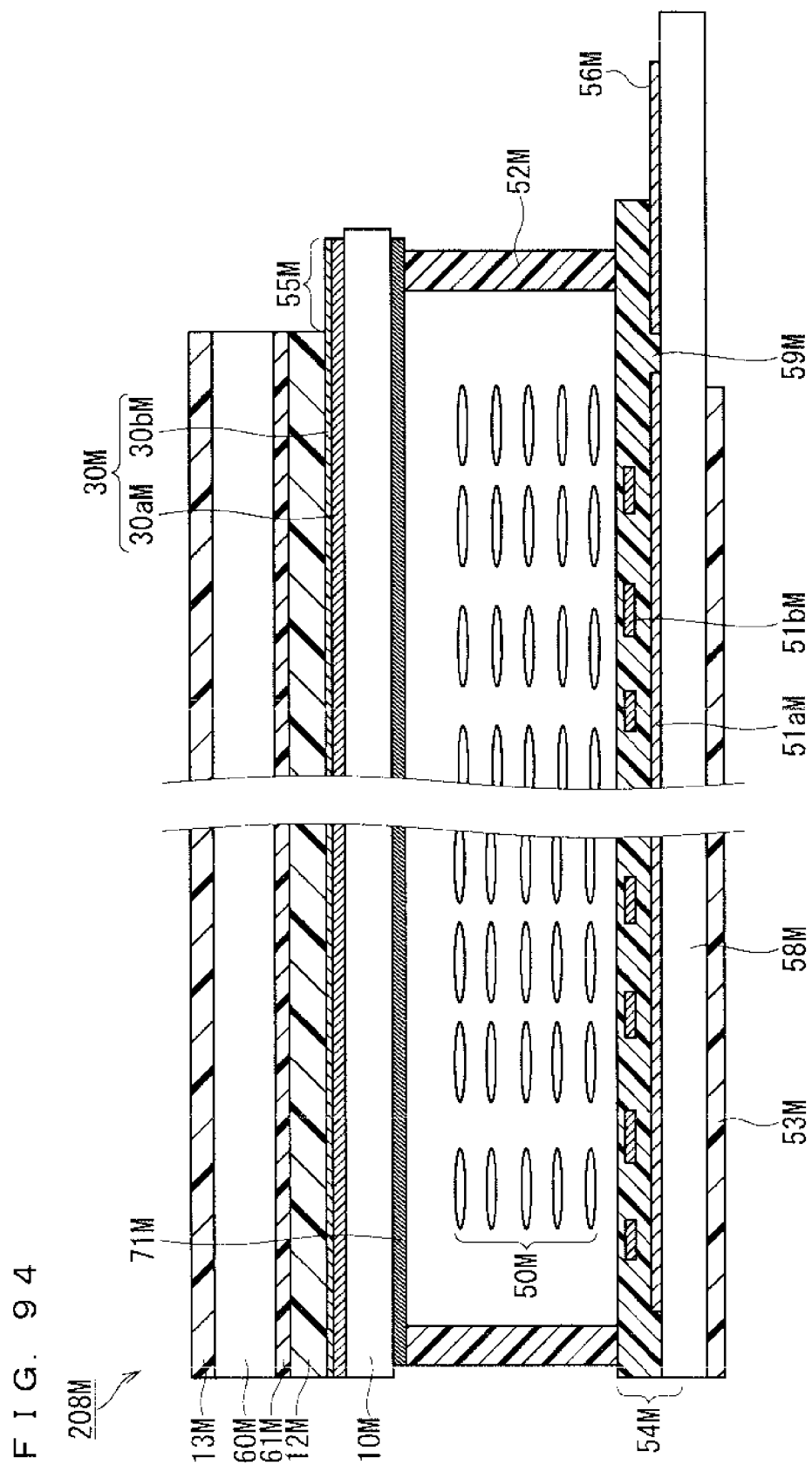
FIG. 94 is a schematic cross-sectional view taken along line XCIV-XCIV in FIG. 92.

FIG. 92 is a plan view schematically showing the configuration of a color filter substrate included in a display panel 208M in the present embodiment. FIG. 93 is a schematic cross-sectional view taken along line XCIII-XCIII in FIG. 92. FIG. 94 is a schematic cross-sectional view taken along line XCIV-XCIV in FIG. 92.

The TFT-array substrate 54M includes a gate wiring layer 51aM and a source wiring layer 51bM provided on the second substrate 58M. The gate wiring layer 51aM and the source wiring layer 51bM are insulated from each other with an interlayer insulating film 59M. The TFT-array substrate 54M includes a plurality of transistor elements 67M (FIG. 75) provided on the second substrate 58M, each having a source terminal and a drain terminal. The source wiring layer 51bM provided on the second substrate 58M is connected to the source terminal of the transistor element 67M. In the present embodiment, the source wiring layer 51bM also serves as an inner sensor electrode.

According to the present embodiment, the source wiring layer 51bM is also used as an inner sensor electrode. Therefore, the aperture ratio of the display device can be increased as compared with the case where a structure different from the source wiring layer 51bM is provided as the inner sensor electrode. In addition, the manufacturing process of the display panel 208M is simplified.

It should be noted that since the configuration other than the above is substantially the same as the configuration of the thirteenth embodiment described above, the same or corresponding elements are denoted by the same reference numerals, and the description of the elements will not be repeated.

Twenty-First Embodiment

Figure 95:
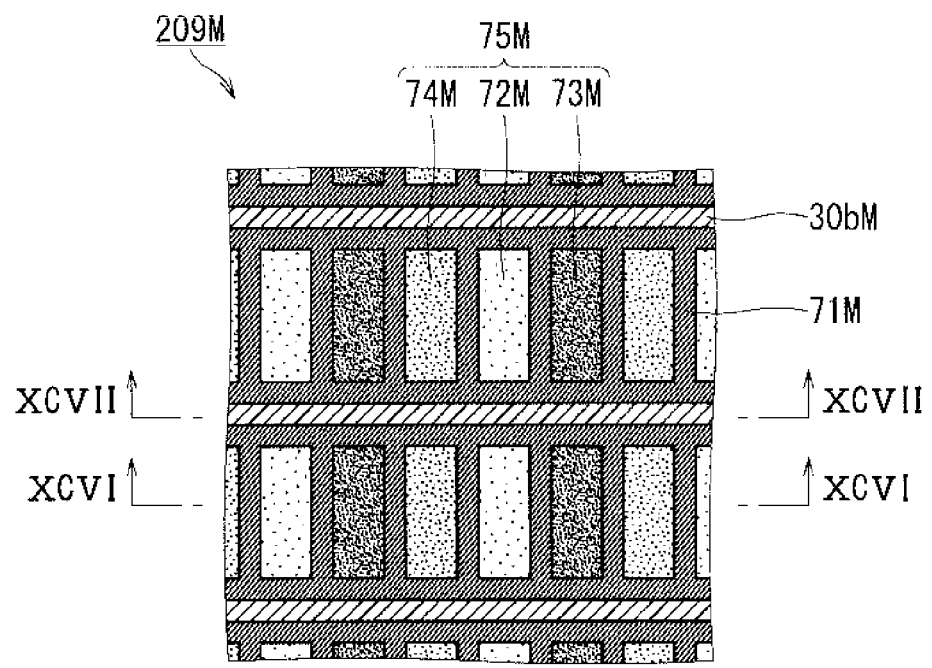
FIG. 95 is a plan view schematically showing the configuration of a color filter substrate included in a display panel in a twenty-first embodiment of the present invention.
Figure 96:
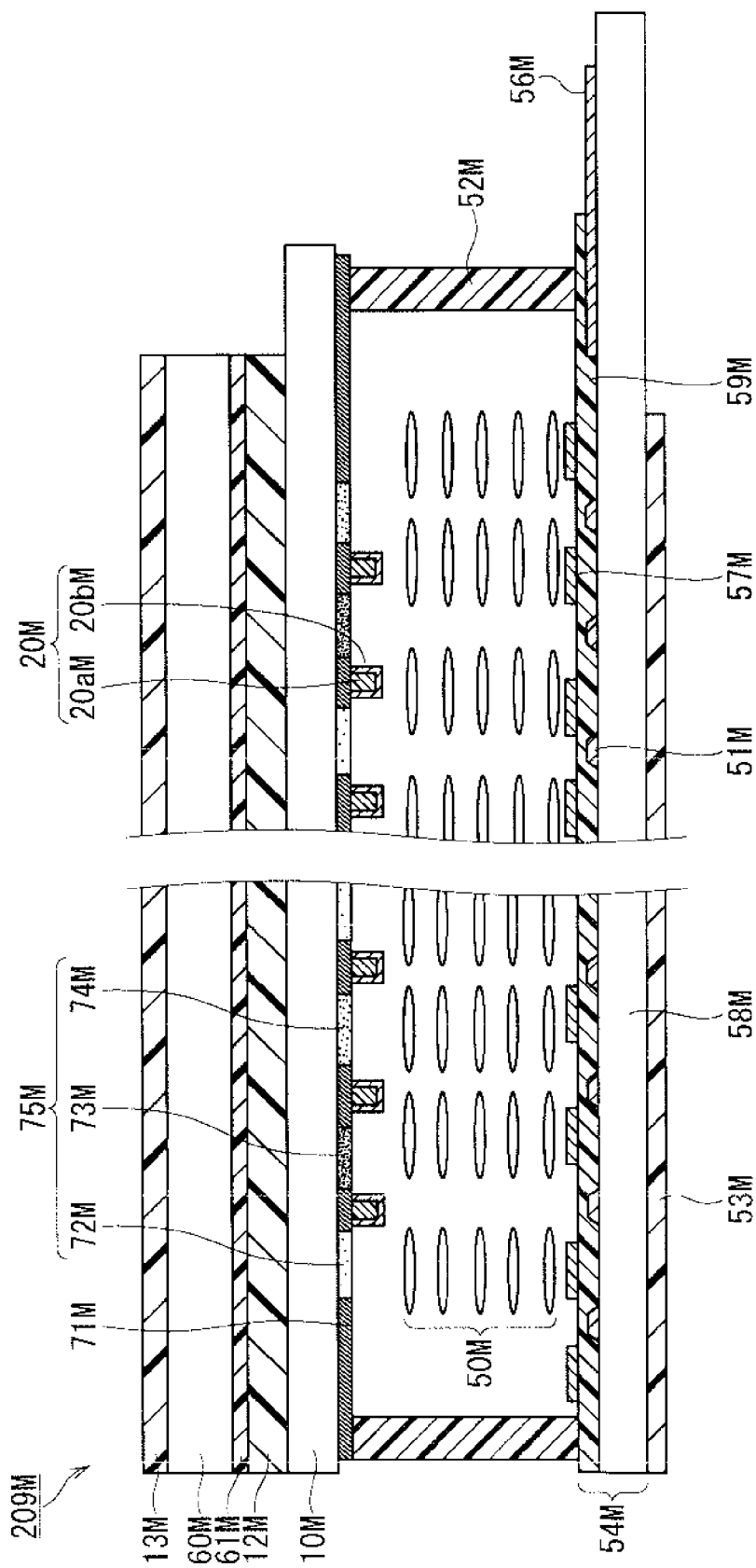
FIG. 96 is a schematic cross-sectional view taken along line XCVI-XCVI in FIG. 95.
Figure 97:
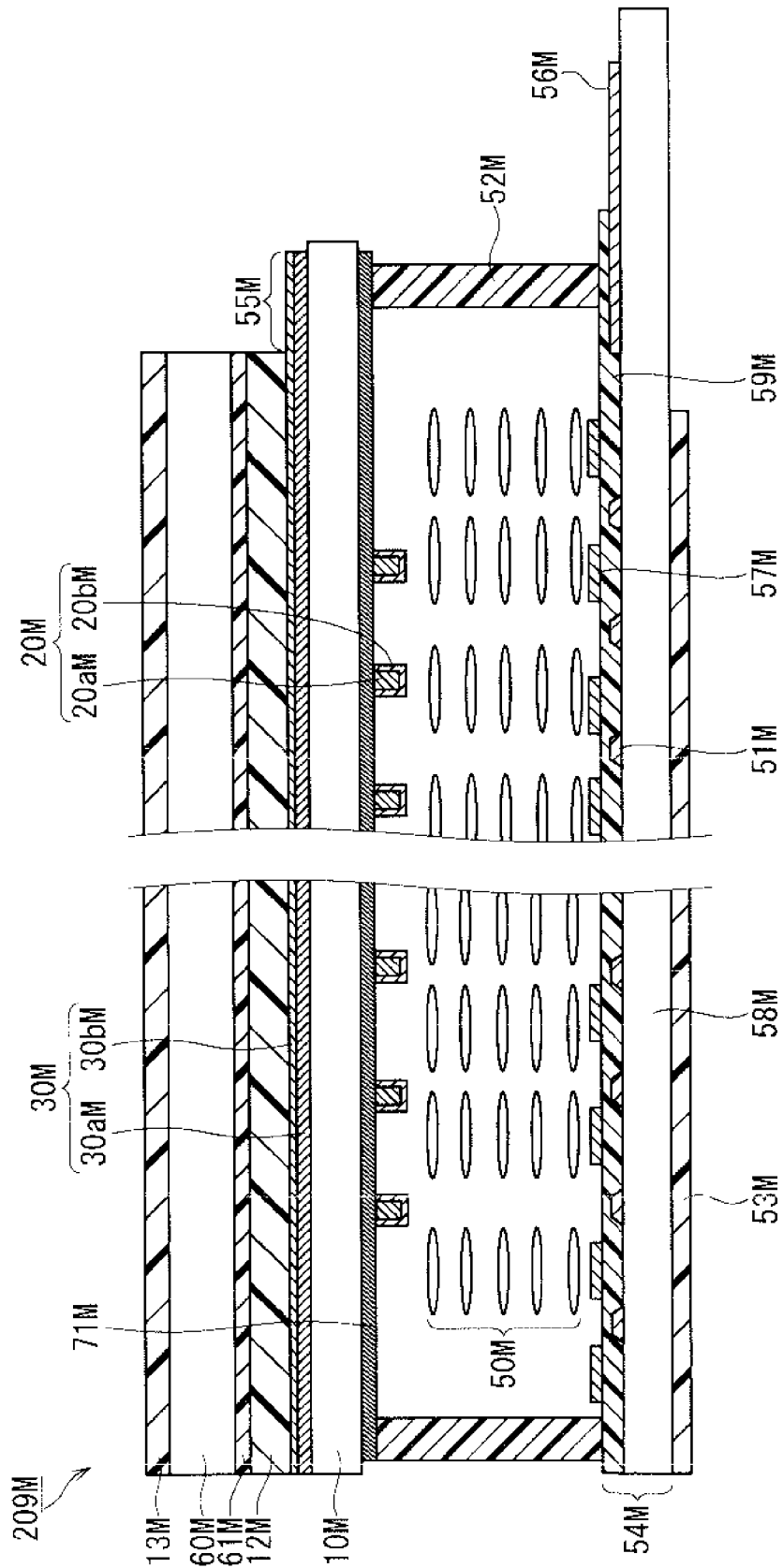
FIG. 97 is a schematic cross-sectional view taken along line XCVII-XCVII in FIG. 95.

FIG. 95 is a plan view schematically showing the configuration of a color filter substrate included in a display panel 209M in the present embodiment. FIG. 96 is a schematic cross-sectional view taken along line XCVI-XCVI in FIG. 95. FIG. 97 is a schematic cross-sectional view taken along line XCVII-XCVII in FIG. 95.

In the display panel 209M in the present embodiment, the side surface of the inner sensor electrode 20M is covered with the antireflection film 20bM. The inner sensor electrode 20M includes a wiring film 20aM covered with the antireflection film 20bM. The side surface is a surface connecting the surface facing the first substrate 10M and the surface facing the second substrate 58M of the inner sensor electrode 20M. It should be noted that in FIG. 97, the surface facing the second substrate 58M of the inner sensor electrode 20M (lower surface in the drawing) is also covered with the antireflection film 20bM.

The side surface of the outer sensor electrode 30M is covered with the antireflection film 30bM. The outer sensor electrode 30M includes a wiring film 30aM covered with the antireflection film 30bM. It should be noted that the above-described side surface corresponds to the upper side and the lower side of a rectangle representing the structure of reference numeral "30bM" in FIG. 95. The side surface is a surface connecting the surface facing the observer and the surface facing the first substrate 10M of the outer sensor electrode 30M. It should be noted that in FIG. 97, the surface facing the observer of the outer sensor electrode 30M (upper surface in the drawing) is also covered with the antireflection film 30bM.

According to the present embodiment, the side surface of the outer sensor electrode 30M is covered with the antireflection film 30bM. Thus, the reflection of external light due to the outer sensor electrode 30M is reduced. Therefore, it is difficult for the outer sensor electrode 30M to be visually recognized from the observer. Therefore, deterioration of visibility due to the existence of the outer sensor electrode 30M can be suppressed. The same applies to the inner sensor electrode 20M. If the above-described antireflection film is provided on at least one of the outer sensor electrode 30M and the inner sensor electrode 20M, the effects of this can be obtained.

It should be noted that since the configuration other than the above is substantially the same as the configuration of any one of the thirteenth to twentieth embodiments described above, the same or corresponding elements are denoted by the same reference numerals, and the description of the elements will not be repeated.

Twenty-Second Embodiment

Figure 98:
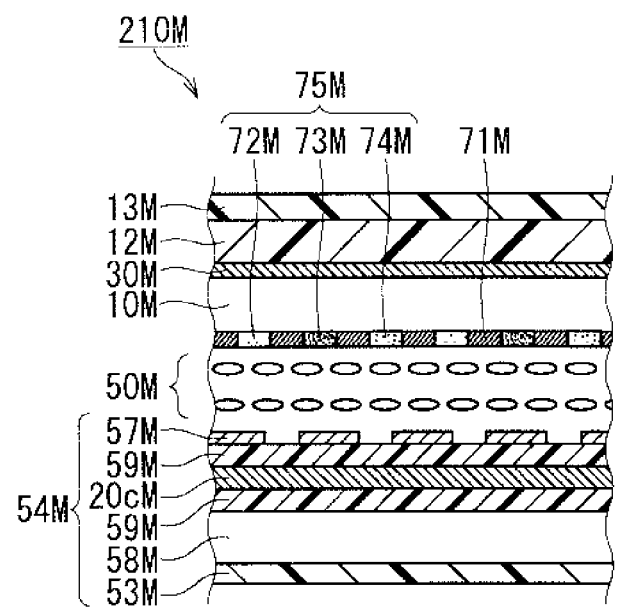
FIG. 98 is a partial cross-sectional view schematically showing the configuration of a display panel in a twenty-second embodiment of the present invention.

FIG. 98 is a partial cross-sectional view schematically showing the configuration of a display panel 210M in the present embodiment. The TFT-array substrate 54M of the display panel 210M in the present embodiment includes a common electrode 20cM. The common electrode 20cM is arranged to face the pixel electrode 57M with the interposition of the interlayer insulating film 59M. A voltage is applied between the common electrode 20cM and the pixel electrode 57M, which causes an electric field for modulating the liquid crystal layer 50M to be generated. In the present embodiment, the common electrode 20cM also serves as an inner sensor electrode.

According to the present embodiment, the common electrode 20cM is also used as an inner sensor electrode. Therefore, the aperture ratio of the display device can be increased as compared with the case where a structure different from the structure of the common electrode 20cM is provided as the structure of the inner sensor electrode. In addition, the manufacturing process of the display panel 210M is simplified.

It should be noted that in FIG. 98, the common electrode 20cM is arranged between the pixel electrode 57M and the second substrate 58M, but this arrangement does not necessarily have to be used. For example, the pixel electrode 57M may be arranged between the common electrode 20cM and the second substrate 58M.

It should be noted that since the configuration other than the above is substantially the same as the configuration of the thirteenth or fourteenth embodiment described above, the same or corresponding elements are denoted by the same reference numerals, and the description of the elements will not be repeated.

Twenty-Third Embodiment

Figure 99:
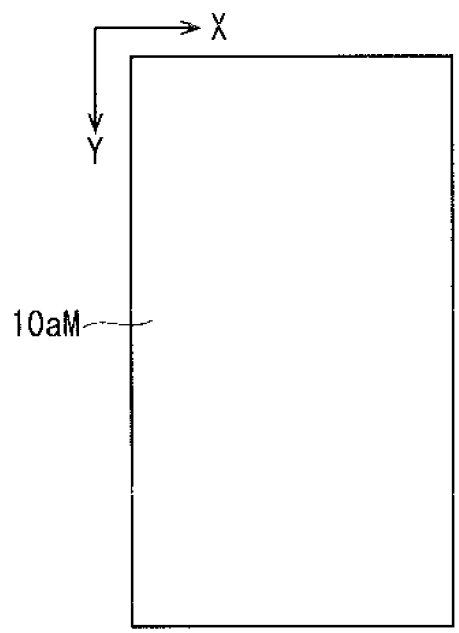
FIG. 99 is a plan view schematically showing the configuration of a first substrate included in a display panel in a twenty-third embodiment of the present invention.

FIG. 99 is a plan view schematically showing the configuration of a first substrate 10aM included in a display panel in the present embodiment. The first substrate 10aM has a rectangular shape. This rectangular shape has short sides along one direction. In the present embodiment, the short side is parallel to the left-right direction (X direction in the drawing) of the observer.

Since the configuration other than the above is substantially the same as the configuration of any one of the thirteenth to twenty-second embodiments described above, the same or corresponding elements are denoted by the same reference numerals, and the description of the elements will not be repeated. According to the present embodiment, when the short side of the first substrate 10aM is parallel to the left-right direction of the observer, substantially the same effects as the effects of each of the above embodiments can be obtained. It should be noted that a display device mounted on a portable terminal device such as a smartphone often has its short side direction in the left-right direction of the observer.

In each of the above embodiments, the case where a liquid crystal panel is used as a display panel is described in detail. However, the display panel is not limited to a liquid crystal panel, and only has to be formed with a display function layer having a display function interposed between two facing substrates (also referred to as a display function unit). For example, also in organic EL (Electro-Luminescence) panels or electronic paper panels, a touch screen can be integrated on a transparent substrate serving as a surface on the user side of each panel.

It should be noted that in the present invention, each embodiment can be freely combined, and each embodiment can be appropriately modified, or omitted within the scope of the present invention. Although the present invention is described in detail, the above description is in all aspects illustrative, and the present invention is not limited to the above description. It is understood that innumerable modifications not illustrated can be envisaged without departing from the scope of the present invention.

EXPLANATION OF REFERENCE SIGNS 10, 10a, 10M, 10aM: first substrate
11, 11M, 59, 59M: interlayer insulating film
12, 12M: protective film
20, 20m, 20n, 20M, 20mM, 20nM: inner sensor electrode
30, 30i, 30j, 30M: outer sensor electrode
20a, 30a, 20aM, 30aM: wiring film
20b, 30b, 20bM, 30bM: antireflection film
20c, 20cM: common electrode
21, 21m, 21n, 21M, 21mM, 21nM: column-direction wiring portion
31, 31L, 31M: row-direction wiring portion
50, 50M: liquid crystal layer
51P, 51PM: gate wiring pair
51a, 51aM: gate wiring layer
51b, 51bM: source wiring layer
54, 54M: TFT-array substrate
57, 57M: pixel electrode
58, 58M: second substrate
60, 60M: protective transparent substrate
62, 62M: backlight
67, 67M: transistor element
71, 71i, 71j, 71M: light-shielding portion
72 to 74, 72M to 74M: color material layer
75, 75M: color material portion
100, 100M: display device
201 to 211, 201M to 210M: display panel
900, 900M: observer

The invention claimed is:

1. A display panel with a touch sensor comprising:
    a first substrate having translucency, the first substrate including an observation surface facing an observer and an inner surface opposite to the observation surface;
    a light-shielding portion provided on the inner surface of the first substrate, the light-shielding portion having an opening pattern;
    a color material portion provided on the inner surface of the first substrate, the color material portion including a plurality of color material layers arrayed corresponding to the opening pattern;
    a second substrate facing the inner surface of the first substrate;
    a display function layer held between the first substrate and the second substrate;
    a plurality of inner sensor electrodes provided between the inner surface of the first substrate and the second substrate, the plurality of inner sensor electrodes included in the light-shielding portion in a plan view; and
    a plurality of outer sensor electrodes made of metal, the plurality of outer sensor electrodes provided on the observation surface of the first substrate,
    wherein a projection of each of the outer sensor electrodes onto the inner surface of the first substrate through an optical path corresponding to a viewing angle is included in the light-shielding portion in a plan view, and each of the outer sensor electrodes includes a region extending along one direction parallel to a lateral direction of the display panel with a touch sensor.

2. The display panel with a touch sensor according to claim 1, wherein each of the outer sensor electrodes extends along the one direction.

3. The display panel with a touch sensor according to claim 1, wherein each of the outer sensor electrodes further includes a region extending along a direction crossing the one direction.

4. The display panel with a touch sensor according to claim 1, further comprising a plurality of gate wiring pairs arranged on the second substrate, the plurality of gate wiring pairs each including two gate wiring lines, wherein each of the gate wiring pairs passes between pixels adjacent to each other in a direction crossing the one direction.

5. The display panel with a touch sensor according to claim 1, wherein the color material layers adjacent to each other in the one direction are separated by each of the inner sensor electrodes.

6. The display panel with a touch sensor according to claim 1, wherein the color material portion at least partially covers the inner sensor electrodes arranged on the inner surface of the first substrate.

7. The display panel with a touch sensor according to claim 1, wherein the light-shielding portion at least partially covers the inner sensor electrodes arranged on the inner surface of the first substrate.

8. The display panel with a touch sensor according to claim 1, further comprising a plurality of transistor elements provided on the second substrate, the plurality of transistor elements each including a source terminal and a drain terminal, wherein the inner sensor electrodes are connected to the source terminal of the transistor elements.

9. The display panel with a touch sensor according to claim 1, wherein each of the inner sensor electrodes includes a substrate-facing surface facing the first substrate, and the substrate-facing surface is covered with an antireflection film.

10. The display panel with a touch sensor according to claim 1, wherein each of the outer sensor electrodes contains at least any one of atoms of silver, copper, aluminum, molybdenum, and titanium.

11. The display panel with a touch sensor according to claim 1, wherein each of the outer sensor electrodes includes an observer-facing surface facing the observer, and the observer-facing surface is covered with an antireflection film.

12. The display panel with a touch sensor according to claim 1, wherein each of the outer sensor electrodes includes a side surface, and the side surface is covered with an antireflection film.

* * * * *